United States Patent [19]

Muhmenthaler et al.

[11] Patent Number: 5,293,386

[45] Date of Patent: Mar. 8, 1994

[54] INTEGRATED SEMICONDUCTOR MEMORY WITH PARALLEL TEST CAPABILITY AND REDUNDANCY METHOD

[75] Inventors: Peter Muhmenthaler, Munich; Hans D. Oberle, Puchheim; Martin Peisl, Munich; Dominique Savignac, Ismaning, all of Fed. Rep. of Germany

[73] Assignee: Siemens Aktiengesellschaft, Munich, Fed. Rep. of Germany

[21] Appl. No.: 974,855

[22] Filed: Nov. 10, 1992

[30] Foreign Application Priority Data

May 10, 1990 [EP] European Pat. Off. ........ 90108836.9

[51] Int. Cl.$^5$ ............................................... G11C 7/00
[52] U.S. Cl. .................................. 371/21.1; 371/10.3; 365/201
[58] Field of Search ............... 371/10.1–10.3, 371/21.1, 21.2, 21.3, 21.6; 365/201

[56] References Cited

U.S. PATENT DOCUMENTS

| | | |
|---|---|---|
| 4,464,750 | 8/1984 | Tatematsu . |
| 4,541,090 | 9/1985 | Shiragasawa . |
| 4,742,489 | 5/1988 | Hoffmann . |
| 4,742,490 | 5/1988 | Hoffmann . |
| 4,803,656 | 2/1988 | Takemae ..................... 371/10.2 |
| 4,862,416 | 8/1989 | Takeuchi ..................... 371/10.2 |
| 5,075,892 | 12/1991 | Choy ........................... 371/21.2 |
| 5,157,664 | 10/1992 | Waite ........................... 371/21.2 |

FOREIGN PATENT DOCUMENTS

| | | |
|---|---|---|
| 0055129 | 6/1982 | European Pat. Off. . |
| 0186040 | 7/1986 | European Pat. Off. . |
| 0186051 | 7/1986 | European Pat. Off. . |
| 0283906 | 9/1988 | European Pat. Off. . |
| 3916533 | 7/1990 | Fed. Rep. of Germany . |
| 2226644 | 7/1990 | United Kingdom . |

OTHER PUBLICATIONS

IEEE Trans. on Computers, (1989) Mar., No. 3, New York, US, Pinaki Mazumder and Janak K. Patel: "Parallel Testing for Pattern-Sensitive Faults in Semiconductor Random-Access Memories".

Primary Examiner—Vincent P. Canney
Attorney, Agent, or Firm—Herbert L. Lerner; Laurence A. Greenberg

[57] ABSTRACT

An integrated semiconductor memory includes a parallel test device and block groups. The parallel test device is used for writing in and evaluating data to be written into and read out of the semiconductor memory. Several groups of memory cells can be simultaneously tested for operation in a test mode, with each group being disposed along a respective word line. The data read out during the process can be evaluated by the parallel test device. The result of the evaluation is present, separately for each group of memory cells, on I/O data lines of the semiconductor memory. The semiconductor memory can also have redundant memory cells, in which case defective memory cells or groups of memory cells can be replaced in connection with the test mode.

83 Claims, 23 Drawing Sheets

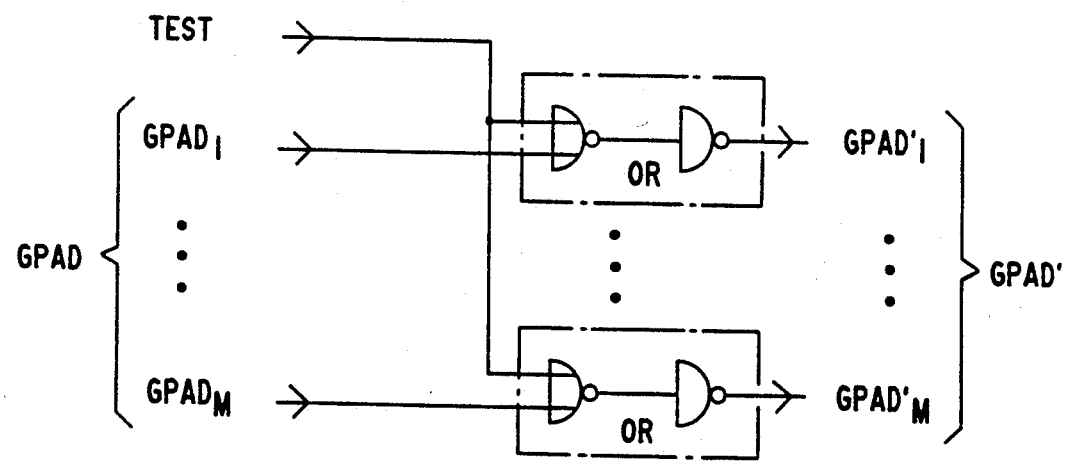
FIG.5
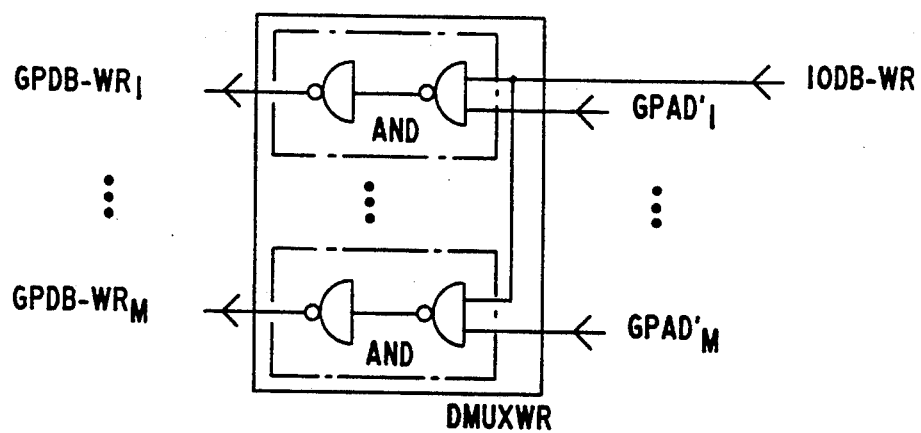
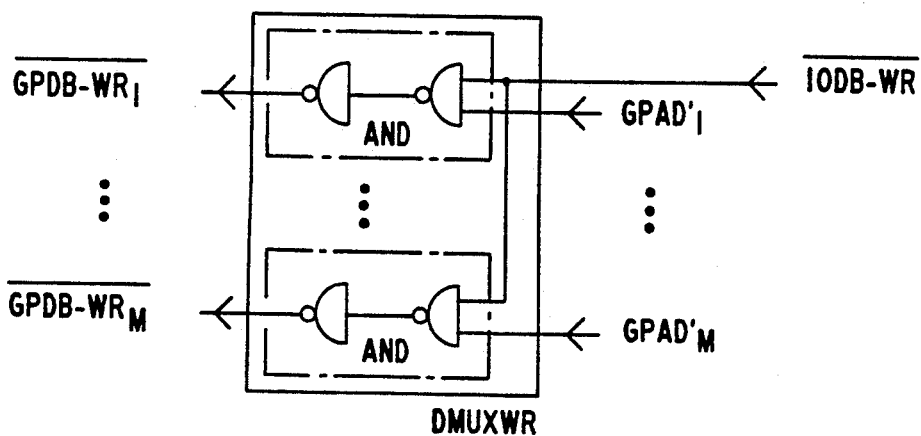
FIG.6

FIG.10
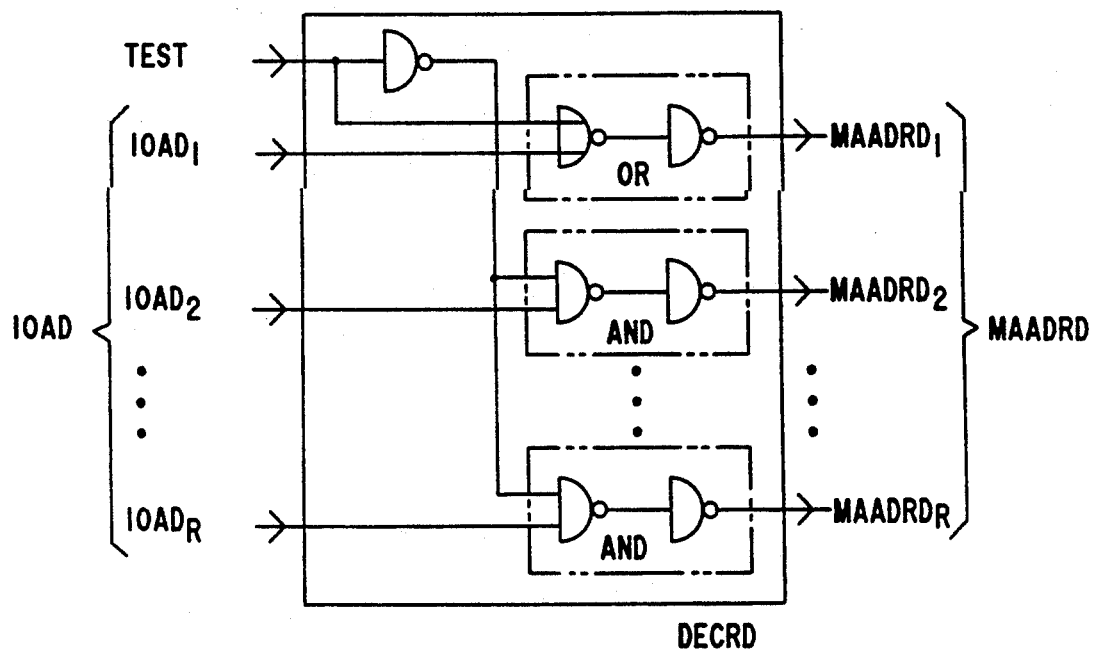
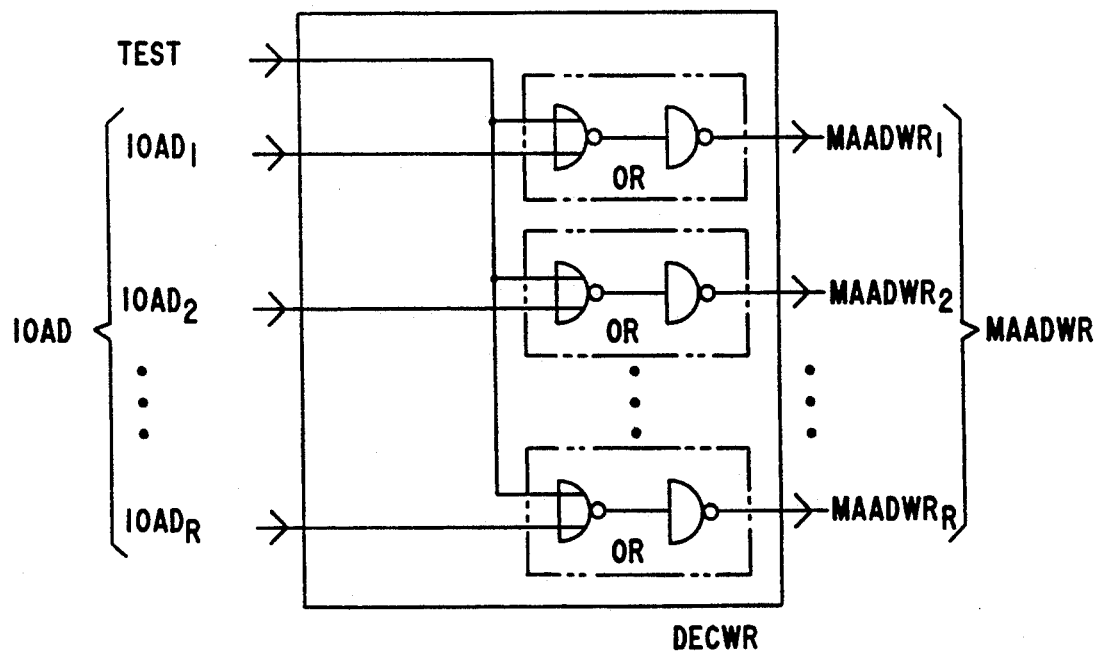

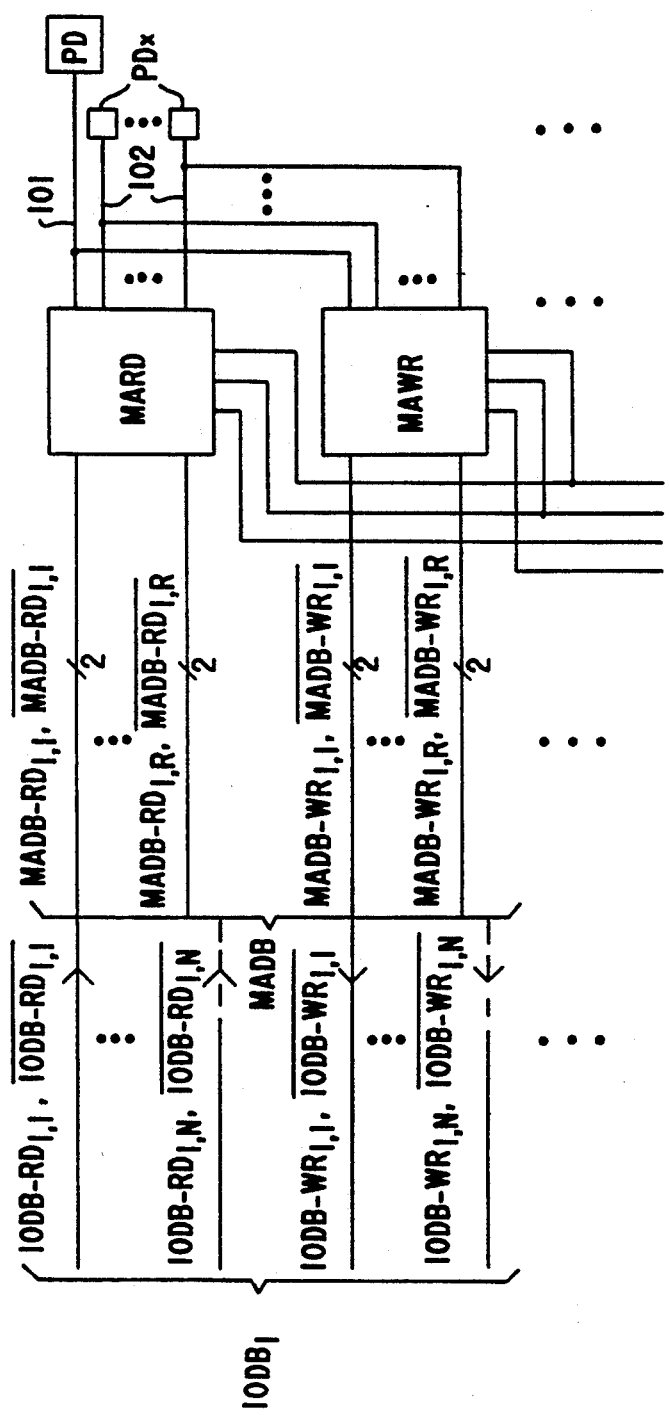

INTEGRATED SEMICONDUCTOR MEMORY WITH PARALLEL TEST CAPABILITY AND REDUNDANCY METHOD

CROSS-REFERENCE TO RELATED APPLICATION

This application is a continuation of International Application Serial No. PCT/EP91/00865, filed May 8, 1991.

The invention relates to an integrated semiconductor memory having a parallel test device which is divided into several block groups, and a method for replacing defective memory cells with redundant memory cells.

A corresponding integrated semiconductor memory is known, for example, from Published European Application No. 0 186 051 A2, corresponding to U.S. Pat. No. 4,472,489. During the testing of that memory, in each case one memory cell of a block group is simultaneously and jointly tested together with each memory cell from each of the remaining block groups for its operation. If one (or a number) of the memory cells being tested jointly are then faulty, the position of the tested memory cells within the block groups is known due to the addressing data applied to the semiconductor memory, but it is not known whether only a single or a number of the memory cells being tested at the same time are defective. In other words, it is also not known whether one block group or a number of block groups contain defective memory cells. There is just as little possibility of identifying the faulty block group(s) being affected. If it is intended to identify the defective memory cell(s) and/or its (their) block group(s), for whatever reason, one is forced to retest the semiconductor memory and then to operate it in a conventional manner, that is to say with no use of the parallel test capability and thus no utilization of the test time reduction specified in the above-mentioned document, when testing without the parallel test capability. A further disadvantage is that a fault which occurs in all of the memory cells being simultaneously tested cannot be detected.

In a paper in "IEEE Transactions on Computers", Vol. 38, No. 3, March 1989, pages 394 to 407, entitled "Parallel Testing for Pattern-Sensitive Faults in Semiconductor Random-Access Memories", a semiconductor memory having only a single block group is disclosed, in which a group of memory cells can be tested simultaneously in each case along one word line. The disadvantage of that semiconductor memory is that a fault which occurs in all of the simultaneously tested memory cells of the group is not detected. It is also disadvantageous that a separate parallel test device is needed for each group of memory cells.

Published European Application No. 0 055 129 A2, corresponding to U.S. Pat. No. 4,464,750, discloses a semiconductor memory having the same organization as Published European Application No. 0 186 051 A2, corresponding to U.S. Pat. No. 4,472,489, in which a fault is also detected that occurs on all of the memory cells being tested simultaneously. In that case too, however, it is not possible to locate defective memory cells (unless all of the memory cells being tested simultaneously are defective), as was already described with respect to Published European Application No. 0 186 051 A2, corresponding to U.S. Pat. No. 4,472,489.

In an integrated semiconductor memory having a parallel test device and several block groups, which is known from Published European Application No. 0 283 906 A1, in a test mode, several groups of memory cells can be simultaneously tested for operation, with each group being disposed along a respective word line within a respective block group of the block groups. The data read out during the testing can be evaluated by the parallel test device.

It is accordingly an object of the invention to provide an integrated semiconductor memory with a parallel test capability and a redundancy method, which overcome the hereinafore-mentioned disadvantages of the heretofore-known devices and methods of this general type and which meet the following requirements:

faults occurring on memory cells being tested simultaneously should be detectable irrespective of the number of defects, the position of the defective memory cells should be determinable in a single test run, the necessary requirement for space and circuit elements for the parallel test device should be as low as possible.

Furthermore, it is intended to specify a method which makes it possible both to be able to fully automatically test a semiconductor memory being present in the form of a semiconductor chip that is not yet molded into a case, for operation in the parallel test method, that is to say without human intervention, and to be able to replace memory cells being detected as defective, by using redundant memory cells.

A suitable method has heretofore not been known. Those of skill in the art have heretofore proceeded in accordance with the following scheme:

testing the semiconductor memory using the parallel test method, if at least one memory cell of the semiconductor memory is defective, another test is run in the normal operating mode, so that the addresses of the defective memory cells are confirmed and recorded, the defective memory cells are then replaced with redundant memory cells, in accordance with previously known algorithms, using the recorded addresses, in a further work cycle, which is separated by required human activities from the test runs.

With the foregoing and other objects in view there is provided, in accordance with the invention, an integrated semiconductor memory, comprising U block groups having word lines, and several groups of M memory cells to be simultaneously tested for operation in a test mode, each group being disposed along a respective word line within a respective one of said U block groups; a parallel test device associated with said U block groups for writing in and evaluating data to be written into and read out of the semiconductor memory; and I/O data lines of the semiconductor memory separately carrying a result of the evaluation for each group of M memory cells.

With the objects of the invention in view, there is also provided a method for replacing memory cells with redundant memory cells in a semiconductor memory including a computer-controlled automatic testing and repair device having algorithms and means for replacing the memory cells, which comprises testing all of the memory cells of the semiconductor memory in a test mode, identifying each defective memory cell group with each detected fault through its address applied from the outside and a respective I/O data line on which the fault is detected, by means of a parallel test device and the automatic testing device within the semiconductor memory, and supplying identification data being obtained for all defective memory cell groups to the automatic repair device which thereupon replaces the memory cell groups having defective memory cells by using the identification data.

With the objects of the invention in view, there is additionally provided a method for replacing memory cells with redundant memory cells in a semiconductor memory including a computer-controlled automatic testing and repair device having algorithms and means for replacing the memory cells, which comprises testing all of the memory cells of the semiconductor memory in a test mode, identifying each defective memory cell with each detected fault through its address applied from the outside and a respective I/O data line on which the fault is detected, by means of a parallel testing device and the automatic testing device within the semiconductor memory, and supplying identification data being obtained for all defective memory cells to the automatic repair device which thereupon replaces the defective memory cells by using the identification data.

Other features which are considered as characteristic for the invention are set forth in the appended claims.

Although the invention is illustrated and described herein as embodied in an integrated semiconductor memory with a parallel test capability and a redundancy method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2 to 12 are schematic and block circuit diagrams showing a first embodiment with advantageous developments;

Figure 1:
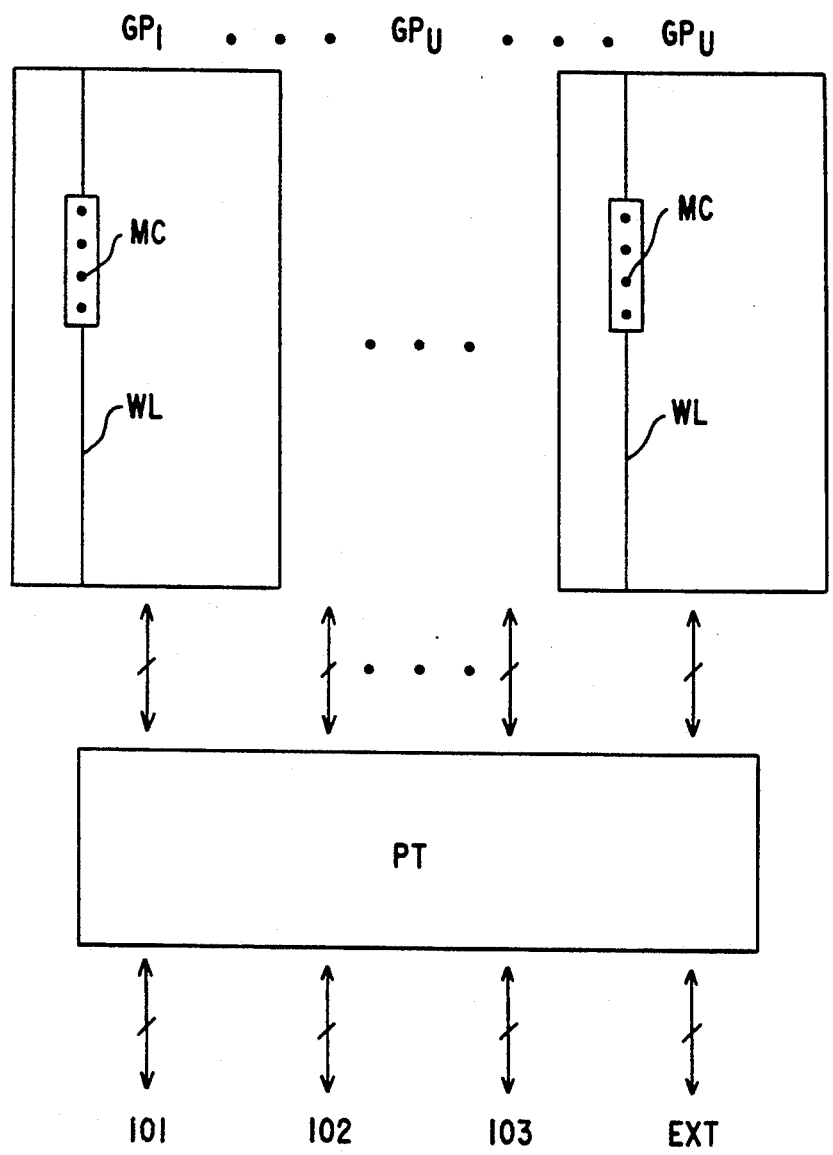
FIG. 1 is a block circuit diagram showing an overview of the memory according to the invention.

Referring now to the figures of the drawing in detail and first, particularly, to FIG. 1 thereof, there is seen a semiconductor memory according to the invention, having memory cells MC and having a test device PT, which contains U block groups $GP_1 \ldots U$, that are generally designated as $GP_u$. The parallel test device PT is provided for carrying out a parallel test (=test mode), that is to say a test in which many memory cells MC are tested simultaneously (=within one memory cycle) which cannot be simultaneously loaded and/or read in a normal operating mode as carried out by users of the semiconductor memory. This parallel test device is used both for writing in data to be written into the semiconductor memory and for reading out from the latter the data written into the semiconductor memory, both in the normal operating mode and in the test mode. In none of the aforementioned documents is it possible to use the parallel test device PT in both the normal and test modes. The parallel test device PT and the block groups $GP_u$ are connected to one another through data, address and control lines, which are only shown diagrammatically in FIG. 1, by means of bidirectional arrows. The parallel test device PT is also connected to connections ("Ext" in FIG. 1) of the semiconductor memory through control and address lines ($\overline{RAS}, \ldots,$ ADR in FIG. 2). Features of the semiconductor memory which are used for its normal operating mode and are not influenced by elements provided for the test mode will not be described in the text which follows, since they can correspond to the prior art and are therefore not a component of the present invention.

Figure 2:
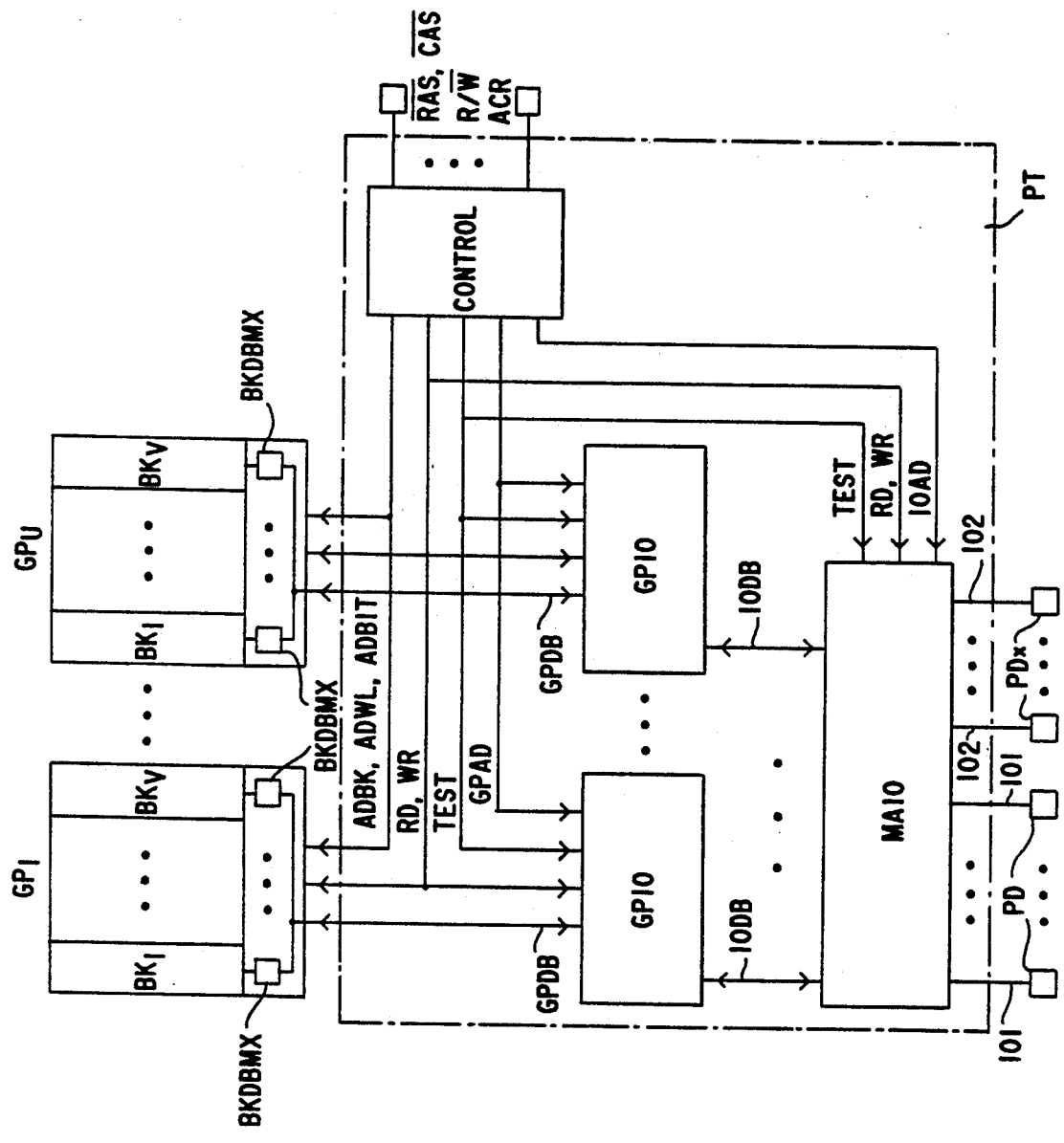
Figure 13:
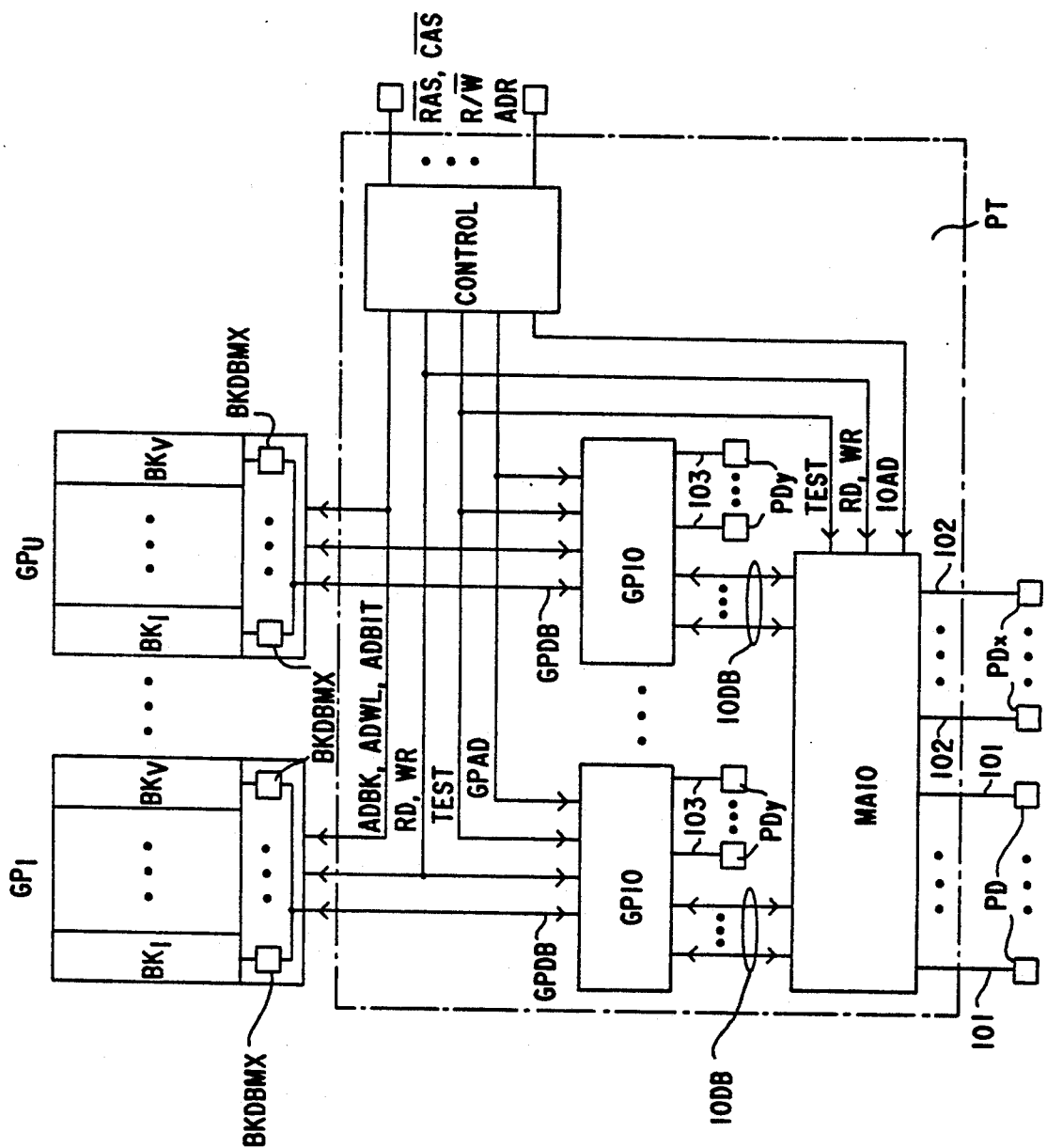
FIGS. 13 to 23 are schematic and block circuit diagrams showing second embodiment with advantageous developments.

In the test mode, several groups which in each case have memory cells MC can be simultaneously tested for operation by means of the parallel test device PT. Each group of M memory cells MC is disposed along a respective word line WL. All data read out within one memory cycle can be evaluated in the parallel test device PT. The result of the evaluation is then available separately on I/O data lines I01, I02, and possibly I03, for each group of memory cells MC. While the data which are necessary for carrying out the test mode are being written in, these data are present on I/O data lines of a first and second type (IO1, I02) and possibly also on those of a third type I03. As usual, the I/O data lines I01, referred to below as "I/O data lines of the first type", are connected at least indirectly through pads PD of the semiconductor chip to pins of the semiconductor memory, as is shown in FIG. 2. They are thus electrically accessible to the user of the completed semiconductor memory which is encapsulated in a case. The I/O data lines I02, I03, respectively referred below to as "I/O data lines of the second type" or "II/O data lines of the third type", can be connected to auxiliary pads PDx or PDy on the semiconductor chip, as is shown in FIG. 13. However, these are not necessarily electrically brought out to pins of the semiconductor memory that is encapsulated in a case. They are thus electrically inaccessible to a user of the semiconductor memory. Although this prevents the user of the semiconductor memory from carrying out the test mode in the sense of the present invention, the manufacturer of the semiconductor memory can exercise the parallel test mode to its full extent until the semiconductor chip is installed in a case. The manufacturer can thus automatically detect and further evaluate the results by means of an automatic tester connected for carrying out the test mode (for example as a function of the memory addresses ADR applied to the semiconductor memory for the respective test). If these auxiliary pads PDx, PDy are provided on the semiconductor chip, they can be constructed smaller, as viewed geometrically, than the normal pads PD, since the known bonding of connecting wires to the pins is eliminated. Furthermore, drivers belonging to the I/O data lines I02, I03 can also have smaller dimensions than corresponding drivers for the I/O data lines I01, because the former do not need to drive loads of the same magnitude as the latter (for example long lines on a board on which the semiconductor memory is mounted). This also minimizes the necessary space requirements for these drivers. If the auxiliary pads PDx, PDy were to be connected to pins, their number would have to be increased. Thus, this semiconductor memory would no longer be pin-compatible with corresponding semiconductor memories of the competition.

FIG. 2 shows a first embodiment of the semiconductor memory according to the invention, in a global overview. Possible embodiments and further developments according to the invention are shown in FIGS. 3 to 12.

FIG. 2 shows a selection of two block groups $GP_1$, $GP_u$, with non-illustrated intermediate block groups being indicated by dots. Each block group $GP_u$ ($u=1 \ldots U$) contains V memory blocks $BK_1 \ldots v$, that are generally designated as $BK_v$ ($v=1 \ldots V$), with only the memory blocks $BK_1$, $BK_V$ being shown in each case. The memory blocks $BK_v$ contain the memory cells MC of the semiconductor memory, that are disposed in matrix form along word lines WL and bit lines BL (shown in FIG. 3). In operation, one memory block $BK_V$ per block group $GP_u$ can be selected as a maximum at any time, which is to say that a total maximum of U memory blocks $BK_V$ of the semiconductor memory can be selected simultaneously. One possible more detailed structure of a memory block is described in greater detail, with respect to FIG. 3, in the text which follows.

FIG. 2 also shows the parallel test device PT in a global overview. The parallel test device PT contains u group input/output units GPIO, each being allocated to one of the U block groups $GP_u$. The input of each group input/output unit GPIO is connected to a group databus GPDB, the construction and operation of which is described in greater detail with regard to FIG. 3 and the subsequent figures. The group databus GPDB carries data to be written into the memory cells MC and to be read out from them. The output of the unit is connected to an input/output databus IODB. All group input/output units GPIO are jointly activated by a test signal Test and a group address bus GPAD and by at least one control signal WR, RD for writing data into the memory cells MC and reading them out. This control signal can be a single control signal, since it is possible to write when the signal is at a first logic level and to read when it is at a second logic level which is complementary to the first logic level. In this embodiment, the signal corresponds virtually to the R/W signal R/$\overline{W}$, which each random-access memory (RAM) is known to exhibit as an externally applicable control signal and is also exhibited by the semiconductor memory according to the present invention. However, In the exemplary embodiments described herein, the signal is assumed to have the form of two separate control signals (write control signal WR and read control signal RD) which are derived from the R/W signal R/$\overline{W}$.

The parallel test device PT also contains a memory array input/output unit MAIO. The input/output unit MAIO is common to all group data input/output units GPIO and thus it is also assigned to all block groups $GP_u$. Its input is connected to the input/output databuses IODB of the group data input/output units GPIO. Its output is connected to P I/O data lines I01 of the first type and to (U-P) I/O data lines I02 of the second type. The memory array input/output unit MAIO is activated by the at least one control signal RD, WR for reading and writing, by the test signal Test and by an I/O address bus IOAD.

The I/O data lines I01 of the first type are at least indirectly connected to those pads PD of the semiconductor memory which are electrically accessible to a user of the semiconductor memory through connecting devices (generally known as pins) of the semiconductor memory. The I/O data lines I02 of the second type can be connected, as shown, at least indirectly to auxiliary pads PDx of the semiconductor memory which are accessible only on the semiconductor chip itself so that they are electrically inaccessible to a user of the semiconductor memory (after encapsulation of the chip in a case). Thus, the manufacturer of the semiconductor memory according to the invention can utilize all of the advantages of the present invention without having to involve his or her customers. In addition, this makes the semiconductor memory pin-compatible with other corresponding semiconductor memories without this parallel test device.

Furthermore, the parallel test device PT contains at least one control unit CONTROL. The control unit CONTROL has inputs for address signals ADR which can be supplied externally to the semiconductor memory and for control signals, for example the generally known signals $\overline{RAS}$ (Row Address Strobe), $\overline{CAS}$ (Column Address Strobe), and R/$\overline{W}$ (Read/Write Enable). It has outputs for block addresses ADBK, word line addresses ADWL and bit group addresses ADBIT. These addresses will be explained in greater detail with reference to FIG. 3 in the text which follows. The control unit CONTROL also has outputs for the at least one control signal (WR, RD) for writing and for reading, for the test signal Test, f or the group address bus GPAD and for the I/O address bus IOAD. The at least one control signal WR, RD f or writing and reading in this case should be constructed in the form of two separate control signals, namely the aforementioned write control signal WR and the (also aforementioned) read control signal RD.

As in general usage, the address signals ADR, which can be supplied externally, contain so-called row address signals and so-called column address signals. The control unit CONTROL generates the block addresses ADBK from the address signals ADR, which can be supplied externally, for example from a first part of the row address signals. It also generates the word line addresses ADWL from the address signals ADR, which can be supplied externally, for example from a second part of the row address signals. In addition, the control unit CONTROL generates the bit group addresses ADBIT from the address signals ADR, which can be supplied externally, for example from a first part of the column address signals, the group address bus GPAD (for example from a second part of the column address signals) and the I/O address bus IOAD (for example from a third and last part of the column address signals). Given these statements, the type of generation does not present any problems to one of skill in the art. In the simplest case, he or she temporarily stores all of the row address signals and all of the column address signals with the aid of the $\overline{RAS}$ and $\overline{CAS}$ lines in corresponding address buffers and forwards the above-mentioned parts of the (temporarily stored) row and column address signals to the corresponding outputs for the block addresses ADBK, the word line addresses ADWL, the bit group addresses ADBIT, the group address bus GPAD and the I/O address bus IOAD.

The control unit CONTROL also generates the read control signal RD and the write control signal WR, for example from the externally applied R/$\overline{W}$ signal alone. If this is at a first logic level (for example "High"), the read control signal RD assumes an active state (for example also "High") and the write control signal WR assumes an inactive state (for example "Low"). If, in contrast, the external signal R/$\overline{W}$ is at a second logic level (for example "Low") which is complementary to the first logic level, the read control signal RD assumes an inactive state (for example also "Low") and the write control signal WR assumes an active state (for example "High").

In addition, the control unit CONTROL generates the test signal Test. This is done, preferably in accordance with the "JEDEC Standard 21-B" of the JEDEC Committee, by means of one or more of the address signals ADR which can be supplied externally and by means of the control signals $\overline{RAS}$, $\overline{CAS}$, $R/\overline{W}$ which can be supplied externally. This standard provides a standardized initialization capability for various operating modes for DRAMs having address multiplex operation and, inter alia, for the capability to activate various test modes as well. This takes place through a certain timing combination of the control signals $\overline{RAS}$, $\overline{CAS}$, $R/\overline{W}$ which can be supplied externally, in conjunction with certain external address signals ADR.

For the present case, the above-mentioned JEDEC Standard provides that the test mode is entered through a so-called "write CAS before RAS" cycle ("WCBR"). At the beginning of such a memory cycle, the following signal conditions are present at the inputs of the semiconductor memory for the corresponding control signals: $R/\overline{W}$ and $\overline{CAS}$ are already at "Low", and $\overline{RAS}$ goes to "Low". The test mode which is critical to the present invention is then "switched on" through a combination of address signals ADR which can be supplied externally and is present at the time of the transition of the control signal $\overline{RAS}$ from "High" to "Low", which is specified by the JEDEC Committee, that is to say the control circuit CONTROL generates the aforementioned test signal Test. Although it may be appropriate (for economic or contractual reasons) to consider the JEDEC Standard for the present invention, this is not necessary. other possibilities for generating the test signal Test are possible and can also be provided. The simplest example is the application of an additional signal to a pin (that is not otherwise used, such as the NC pin) of the semiconductor memory or the application of a signal with overvoltage to a pin (that is otherwise used for other purposes, for example the address signal pin).

If the test signal Test is activated, the semiconductor memory can be operated in the test mode in accordance with the present invention, or otherwise in a normal operating mode which, however, can again be a (another) test mode that is independent of the present invention.

Figure 3:
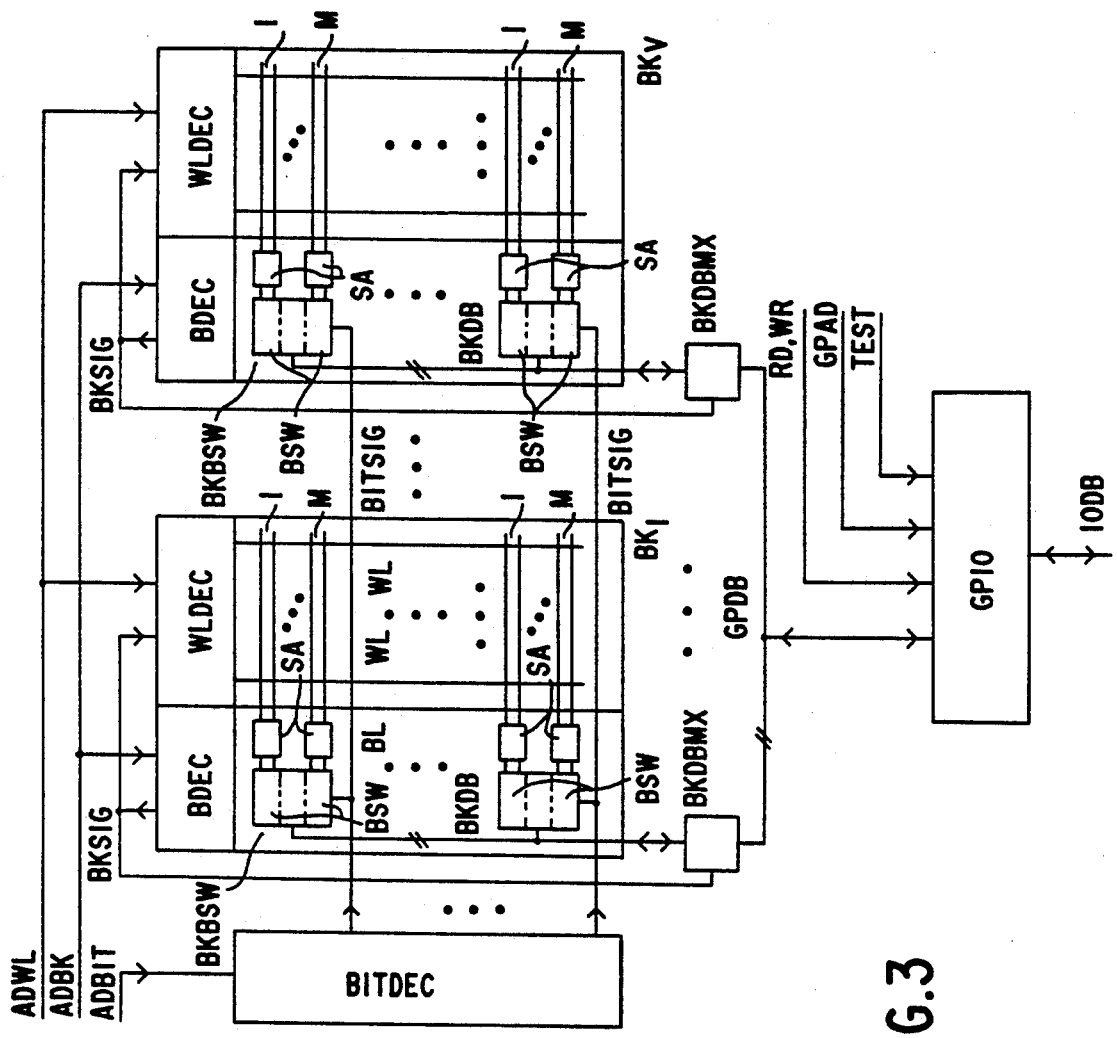

FIG. 3 shows further details of the semiconductor memory according to the invention, which were omitted in FIG. 2 for reasons of clarity. There are seen two memory blocks ($BK_1$, $BK_V$) of the V memory blocks $BK_v$ of a block group $GP_u$. The remaining non-illustrated memory blocks are of the same structure. Each memory block $BK_1$, $BK_V$ contains one block decoder BDEC. This is used for selecting the respective memory block (for example the memory block $BK_1$) from the set of memory blocks $BK_v$ of its block group $GP_u$. In normal operation as in the test mode, one memory block $BK_v$ per block group $GP_u$ in each case is simultaneously selected in all of the block groups $GP_u$. A block decoder BDEC is activated when the block addresses ADBK (generated by the control unit CONTROL) present at its inputs have an address value that is specific for it. For this purpose, the block addresses ADBK have such a number of individual address signals that each of the V block decoders BDEC can decode an address combination from these that is valid for it. In this case, it activates a block selection signal BKSIG as the output signal.

Each memory block $BK_v$ also contains word line decoders WLDC which are followed, as usual, by non-illustrated word line drivers, for activating the individual word lines WL of the respective memory block $BK_v$. The word line decoders WLDEC are activated, on one hand, by the word line addresses ADWL (generated by the control unit CONTROL) and, on the other hand, by the block selection signal BKSIG of the associated block decoder BDEC. For this purpose, the word line addresses ADWL exhibit such a number of individual address signals that each of the word line decoders WLDEC of a memory block $BK_v$ can decode an address combination from these that is valid for it.

The bit lines BL of a memory block $BK_v$ in each case are combined in pairs and connected to a read amplifier SA, as is generally common. A pair of connecting lines is also connected to one end of each read amplifier SA. When data are written into memory cells MC along one of the bit lines BL of the pair of bit lines connected to the respective read amplifier SA, they are used for supplying these data to the read amplifier SA and the bit lines BL connected thereto. When data are read out of the memory cells MC along one of the bit lines BL of the pair of bit lines connected to the respective read amplifier SA, they are used for forwarding the data being read out which are weighted and amplified by the read amplifier SA.

A bit switch BSW is disposed in each case at the other end of each pair of the connecting lines. M bit switches BSW (M=a natural number greater than 1) in each case are combined to form one bit switch block BKBSW. Each bit switch block BKBSW is activated by a bit group selection signal BITSIG so that in each case M memory cells MC can be loaded and/or read at the same time. In this configuration, one bit group selection signal BITSIG per block group $GP_u$ can be used for activating one bit switch block BKBSW each, either in one, in a plurality, or in all of the memory blocks $BK_v$ (the latter is shown in FIG. 3).

Each memory block $BK_v$ has a block databus BKDB through which the data to be written into the memory cells MC of the respective memory block $BK_v$ and the data to be read out of these memory cells MC are carried. Each block databus BKDB has M pairs of data lines for reading (BKDB-RD) and for writing (BKDB-WR). These can be either bidirectional or unidirectional. In the figures, the variant with unidirectional lines is shown in each case. In this variant, a block databus BKDB thus has M pairs of read data lines BKDB-RD and M pairs of write data lines BKDB-WR. In the other non-illustrated variant (bidirectional lines), a block databus BKDB correspondingly has M pairs of data lines which are used both for reading and for writing. Adaptations of individual components of the present invention which become necessary as a result are within the capability of the average person of skill so that they need not be separately shown herein, especially since they do not contribute anything to the concept of the present invention.

The M pairs of read data lines BKDB-RD can be optionally connected to the M pairs of connecting lines of each bit switch block BKBSW, under the control of the respective bit group selection signal BITSIG through the bit switch block BKBSW. Similarly, the M pairs of write data lines BKDB-WR can be optionally connected to the M pairs of connecting lines of each bit switch block BKBSW, under the control of the respective bit group selection signal BITSIG through the bit switch block BKBSW. This correspondingly applies to the non-illustrated variant of bidirectional data lines of the block databus BKDB. In this configuration, the M pairs of data lines which are used both for reading and for writing, can be optionally connected to the M pairs of connecting lines of each bit switch block BKBSW under the control of the respective bit group selection signal BITSIG through the bit switch block BKBSW.

FIG. 3 shows a bit group decoder BITDEC for generating the bit group selection signals BITSIG. These signals are generated in a quantity which is equal to the nuipber of bit switch blocks BKBSW of one of the memory blocks $BK_y$. In the end, these are used for selecting the bit lines BL as in the known memories. Due to the fact that in each case they activate M bit switches BSW per bit switch block BKBSW as described, in each case they connect (in contrast to the prior art) M pairs of connecting lines (which, in turn, are associated with M pairs of bit lines BL through the respective read amplifier SA, as described) to the block databus BKDB. Thus, the bit group selection signals BITSIG are present in a quantity (A:M), with A being equal to the number of pairs of bit lines BL per word line WL of a memory block $BK_y$. The number of bit group addresses ADBIT that are necessary for this is of such a magnitude that the (A:M) bit group selection signals BITSIG can be decoded from them. At least one bit group decoder BITDEC is necessary per block group $GP_u$. In this case, its bit group selection signals BITSIG are supplied to a respective bit switch block BKBSW in all of the memory blocks $BK_y$ of the respective block group $GP_u$. However, a number of bit group decoders BITDEC can also be provided, as was already described, which then activate bit switch blocks BKBSW of only some of the memory blocks $BK_y$ through their bit group selection signals BITSIG. In the maximum case, one bit group decoder BITDEC can be provided for each individual one of the V memory blocks $BK_y$. No advantages can be seen in this, but there is a significant disadvantage: the necessary space requirement becomes correspondingly greater. The bit group decoder BITDEC is activated by the bit group addresses ADBIT (generated by the control unit CONTROL, as already described), from which it decodes the bit group selection signals BITSIG.

Each memory block $BK_y$ (the memory blocks $BK_1$, $BK_V$ are shown in FIG. 3 while the remaining memory blocks are indicated by dots) is associated with a block databus multiplexer BKDBMX, which has both a differentially amplifying and a multiplexing function. The block databus multiplexer BKDBMX is connected, on one hand, to the write data lines BKDB-WR and the read data lines BKDB-RD of the block databus BKDB of the respective memory block $BK_y$. On the other hand, it is connected to M pairs of data lines for writing GPDB-WR, and for reading GPDB-RD, of a group databus GPDB. The group databus GPDB is connected to all of the block databus multiplexers BKDBMX of the memory blocks $BK_y$ of a block group $GP_u$.

In a manner similar to the data lines of the block databus BKDB (see the relevant preceding description), the data lines of the group databus GPDB can also be constructed to be operated bidirectionally or unidirectionally. The further description is based on the unidirectional variant, so that the group databus GPDB has M pairs of write data lines GPDB-WR and M pairs of read data lines GPDB-RD.

Each block databus multiplexer BKDBMX is controlled by the block selection signal BKSIG of the block decoder BDEC of the memory block $BK_y$ which is associated with the block databus multiplexer BKDBMX. Since in each case only one memory block $BK_y$ of one block group $GP_u$ can be activated at any time during operation (independently of the test and normal mode), as was already described initially, in each case only a single block decoder BDEC and thus only a maximum of block selection signals BKSIG is also activated. Thus, only a maximum of one of the block databuses BKDB of a block group $GP_u$ is maximally connected to the group databus GPDB through the respective block databus multiplexer BKDBMX.

FIG. 3 also shows one of the U group input/output units GPIO of the parallel test device PT with its connections, as was already described with regard to FIG. 2. The input/output databus IODB can have a single data line pair for writing and for reading (bidirectional), similar to the block databuses BKDB and the group databus GPDB. However, it can also have a pair of data lines for writing IODB-WR, $\overline{\text{IODB-WR}}$ and a pair of data lines for reading IODB-RD, $\overline{\text{IODB-RD}}$ (unidirectional), as is described with regard to the following figures.

Figure 4:
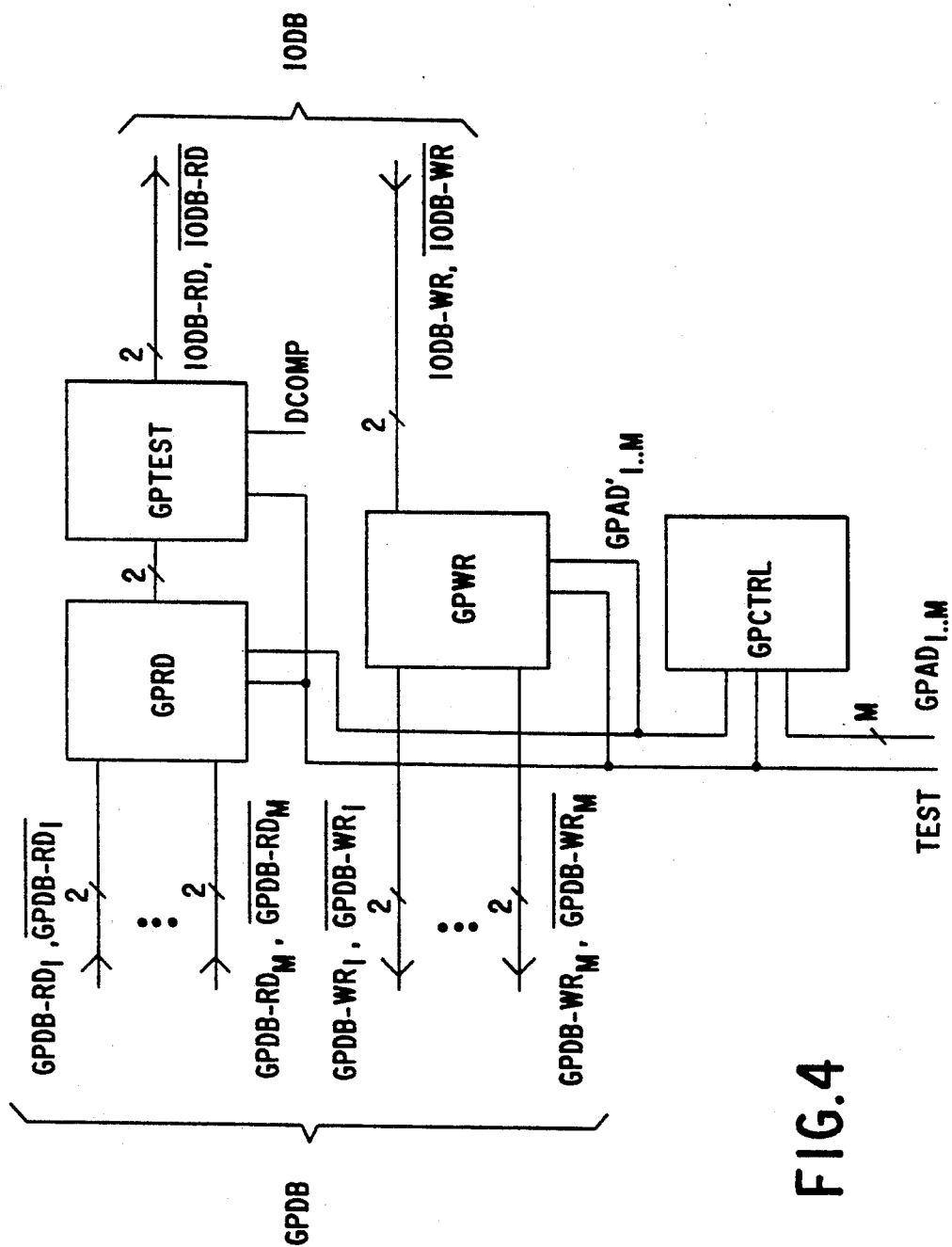

FIG. 4 shows a block diagram representation of a group input/output unit GPIO. The group input/output unit GPIO contains a group control circuit GPCTRL, a group write unit GPWR, a group read unit GPRD and a group test unit GPTest. The group address bus GPAD contains M group address signals $GPAD_1 \ldots M$ which are generally designated $GPAD_m$, one of which is activated independently of the operating mode in each case, that is to say is at a first logic level (for example "High"), and the remaining group address signals of which are deactivated, that is to say they are at a second logic level (for example "Low") which is complementary to the first logic level. This is ensured by the control unit CONTROL of the parallel test device PT, for example by corresponding decoding of some of the externally suppliable address signals ADR.

The input of the group control circuit GPCTRL is connected to the M group address signals $GPAD_m$ of the group address bus GPAD and to the test signal Test. The group control circuit GPCTRL has outputs for M group address output signals $GPAD'_1 \ldots M$ (that are generally designated $GPAD'_m$), which are associated with the group address signals $GPAD_m$.

In the test mode, all of these have a common logic level (for example all "High" or all "Low"). In principle, the type of this logic level (High or Low) is of no importance, since it depends only on the logic used in the group read unit GPRD and the group write unit GPWR (positive or negative logic). At present, positive logic is used so that this logic level is equal to "High" (=logic 1).

In the normal operating mode, that is to say when the test signal Test is deactivated, each of the group address output signals $GPAD'_1 \ldots M$ is at the logic state of the group address signal $GPAD_m$ which is associated in each case. This is illustrated in the following Table 1 (for M=3), where "Test=1" means that test signal Test is activated and is at the logic value 1 (positive logic being assumed). Correspondingly, "Test=0" means that the test signal is deactivated, corresponding to "logic 0". Furthermore, "x" means "don't care".

TABLE 1

| Test | GPAD$_1$ | GPAD$_2$ | GPAD$_3$ | GPAD'$_1$ | GPAD'$_2$ | GPAD'$_3$ |
|---|---|---|---|---|---|---|
| 0 | 1 | 0 | 0 | 1 | 0 | 0 |
| 0 | 0 | 1 | 0 | 0 | 1 | 0 |
| 0 | 0 | 0 | 1 | 0 | 0 | 1 |
| 1 | x | x | x | 1 | 1 | 1 |

The group write unit GPWR has inputs for the group address output signals GPAD'$_m$ and two other inputs for the two write data lines IODB-WR, $\overline{\text{IODB-WR}}$ of the input/output databus IODB. The group write unit GPWR also has M pairs of outputs for the M pairs of write data lines GPDB-WR$_m$, $\overline{\text{GPDB-WR}}_m$ of the group databus GPDB.

Figure 7:
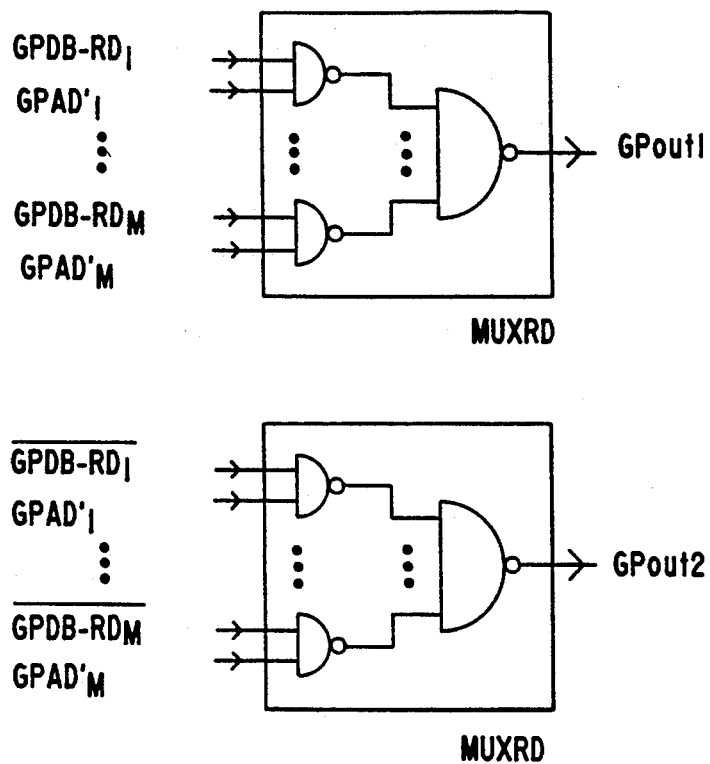
Figure 8:
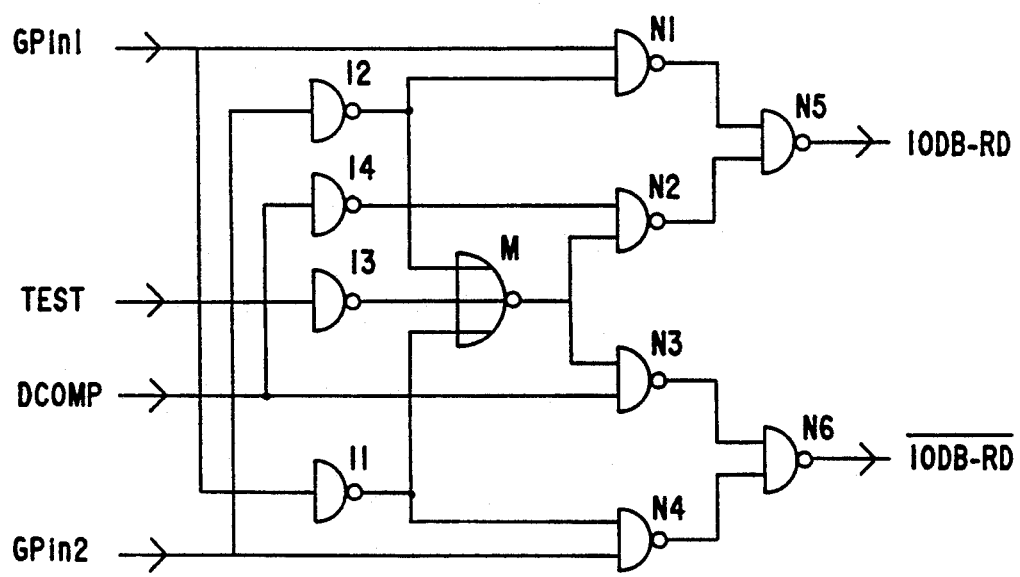

Correspondingly, the group read unit GPRD has M pairs of inputs for the M pairs of read data lines GPDB-RD$_m$, $\overline{\text{GPDB-RD}}_m$ of the group databus GPDB and further inputs for the M group address output signals GPAD'$_m$ of the group control circuit GPCTRL. In addition, it has two outputs (indicated in FIG. 4 by the number 2 above the output) GPout1, GPout2 which are connected to two inputs GPin1, GPin2 of the group test unit GPTest, as is seen in FIGS. 7 and 8.

In addition to the two inputs GPin1, GPin2, the group test unit GPTest also has a third input for the test signal Test and a fourth input for comparison data DCOMP. The comparison data DCOMP can be supplied either by a pin of the semiconductor memory which is not used outside the test mode (NC pin) or through a pin of an address line ADR, which is not necessary for addressing in the test mode. If all M memory cells MC that are tested by means of (inter alia) the group read unit GPRD and the components following them (for example the corresponding read amplifiers SA) are correct in the test mode, the value (logic 0, logic 1) of the comparison data DCOMP corresponds to the data on all of the read data lines GPDB-ROM of the pairs of read data lines GPDB-RD$_m$, $\overline{\text{GPDB-RD}}_m$ of the group databus, and if not, it does not. The group test unit GPTest also has two outputs (indicated by the number 2 above the output) for the two read data lines IODB-RD, $\overline{\text{IODB-RD}}$ of the input/output databus IODB. These components of the group input/output unit GPIO are explained in greater detail with reference to further figures, in the text which follows:

FIG. 5 shows a possible embodiment of the group control circuit GPCTRL. The group control circuit GPCTRL contains M mutually independent OR gates OR which are each constructed as a NOR gate having two inputs and an inverter following the NOR gate. First inputs of the NOR gates, which are first inputs of the OR gates, form one input of the group control circuit GPCTRL for the test signal Test. In each case, each of the second inputs of the NOR gates, which are second inputs of the OR gate OR, forms an input of the group control circuit GPCTRL for one of the M group address signals GPAD$_m$ of the group address bus GPAD. The outputs of the OR gate OR are the outputs of the group control circuit GPCTRL. Accordingly, the group address output signals GPAD'$_m$ that were already described, are present at these outputs.

FIG. 6 shows a possible embodiment of the group write unit GPWR. The group write unit GPWR contains two demultiplexers DMUXWR, each of which has M inputs for the M group address output signals GPAD'$_m$ of the group control circuit GPCTRL. In addition, each demultiplexer DMUXWR contains a further input for a respective line of the pair of write data lines IODB-WR, $\overline{\text{IODB-WR}}$ of the input/output databus IODB. Each demultiplexer DMUXWR has M outputs for the write data lines GPDB-WR$_m$, $\overline{\text{GPDB-WR}}_m$ of the group databus GPDB. The outputs of one demultiplexer DMUXWR are connected with one respective write data line GPDB-WP$_m$ of the pairs of write data lines GPDB-WR$_m$, $\overline{\text{GPDB-WR}}_m$ and the the outputs of the other demultiplexer DMUXWR are connected to the other respective write data line $\overline{\text{GPDB-WR}}_m$ of the pairs of write data lines GPDB-WR$_m$, $\overline{\text{GPDB-WR}}_m$. The outputs of the demultiplexers DMUXWR are the outputs of the group write unit GPWR. Each of the outputs of a demultiplexer DMUXWR is associated internally through a corresponding input with one of the group address output signals GPAD'$_m$ of the group control circuit GPCTRL, which is explained in greater detail in the text which follows.

In the normal operating mode, a data item which is to be written into the semiconductor memory and which is present at the further input of a demultiplexer DMUXWR, which input is connected to one write data line IODB-WR of the input/output databus IODB, is switched through to the output of the demultiplexer DMUXWR having an associated group address output signal GPAD'$_m$ which is at the first logic level of the corresponding group address signal GPAD$_m$ (according to Table 1, this is the group address output signal GPAD'$_m$ and group address signal GPAD$_m$ which has the logic value 1). Correspondingly, in the normal operating mode, a data item which is complementary to the data item to be written into the semiconductor memory and which is present at the further input of the other demultiplexer DMUXWR, which input is connected to the other write data line $\overline{\text{IODB-WR}}$ of the input/output databus IODB, is switched through to the output of the demultiplexer DMUXWR having an associated group address output signal GPAD'$_m$ which is at the first logic level of the corresponding group address signal GPAD$_m$.

In the test mode, the data item present at the respective further input of the respective demultiplexer DMUXWR is switched through in both demultiplexers DMUXWR to all outputs of the respective demultiplexer DMUXWR, so that a data item to be written in is simultaneously written into M memory cells MC of a memory block BK$_\nu$.

Expressed in simpler words, this means that in the normal operating mode, the data item present at the further input of each demultiplexer DMUXWR is switched through to the one output having an associated group address output signal GPAD'$_m$ which is activated. In the test mode, the data item present at the further input of each demultiplexer DMUXWR is switched through to all of the outputs of the demultiplexer DMUXWR.

Each demultiplexer DNUXWR in the embodiment of FIG. 6 contains M mutually independent AND gates AND in each case having two inputs. One of the inputs thereof is jointly connected to the respective write data line IODB-WR or, respectively, $\overline{\text{IODB-WR}}$ of the input/output databus IODB. The other inputs of the AND gates AND are connected to a respective one of the M group address output signals GPAD$'_m$ of the group control circuit GPCTRL in each demultiplexer DMUXWR. Each AND gate AND of the demultiplexers DMUXWR according to FIG. 6 is constructed in the form of an NAND gate followed by an inverter. The NAND gate has two inputs which are the inputs of the AND gate AND.

FIG. 7 shows a possible embodiment of the group read unit GPRD of a group input/output unit GPIO. The operation of this illustrated embodiment embodies the teaching according to the invention with respect to a group read unit GPRD. The embodiment shown in FIG. 7 is only one of the possibilities for implementing this teaching. According to FIG. 7, the group read unit GPRD contains two multiplexers MUXRD. Each multiplexer NUXRD has respective M inputs for one (GPDB-RD$_{1...M}$) and for the other ($\overline{\text{GPDB-RD}_{1...M}}$) data lines of the M pairs of data lines GPDB-RD$_m$, $\overline{\text{GPDB-RD}_m}$ of the group databus GPDB associated with the respective group input/output unit GPIO. In addition, each multiplexer has further inputs, in each case for the M group address output signals GPAD$'_m$ of the group address output bus GPAD$'$ of the group control circuit GPCTRL. These inputs are the inputs of the group read unit GPRD, as was already described with respect to FIG. 4. The multiplexers MUXRD also each have one output, which are the outputs GPout1, GPout2 of the group read circuit GPRD described with regard to FIG. 4. Each of the group address output signals GPAD$'_m$ is associated in each multiplexer MUXRD with exactly one of the read data lines GPDB-RD$_m$ and $\overline{\text{GPDB-RD}_m}$, respectively, of the group databus GPDB.

In the normal operating mode, in which, of course, exactly one of the group address signals GPAD$_m$ and thus one of the group address output signals GPAD$'_m$ of the group control unit GPCTRL is activated, that is to say is at the first logic level (the value "logic 1" was assumed for this in Table 1), and in which the remaining group address output signals GPAD$'_m$ of the group address output signal bus GPAD$'$ are deactivated, (that is to say are at the second logic level), precisely that pair of read data lines GPDB-RD$_m$, $\overline{\text{GPDB-RD}_m}$ of the group databus GPDB is switched through by the multiplexers MUXRD to the outputs GPout1, GPout2 of the group read circuit GPRD which is associated with an activated group address output signal GPAD$'_m$ of the group address output signal bus GPAD$'$.

In the test mode, in the case in which all of the respective read data lines GPDB-RD$_m$ and $\overline{\text{GPDB-RD}_m}$ of the group databus GPDB present at a respective multiplexer MUXRD have the same data item, the latter is switched through to the output of the respective multiplexer MUXRD, and thus to the respective output GPout1 and GPout2 of the group read unit GPRD. This is why these outputs GPout1, GPout2 are at mutually complementary logic levels in this case in the test mode (because of the operation of the read amplifiers SA and the block databus multiplexers BKDBMX, each pair of read data lines of the group databus GPDB is at mutually complementary logic levels=data).

In other respects, the outputs GPout1, GPout2 of the group read unit GPRD have a mutually identical logic level in the test mode (in FIG. 7, both of the GPout1 and GPout2 outputs are at a logic 1).

In the actual embodiment according to FIG. 7, each multiplexer MUXRD contains M NAND gates each having two inputs and a further NAND gate having M inputs, which in each case are connected to the output of one of the M NAND gates. The output of the further NAND gate is the output GPout1, GPout2 of the respective multiplexer MUXRD. One respective line (GPDB-RD$_m$) of each pair of read data lines GPDB-RD$_m$, $\overline{\text{GPDB-RD}_m}$ of the group databus GPDB is connected to one respective input of the M NAND gates of the one multiplexer MUXRD. The other respective line $\overline{\text{GPDB-RD}_m}$ of each pair of read data lines GPDB-RD$_m$, $\overline{\text{GPDB-RD}_m}$ of the group databus GPDB is connected to one respective input of the M NAND gates of the other multiplexer MUXRD. Furthermore, the other inputs of the M NAND gates receive the group address output signal GPAD$'_m$ associated with the respective read data line GPDB-RD$_m$, $\overline{\text{GPDB-RD}_m}$ in the multiplexers MUXRD.

FIG. 8 shows the group test unit GPTest that has a first input GPin1 and a second input GPin2 which are connected to the respective outputs GPout1, GPout2 of the group read unit GPRD. The group test unit GPTest has a third input f or the test signal and a fourth input for the comparison data item DCOMP. The group test unit has two outputs for the read data lines IODB-RD, $\overline{\text{IODB-RD}}$ of the input/output databus IODB.

The group test unit GPTest has the following function: in the normal operating mode, the signal which is present at the respective input GPinl and GPin2 of the first two inputs GPinl, GPin2 is present at the outputs. In the test mode, in the one case in which the outputs GPout1, GPout2 of the group read unit GPRD connected to the first two inputs GPin1, GPin2 are at the mutually complementary logic levels, these complementary levels are present at the outputs of the group test unit GPTest. In the other case, in which the outputs GPout1, GPout2 of the group read unit GPRD, which are connected to the first two inputs GPin1, GPin2, and are both at the same logic levels (logic 1 at present), one of the two outputs of the group test unit GPTest is at a logic level which is complementary to the logic level of the comparison data item DCOMP, whereas the other one of the two outputs is at the logic level of the comparison data item DCOMP.

In the embodiment shown in FIG. 8, the group test unit GPTest contains six NAND gates N1 ... N6 each having two inputs and one output, and a NOR gate NOR having three inputs and one output. One input of the first NAND gate N1 is the first input GPin1 of the group test unit GPTest. One input of the fourth NAND gate N4 is the second input GPin2 of the group test unit GPTest. The first input GPinl of the group test unit GPTest is connected through a first inverter I1 both to the other input of the fourth NAND gate N4 and to a first input of the NOR gate NOR. The second input GPin2 of the group test unit GPTest is connected through a second inverter I2 both to the other input of the first NAND gate N1 and to a second input of the NOR gate NOR.

The test signal Test can be supplied to a third input of the NOR gate NOR through a third inverter I3. The comparison data item DCOMP can be supplied to one input of the third NAND gate N3 and through a fourth inverter I4 to one input of the second NAND gate N2. The output of the NOR gate NOR is connected to the other inputs of the second and third NAND gates N2, N3. The outputs of the first and of the second NAND gates N1, N2 are connected to the inputs of the fifth NAND gate N5. The outputs of the third and of the fourth NAND gates N3, N4 are connected to the inputs of the sixth NAND gate N6. The outputs of the fifth and of the sixth NAND gates N5, N6 are the two outputs of the group test unit GPTest.

Figure 9:
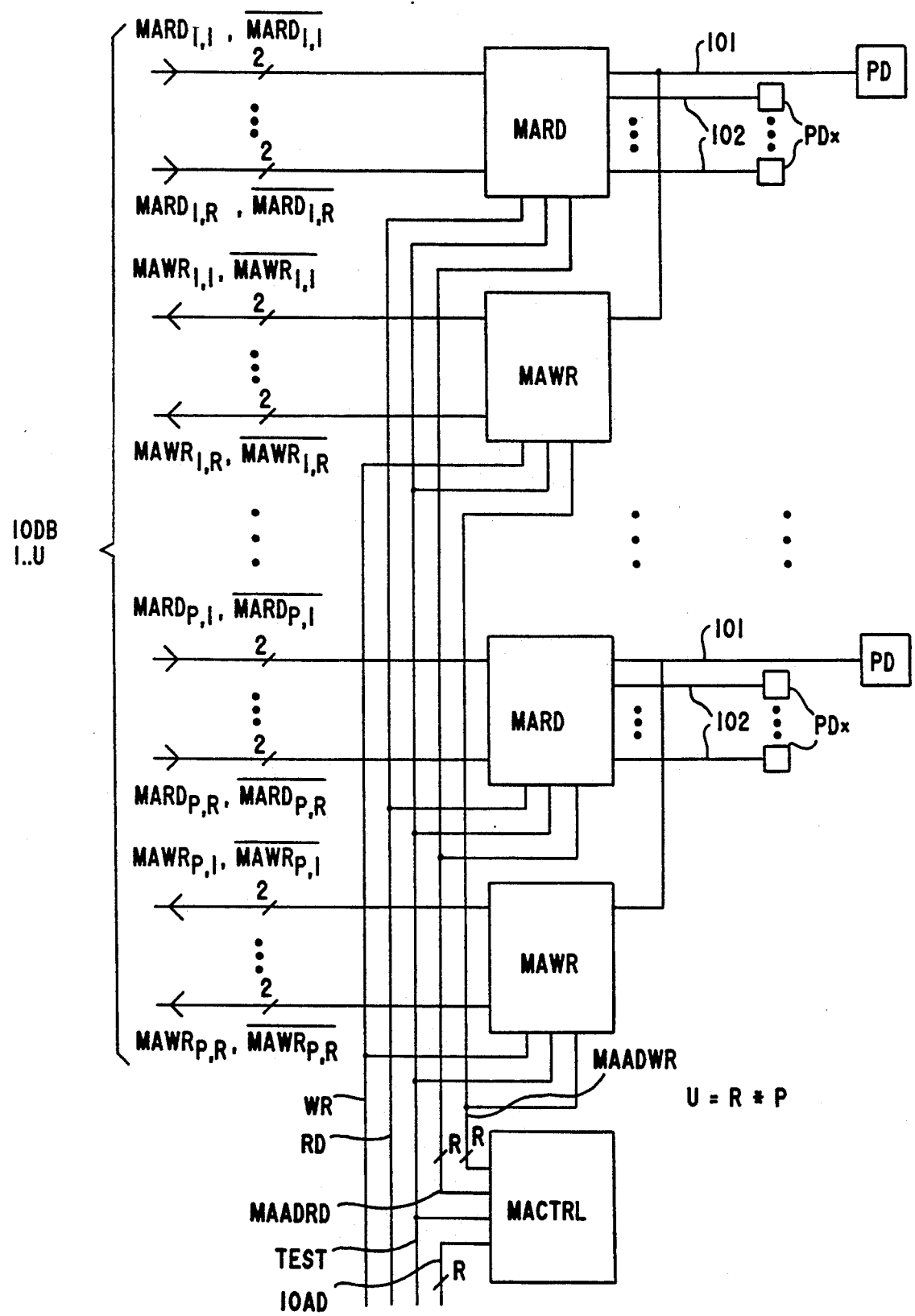

FIG. 9 shows the memory array input/output unit MAIO in an overview. The memory array input/output unit MAIO contains P memory array read units MARD each having R read units (RDU1, RDU2 shown in FIG. 11), P memory array write units MAWR and a memory array control circuit MACTRL.

In each case the memory array write units MAWR are allocated to one of the memory array read units MARD. Each memory array read unit MARD has R pairs of data input lines $MARD_{p,r}$, $\overline{MARD_{p,r}}$. Each memory array write unit MAWR has R pairs of data output lines $MAWR_{p,r}$, $\overline{MAWR_{p,r}}$. In each case the index p is constant for R pairs and overall has the following values: $p=1 \ldots P$. The index r has the following values: $r=1 \ldots R$. The numbers P, R, U have the following correlation: $P.R=U$.

The data input lines $MARD_{p,r}$, $\overline{MARD_{p,r}}$ are connected to the read lines IODB-RD, $\overline{IODB-RD}$ of the U input/output databuses IODB. The data output lines $MAWR_{p,r}$, $\overline{MAWR_{p,r}}$ are connected to the write lines IODB-WR, $\overline{IODB-WR}$ of the U input/output databuses IODB. One output of each memory array read unit MARD is connected to one of the I/O data lines I01 of the first type and to a data input of its associated memory array write unit MAWR. Each memory array read unit MARD also has outputs for (R−1) I/O data lines I02 of the second type. All of the memory array read units MARD jointly receive the read control signal RD. All of the memory array write units MAWR jointly receive the write control signal WR. All of the memory array read units MARD, all of the memory array write units MAWR and the memory array control circuit MACTRL jointly receive the test signal Test. All of the memory array read units MARD are jointly connected to a memory array read address bus MAADRD shown in FIG. 11. All of the memory array write units MAWR are jointly connected to a memory array write address bus MAADWR shown in FIG. 12.

The memory array control circuit MACTRL is a circuit for generating the memory array read address bus MAADRD and the memory array write address bus MAADWR from the I/O address bus IOAD under control of the test signal Test, the memory array read address bus MAADRD and the memory array write address bus MAADWR which in each case include R address lines $MAADRD1 \ldots R$ and $MAADWR1 \ldots R$, respectively.

In this case too, in a manner similar to the databuses already described before (BKDB, GPDB, IODB), in each case one pair of data input lines $MARD_{p,r}$, $\overline{MARD_{p,r}}$ and one pair of data output lines $MAWR_{p,r}$, $\overline{MAWR_{p,r}}$ can be provided as a single pair of data lines which can be operated bidirectionally.

FIG. 10 shows the memory array control circuit MACTRL which contains a read decoder DECRD and a write decoder DECWR. Both of these switch the I/O address bus IOAD through to the memory array read address bus MAADRD and to the memory array write address bus MAADWR in the normal operating mode. In the test mode, a first line of the memory array read address bus MAADRD is placed at a constant logic level by means of the read decoder DECRD and the test signal Test (this level can be a logic 0 or a logic 1 depending on the logic used, although a logic 1 is assumed at present). The remaining lines of the memory array read address bus MAADRD are at a logic level which is complementary to the logic level of the first line and which is also constant. Furthermore, all of the lines of the memory array write address bus MAADWR are placed at a constant logic level by means of the write decoder DECWR and the test signal Test in test mode. The value of this level is equal to the logic level of the first line of the memory array read address bus MAADRD.

In the actual embodiment according to FIG. 10, the read decoder DECRD contains an OR gate OR having two inputs and one output. One input receives the test signal Test. The other input is connected to a first line $IOAD_1$ of the I/O address bus IOAD. The output is connected to the first line of the memory array read address bus MAADRD. The read decoder DECRD also has (R−1) AND gates AND each having two inputs and one output. In each case one input receives a signal complementary to the test signal Test. Each of the other inputs is connected to one of the remaining lines of the I/O address bus IOAD. Each of the outputs is connected to one of the remaining lines of the memory array read address bus MAADRD.

The write decoder DECWR contains R OR gates OR each having two inputs and one output. One of the inputs jointly receive the test signal Test. The other of the inputs are connected to the I/O address bus IOAD. The outputs are connected to the memory array write address bus MAADWR.

According to FIG. 10, the OR gates OR of the read decoder DECRD and the OR gates OR of the write decoder DECWR in each case contain a NOR gate followed by an inverter. Similarly, the AND gates AND of the read decoder DECRD contain a NAND gate followed by an inverter.

Figure 11:
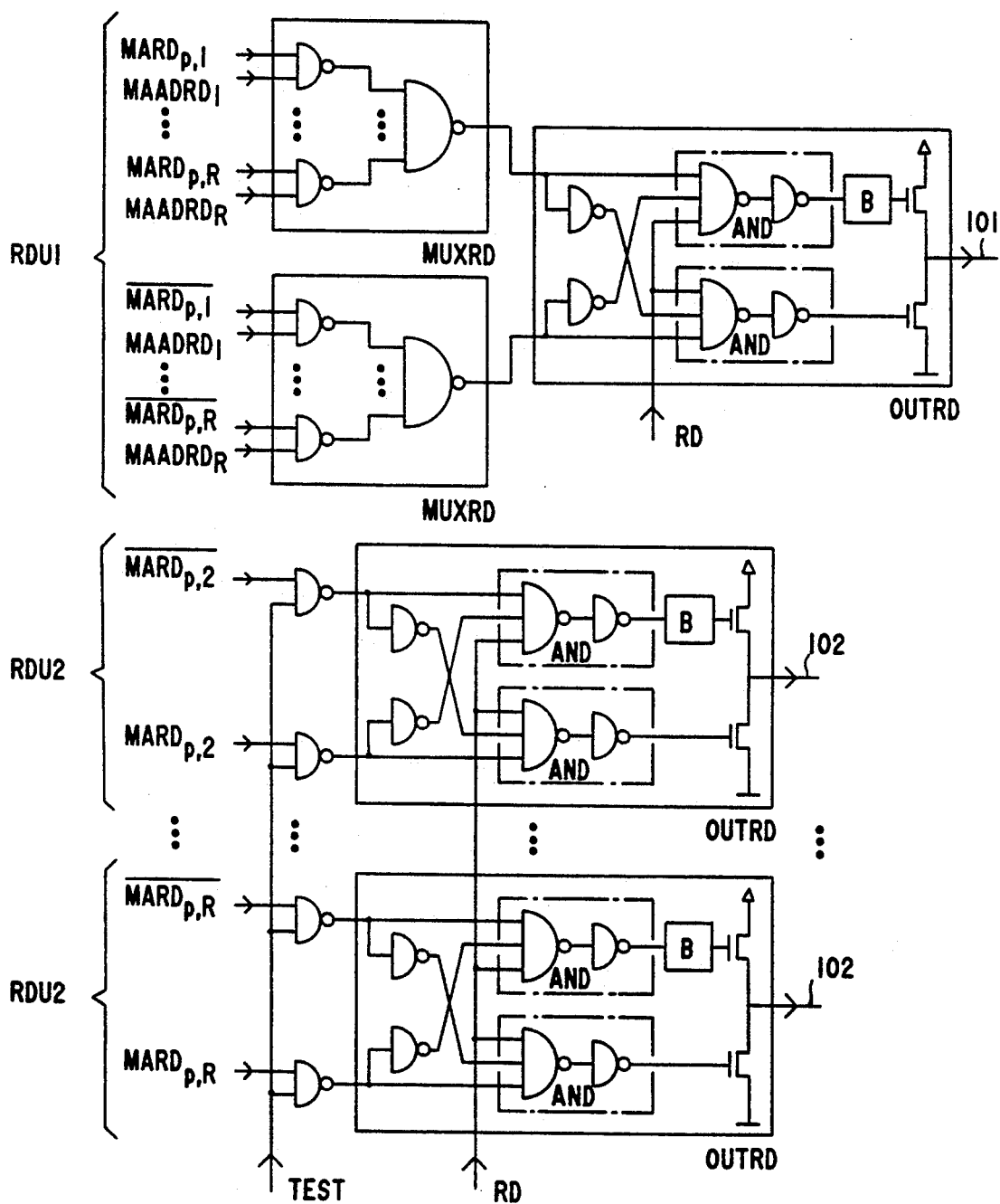

FIG. 11 shows a memory array read unit MARD which contains a first read unit RDUL and (R−1) remaining read units RDU2. The first read unit RDUL contains two multiplexers NUXRD and an output stage OUTRD. Each multiplexer NUXRD has R first inputs in each case being for one respective data input line $MARD_{p,r}$ and $\overline{MARD_{p,r}}$ of the R pairs of data input lines $MARD_{p,r}$, $\overline{MARD_{p,r}}$. Furthermore, each multiplexer MUXRD has R second inputs for the memory array read address bus MAADRD, the lines of which are allocated to the respective data input lines $MARD_{p,r}$ and $\overline{MARD_{p,r}}$, and one output.

In both multiplexers MUXRD, the respective data input line $MARD_{p,r}$ or $\overline{MARD_{p,r}}$, having an associated line of the memory array read address bus MAADRD which is in the active state, is switched through to the respective output in the normal operating mode.

In both multiplexers MUXRD, the respective data input line $MARD_{p,r}$ or $\overline{MARD_{p,r}}$ which is associated with the first line $MAADRD_1$ of the memory array read address bus MAADRD with its constant logic level, is switched through to the output in the test mode.

The output stage OUTRD is a driver circuit having an output which is the output of the overall memory array read unit MARD connected to one of the I/O data lines I01 of the first type. It exhibits the signal present at the output of one multiplexer NUXRD in amplified form, independently of the operating mode.

In the embodiment according to FIG. 11, each multiplexer MUXRD of the first read unit RDUL has R NAND gates each having two inputs. In each case one of the inputs is one of the R first inputs of the multiplexer MUXRD. In each case the other input is one of the R second inputs of the multiplexer MUXRD. Each multiplexer MUXRD of the first read unit RDUL has an additional NAND gate having R inputs. In each case these are connected to one output of the R NAND gates. The output of the additional NAND gate is the output of the respective multiplexer NUXRD of the first read unit RDU1.

The output stage OUTRD has two AND gates AND each having three inputs and one output. A respective first input of each AND gate AND is connected to the output of one respective multiplexer MUXRD. A second input of each AND gate AND is connected to the output of the other respective multiplexer MUXRD through an inverter. A third input of the AND gates AND receive the read control signal RD. The output stage OUTRD has a final stage with an input which is connected to the outputs of the AND gates AND and an output of which is connected to the output of the output stage OUTRD and of the first read unit RDUL. Each of the AND gates AND contains a NAND gate followed by an inverter. As is shown, the output stage OUTRD can also contain a boost configuration B, which is described with respect to FIG. 18.

The remaining (R−1) read units RDU2 in each case contain an output stage OUTRD having two inputs and one output. The output is one of the outputs for the (R−1) I/O data lines I02 of the second type. Each input of an output stage OUTRD is preceded by a NAND gate having two inputs. In each case the first input of the NAND gate is connected to one of the two respective data input lines $MARD_{p,2...R}$ or $\overline{MARD}_{p,2...R}$ of the R pairs of data input lines $MARD_{p,r}$, $\overline{MARD}_{p,r}$, with the exception of the first pair $MARD_{p,1}$, $\overline{MARD}_{p,1}$ of these R pairs. The second input of the NAND gate receives the test signal Test.

In the normal operating mode, the outputs of the remaining (R−1) read units RDU2 are connected to provide a high impedance.

In the test mode, the signal present on one data input line $MARD_{p,2...R}$ of the respective pair of data input lines $MARD_{p,2...}$, $\overline{MARD}_{p,2...R}$ is present in amplified form at the output of each of the remaining (R−1) read units RDU2.

The output stages OUTRD of the remaining (R−1) read units RDU2 are identical to the output stage OUTRD of the first read unit RDU1 of the respective memory array read unit MARD. Other gate and signal combinations can also be used, while retaining the overall logic of a memory array read unit MARD and/or of the individual read units RDU1, RDU2.

Figure 12:
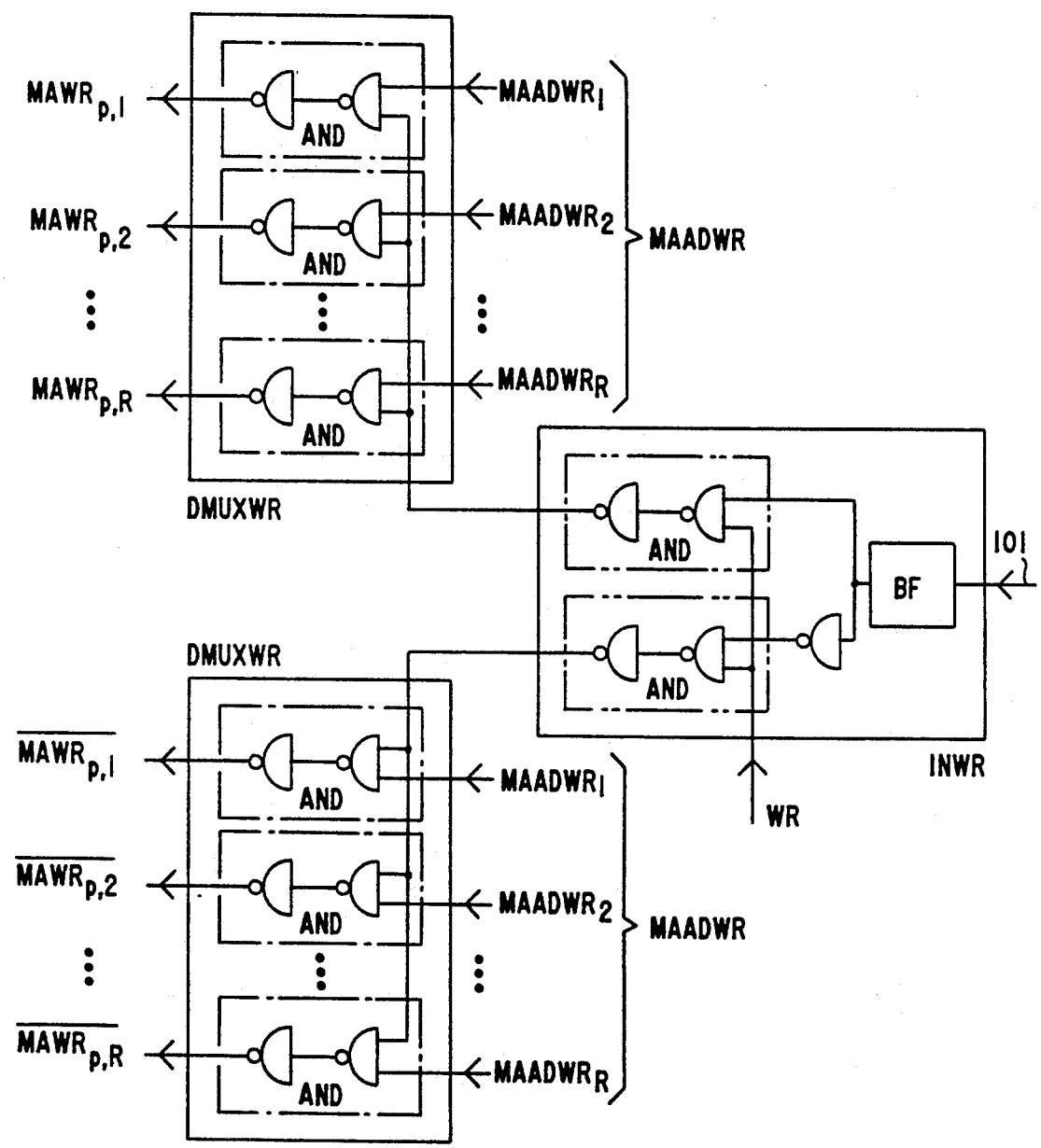

FIG. 12 shows one of the P memory array write units MAWR. The memory array write unit MAWR has a first input connected to one of the P I/O data lines I01 of the first type and a second input at which it receives the write control signal WR. it also contains inputs for the memory array write address bus MAADWR and outputs for the R pairs of data output lines $MAWR_{p,r}$, $\overline{MAWR}_{p,r}$.

In the normal operating mode, the unit forwards a data item to be written into the memory that is present on the respective I/O data line I01 of the first type, and a complementary data item as a function of the write control signal WR and of the memory array write address bus MAADWR, to the pair of data output lines $MAWR_{p,r}$, $\overline{MAWR}_{p,r}$ with respect to which one line of the I/O address bus IOAD and thus one line of the memory array write address bus MAADWR, is activated.

In the test mode, it forwards the data item present on the I/O data line I01 of the first type, and the data item thereto complementary, to all R pairs of the data output lines $MAWR_{p,r}$, $\overline{MAWR}_{p,r}$.

In the embodiment according to FIG. 12, the memory array write unit MAWR contains two demultiplexers DMUXWR and an input stage INWR. The input stage INWR is connected at the first input to the respective I/O data line I01 of the first type and receives the write control signal WR at the second input, as mentioned above. During the writing-in, the input stage INWR derives the same data item and its complementary data item from the data item to be written in that is present on the I/O data line I01 of the first type, and applies these derived data items to two outputs. Each demultiplexer DMUXWR contains R AND gates AND in each case having first and second inputs and one output. All of the first inputs of the AND gates AND of one demultiplexer DMUXWR are connected to one output of the input stage INWR and all of the first inputs of the AND gates AND of the other demultiplexer DMUXWR are connected to the other output of the input stage INWR. The second inputs of the AND gates AND of both demultiplexers DMUXWR are connected to the memory array write address bus MAADWR. The outputs of the demultiplexers DMUXWR are connected to the R pairs of data output lines $MAWR_{p,r}$, $\overline{MAWR}_{p,r}$.

The input stage INWR contains a buffer BF for the data item which is present on the I/O data line Iol of the first type. The input stage INWR contains two AND gates AND in each case having first and second inputs and one output which follow the buffer BF. In this configuration, the first input of one AND gate AND is connected to the output of the buffer BF, and the first input of the other AND gate AND is connected through an inverter to the output of the buffer BF. The second inputs of the AND gates AND receive the write control signal WR. In each case the AND gates AND are constructed as NAND gates having two inputs followed by an inverter.

FIG. 13 shows a second embodiment of the semiconductor memory according to the invention, in a global overview. Possible embodiments and developments according to the invention are shown in FIGS. 14 to 23. FIG. 13 differs from FIG. 2 only in the following points:

In addition to the input/output databus IODB, the group input/output units GPIO also have further I/O data lines, namely those of the aforementioned third type I03 which can be connected to the further auxiliary pads PDy which may be present. In addition, in contrast to the first embodiment of the semiconductor memory according to the invention that was described initially, the input/output databuses IODB contain N data line pairs for reading $IODB\text{-}RD_{1...N}$, $\overline{IODB\text{-}RD}_{1...N}$ and N data line pairs for writing $IODB\text{-}WR_{1...N}$, $\overline{IODB\text{-}WR}_{1...N}$, which can be operated unidirectionally in each case. N is an integral fraction of M. Alternatively, however, only N data line pairs for writing and reading, which can then be operated bidirectionally, can be provided as, for example, in the group databuses GPDB. The group input/output units GPIO also have a different structure in this embodiment than in the first embodiment.

In each group input/output unit GPIO, the (2.M) pairs (in the case of unidirectional data lines) or M pairs (in the case of bidirectional data lines) of data lines for writing and for reading are considered and treated in a purely organizational manner by the group input/output unit GPIO with respect to the group databus GPDB, in such a manner as if (2.N.Q) pairs (unidirectional) or (N.Q) pairs (bidirectional) of data lines of the group databus GPDB were available for writing and for reading. Thus, $M=N.Q$ is applicable. The text which follows in each case shows the case where unidirectional data lines are available. Accordingly, the index $m=1\ldots M$ that was used above will not be used for the data lines in the text which follows but it will be doubly indexed with $n=1\ldots N$ and $q=11\ldots Q$, assuming that q is the faster index and n is the slower index.

Correspondingly, the group address bus GPAD also contains Q group address signals $GPAD_1 \ldots Q$, one of which in each case is at a first logic state and the remaining one is at a second logic state, with $M=N.Q$ being applicable again.

Figure 14:
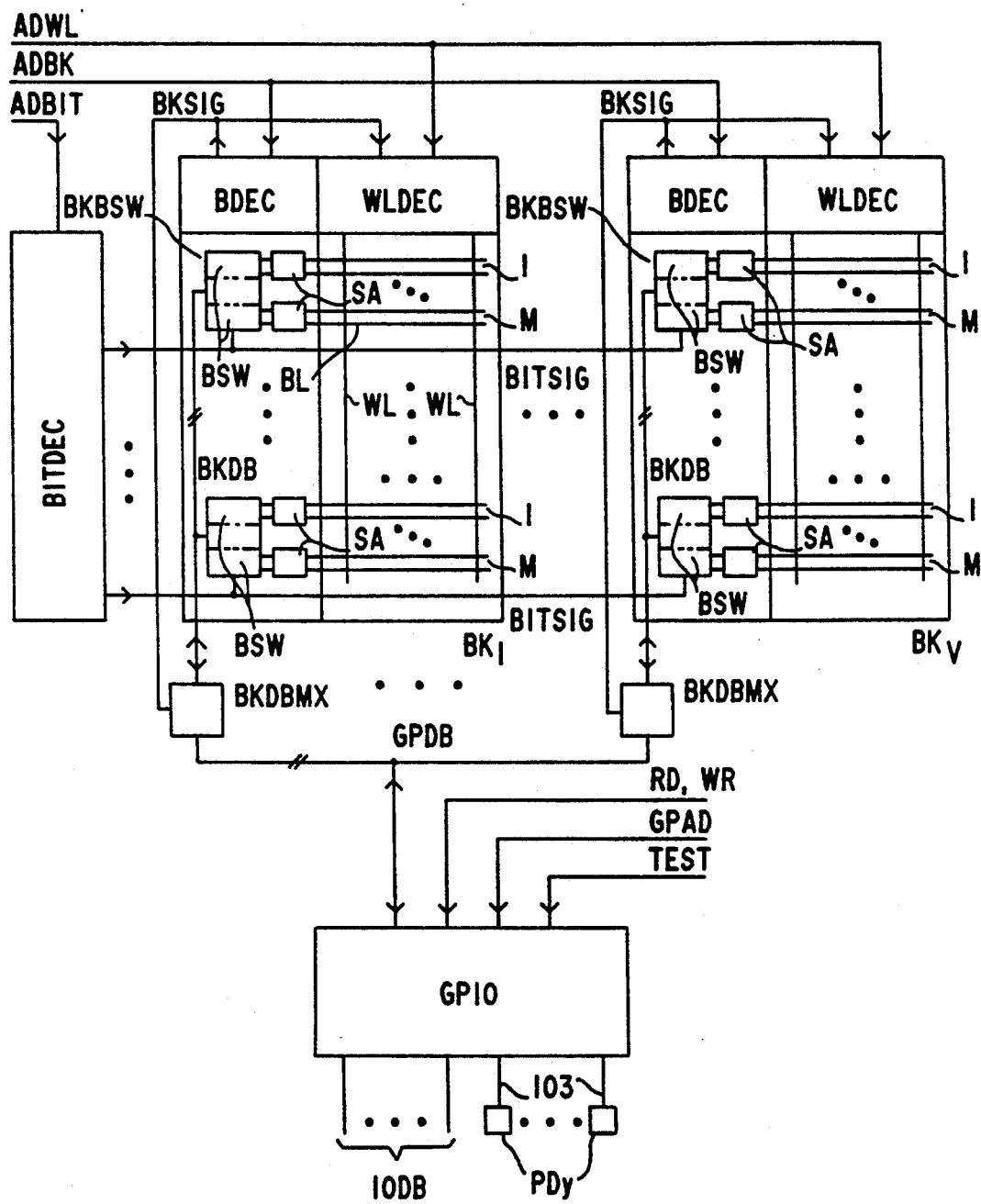

In a manner similar to FIG. 3 which illustrates the first embodiment of the invention, FIG. 14 shows a block group $GP_u$ of the semiconductor memory and the associated group input/output unit GPIO. The previous statements and the similarities to FIG. 3 make further relevant explanations unnecessary.

Figure 15:
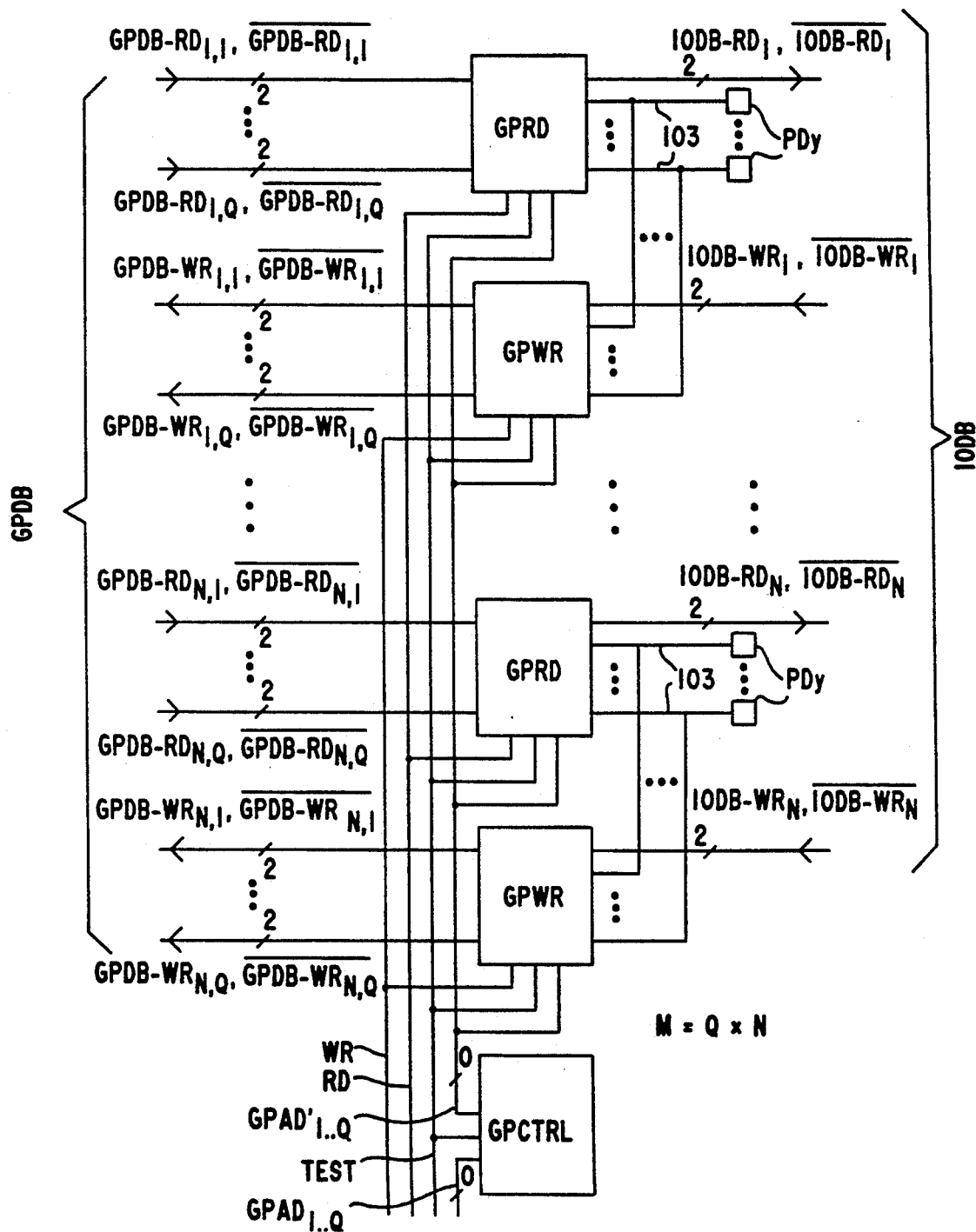

FIG. 15 shows a group input/output unit GPIO in a block diagram, which contains a group control circuit GPCTRL, N group write units GPWR and N group read units GPRD. The input of the group control circuit GPCTRL is connected to the Q group address signals $GPAD_1 \ldots Q$ and the test signal Test. It has outputs for Q group address output signals $GPAD'_1 \ldots Q$.

In the test mode, the first group address output signal $GPAD'_1$ is at a first logic level. The remaining group address signals $GPAD'_2 \ldots Q$ are at a second logic level which is complementary to the first logic level.

In the normal operating mode, the group address output signals $GPAD'_1 \ldots Q$ are at the logic states of the respective group address signals $GPAD_1 \ldots Q$.

Figure 16:
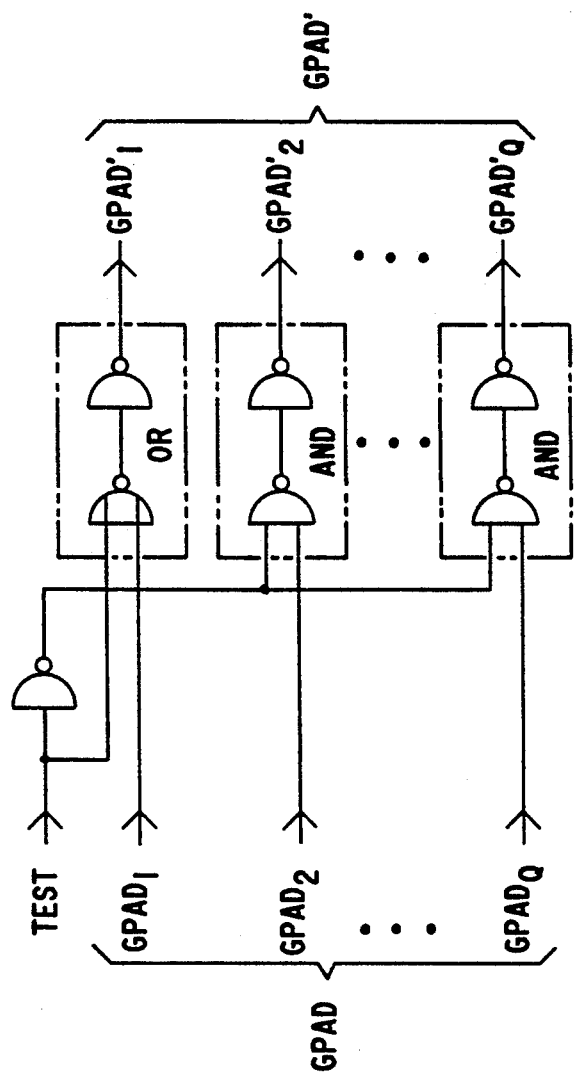

FIG. 16 shows the group control circuit GPCTRL, which contains an OR gate OR and (Q−1) AND gates AND in each case having two inputs. The first ($GPAD_1$) of the group address signals $GPAD_1 \ldots Q$ is present at one input of the OR gate OR. One of the remaining ($GPAD_2 \ldots Q$) group address signals $GPAD_1 \ldots Q$ in each case is present at one of the inputs of the AND gates AND. The test signal Test is present at the other input of the OR gate OR. A signal which is complementary to the test signal Test is present at the other inputs of the AND gates AND. The outputs of the OR gate OR and of the AND gates AND are the outputs of the group control circuit GPCTRL. The OR gate OR contains a NOR gate which has two inputs followed by an inverter. The AND gates AND each contain a NAND gate which has two inputs and is followed by an inverter.

Figure 17:
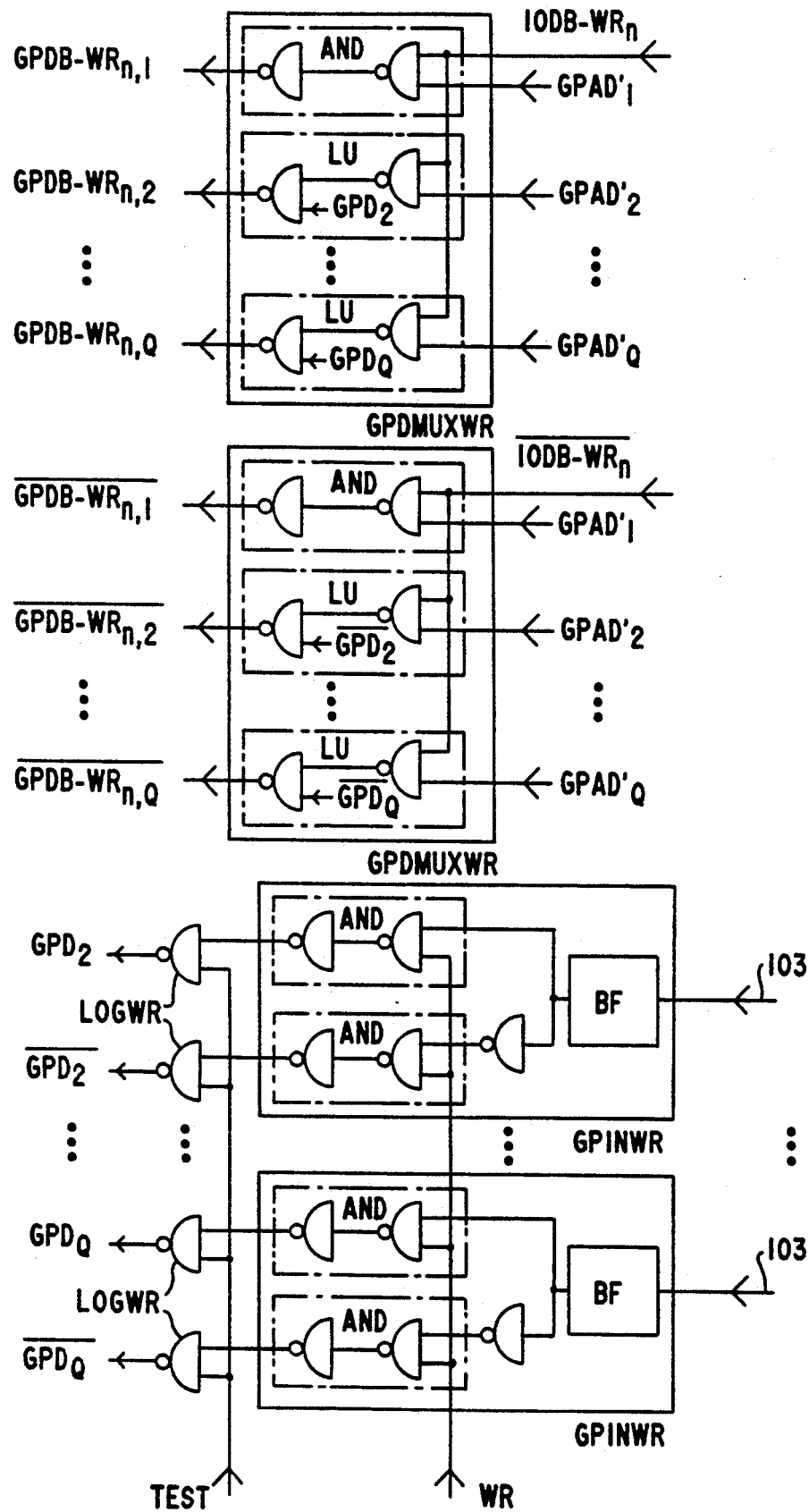

FIG. 17 shows one of the group write units GPWR. With respect to the index n ($_1 \ldots N$), it is assumed that this is the nth group write unit GPWR. It has a pair of inputs for a data line pair $IODB-WR_n$, $\overline{IODB-WR_n}$ of the input/output databus IODB, which is used for writing. The input of the group write unit GPWR is also connected to the group address output signals $GPAD'q$ of the group control circuit GPCTRL. It has (Q−1) group input stages GPINWR having one input each which in each case is connected to one of (Q−1) I/O lines I03 of the third type. It has a further input for the write control signal WR.

During writing-in, each group input stage GPINWR derives the same data item and its complementary data item from a data item which is to be written into the memory and is applied to it through the respective I/O data line I03 of the third type, and applies these derived data to two outputs. Each output of a group input stage GPINWR is followed by a logic circuit LOGWR having two inputs, one input of each logic circuit LOGWR is connected to the respective output of the group input stage GPINWR and its other input receives the test signal Test.

In the normal operating mode, a signal having the same logic level is present at the outputs $GPD_2$, $\overline{GPD}_2$ to $GPD_Q$, $\overline{GPD}_Q$ of both logic circuits LOGWR, whereas in the test mode, the derived complementary data item is present at the output $GPD_2, \ldots, Q$ of one logic circuit LOGWR and the derived data item is present at the output $\overline{GPD_2, \ldots, Q}$ of the other logic circuit LOGWR.

Each group write unit GPWR also contains two demultiplexers GPDNUXWR, each of which has Q inputs for the group address output signals $GPAD'q$ and a further input which is one of the two inputs of the pair of inputs for the respective data line pair $IODB-WR_n$, $\overline{IODB-WR_n}$ of the input/output databus IODB, that is provided for writing. In addition, each demultiplexer GPDMUXWR (Q−1) contains additional inputs, each of which is connected to the output $GPD_2, \ldots, Q$ of the respective one logic circuit LOGWR in one demultiplexer GPDMUXWR and each of which is connected to the output $\overline{GPD_2, \ldots, Q}$ of the respective other logic circuit LOGWR in the other demultiplexer GPDMUXWR. Each demultiplexer GPDMUXWR has Q outputs. The outputs of the demultiplexers GPDMUXWR are connected to Q pairs of data lines of the M pairs of data lines provided for writing of the group databus GPDB allocated to the respective group input/output unit GPIO.

During writing in the normal operating mode, each group write unit GPWR passes through the data present on the data line pair $IODB-WR_n$, $\overline{IODB-WR_n}$ of the input/output databus IODB connected to its input, to the two outputs with respect to which one of the group address signals $GPAD_q$, and thus its associated group address output signal $GPAD'_q$ of the group control circuit GPCTRL is activated. During writing in the test mode, each group write unit GPWR passes both the data present on the data line pair $IODB-WR_n$, $\overline{IODB-WR_n}$ of the input/output databus IODB connected to its input, and the data derived from the data of the I/O lines I03 of the third type, which are present at its group input stages GPINWR, to a respective output, and thus overall to a part N of the group databus GPDB. In the actual embodiment according to FIG. 17, each demultiplexer GPDMUXWR contains an AND gate AND and (Q−1) logic units LU. These each have an output which is one of the Q outputs of the respective demultiplexer GPDMUXWR. Each AND gate AND has first and second inputs and each logic unit LU has first, second and third inputs. The first inputs of the AND gate AND and of the logic units LU of each demultiplexer GPDMUXWR are connected to one further input of the respective demultiplexer GPDMUXWR. The second inputs of the AND gate AND and of the logic units LU of the demultiplexers GPDMUXWR in each case are connected to one of the Q inputs of the respective demultiplexer GPDMUXWR. The third inputs of the logic units LU of the demultiplexers GPDMUXWR are the additional (Q−1) inputs of the respective demultiplexer GPDMUXWR.

The AND gates AND in each case contain a NAND gate with the two inputs of the AND gate AND and an inverter following this NAND gate. The logic units LU in each case contain a first NAND gate having two inputs which are the first two inputs of the logic unit Lu. Each first NAND gate is associated with a second NAND gate also having two inputs. One of the inputs is connected to the output of the first NAND gate and the other of the inputs is the third input of the logic unit LU.

The group input stage GPINWR contains a buffer BF for temporary storage of the data item being present, through the respective data line I03 of the third type. The group input stage GPINWR contains two AND gates AND in each case having two inputs. One input of one AND gate AND is supplied with the data item being present on the respective data line I03 of the third type. One input of the other AND gate AND is supplied with the data item present on the respective data line I03 of the third type, in inverted form. The other inputs of the AND gates AND receive the write control signal.

Figure 18:
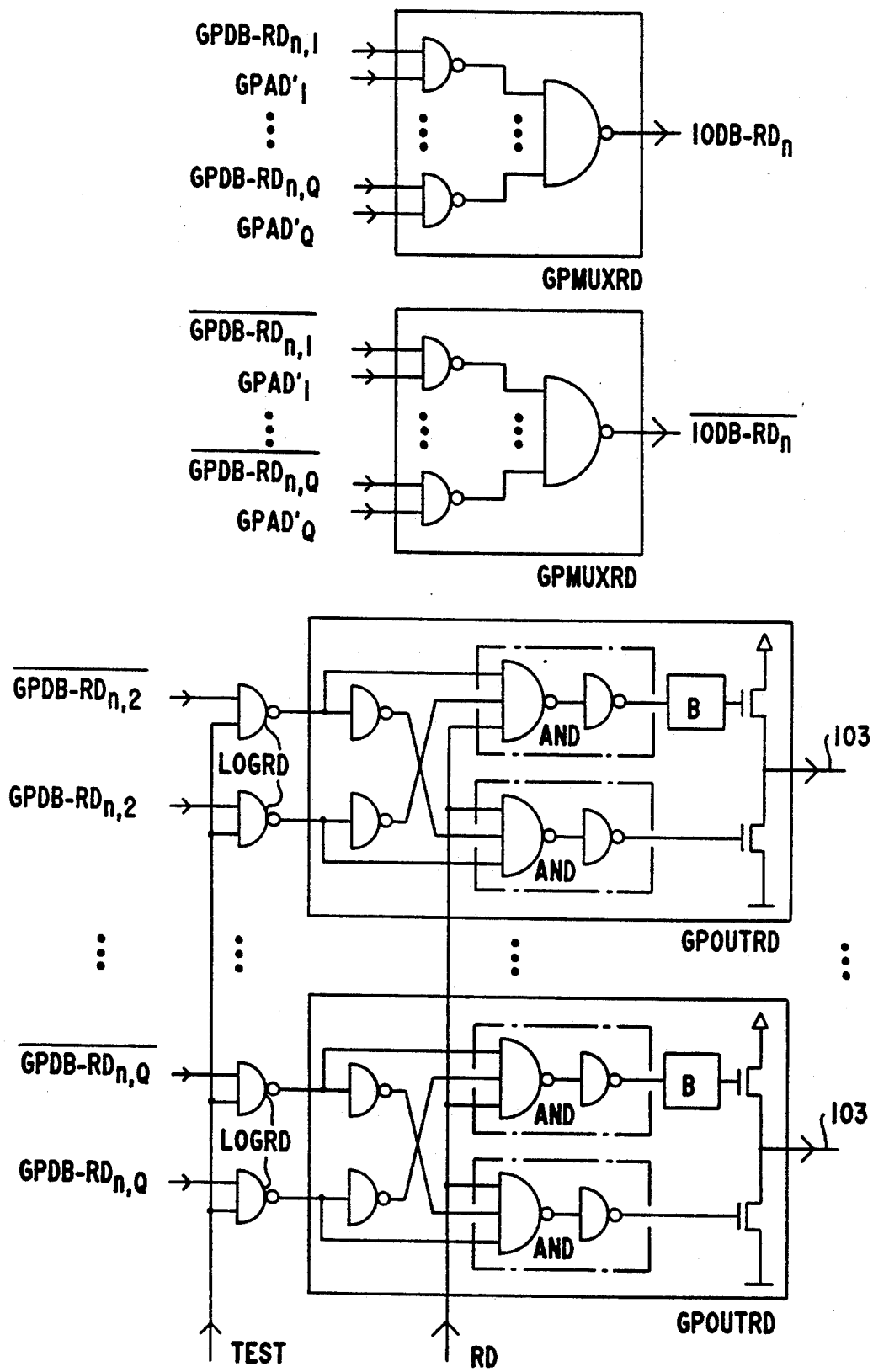

FIG. 18 shows one of the group read units GPRD. With respect to the index n=(1 ... N), it is again assumed that this is the nth group read unit GPRD. It has Q pairs of data inputs which are connected to a corresponding number of data line pairs GPDB-RD$_{n,q}$, $\overline{GPDB\text{-}RD}_{n,q}$ of the respective group databus GPDB, which are provided for reading. It also has address inputs for the group address output signals GPAD$'_q$ of the group control circuit GPCTRL. Each of the group address output signals GPAD$'_q$ in this case is associated with one of the Q pairs of data inputs. It also has inputs for the read control signal RD and for the test signal Test. A group read unit GPRD also has a pair of outputs for a data line pair IODB-RD$_n$, $\overline{IODB\text{-}RD}_n$ of the input/output databus IODB, which is used for reading. In addition, it has (Q−1) outputs which are connected to the I/O lines I03 of the third type.

In the normal operating mode, data of the pair of the Q pairs of data inputs having an associated address input which is at the first logic level, that is exhibited by one of the Q group address signals GPADQ and thus also by one of the Q group address output signals GPAD$'$q of the group control circuit GPCTRL, are switched through to the pair of outputs connected to one data line pair IODB-RD$_n$, $\overline{IODB\text{-}RD}_n$ of the input/output databus IODB.

In the test mode, data present at the first pair of data inputs are switched through to the pair of outputs connected to one data line pair IODB-RD$_n$, $\overline{IODB\text{-}RD}_n$ of the input/output databus IODB. In addition, the data present at the remaining (Q−1) data inputs are switched through to the (Q−1) outputs connected to the I/O data lines I03 of the third type in the test mode.

According to FIG. 18, a group read unit GPRD contains two multiplexers GPMUXRD, 2 (Q−1) logic units LOGRD and (Q−1) group output stages GPOUTRD. In each case each multiplexer GPMUXRD is connected to respective Q data lines GPDB-RD$_{n,q}$ and $\overline{GPDB\text{-}RD}_{n,q}$ of all of the Q data line pairs GPDB-RD$_{n,1}$ ... Q' $\overline{GPDB\text{-}RD}_{n,1}$ ... Q provided for reading, of a part N of the group databus GPDB at the input. The databus is connected to the address inputs of the group read unit GPRD for the group address output signals GPAD$'_q$ of the group control circuit GPCTRL at the input. Each multiplexer has an output which is an output of the group read unit GPRD that is connected to a line IODB-RD$_n$ or $\overline{IODB\text{-}RD}_n$ of the lines of the data line pair IODB-RD$_n$, $\overline{ODB\text{-}RD}_n$ of the input/output databus IODB.

In the normal operating mode, the data item, which is present on the respective data line of such a pair of the Q data line pairs having an associated group address output signal GPAD$'_q$ which is at the first logic level, is switched through to the output connected to the input/output databus IODB.

In the test mode, the data item present on the respective data line GPDB-RD$_{n,1}$ or $\overline{GPDB\text{-}RD}_{n,1}$ of the first pair GPDB-RD$_{n,1}$, $\overline{GPDB\text{-}RD}_{n,1}$ of data lines of the part N of the group databus GPDB is switched through to the respective output.

In FIG. 18, each logic unit LOGRD is a NAND gate having two inputs. In each case two logic units LOGRD are functionally combined in such a manner that their first inputs are connected to a respective data line GPDB-RD$_{n,2}$, ..., Q or $\overline{GPDB\text{-}RD}_{n,2}$, ..., Q of one of the (Q−1) data line pairs GPDB-RD$_{n,2}$ ... Q' $\overline{GPDB\text{-}RD}_{n,2}$ ... Q' provided for reading, of the part N of the group databus GPDB. The second inputs of each logic unit LOGRD are connected to the test signal Test. In each case the outputs of two logic units LOGRD are simultaneously inputs of the group output stage GPOUTRD following it.

The group output stage GPOUTRD contains two AND gates AND, having first, second and third inputs each, and a final stage following the two AND gates AND. The first inputs of the AND gates AND are connected through an inverter to the output of a respective logic unit LOGRD. The second inputs of the AND gates AND are connected to the output of the other respective logic unit LOGRD. The third inputs receive the read control signal RD. The output of the final stage is the output of the group output stage GPOUTRD which is simultaneously one of the (Q−1) outputs of the group read unit GPRD.

As is shown diagrammatically in FIG. 18, the final stage can also contain a boost configuration B for boosting the High level of the applied signal in order to prevent voltage losses at the output of the group output stage GPOUTRD. This measure is known per se (for example as a "word line boost circuit"). This correspondingly also applies with respect to the final stages of the output stages OUTRD, shown in FIGS. 11 and 21.

Figure 19B:
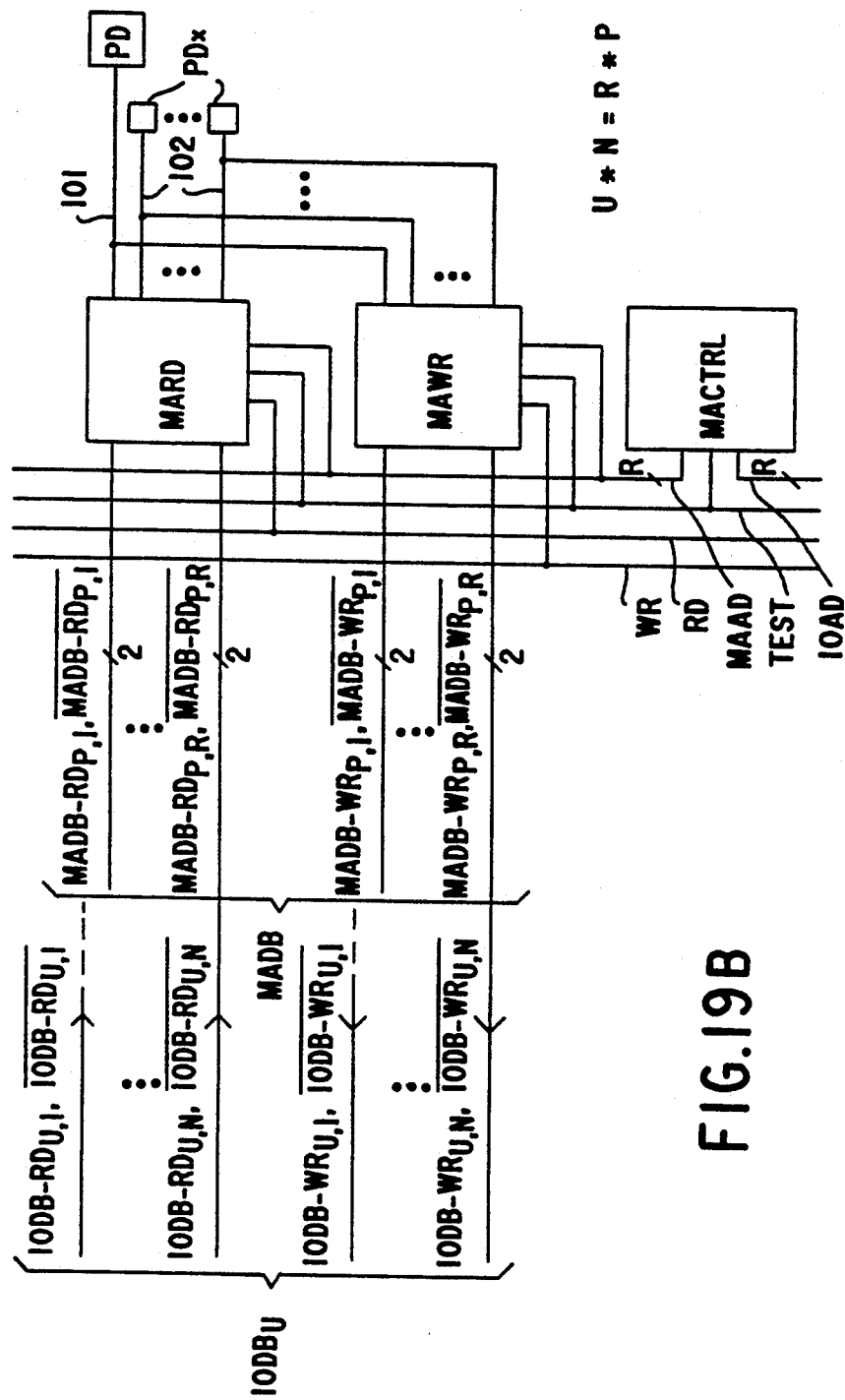

Referring to what has been described above, the following picture is obtained at the bus outputs of all of the group input/output units GPIO (FIG. 13 should also be compared in this respect):

Each block group GP$_u$ is associated with an input/output databus IODB in each case having N pairs of data lines for reading and/or writing: IODB-RD$_1$ ... $_N$, $\overline{IODB\text{-}RD}_1$ ... $_N$ and IODB-WR$_1$ ... $_N$, $\overline{IODB\text{-}WR}_1$ ... $_N$ (unidirectional operation) or IODB$_1$ ... $_N$, $\overline{IODB}_1$ ... $_N$ (bidirectional operation), respectively. According to FIG. 13, the input of the memory array unit MAIO is connected to U such buses, so that the total number of data lines of these buses would have to be indexed overall as follows, considering it as a single bus:

IODB$_{1...U,1...N}$/$\overline{\text{IODB}}_{1...U,1...N}$ (for bidirectional operation) or IODB-RD$_{1...U,1...N}$/ $\overline{\text{IODB-RD}}_{1...U,1...N}$, IODB-WR$_{1...U,1...N}$, $\overline{\text{IODB-WR}}_{1...U,1...N}$ (for unidirectional operation), with u=1 ... U as the index, which is slower than n=1 ... N. As can be seen from this, U.N write data lines and U.N read data lines are available for further processing (considering unidirectional operation. This applies correspondingly to bidirectional operation). These can now be mentally provided with other indexes overall and the new correlations thus produced can be designated in their entirety as the memory array databus MADB, having pairs of write data lines which have the indexing MADB-WR$_{1...P,1...R}$ and $\overline{\text{MADB-WR}}_{1...P,1...R}$ and the pairs of read data lines thereof which have the indexing MADB-RD$_{1...P,1...R}$ and $\overline{\text{MADB-RD}}_{1...P,1...R}$' with the following assumptions being applicable: p=1 ... P, r=1 ... R, wherein index p is slower than index r. In addition, U.N=P.R applies. The above statements apply to unidirectional operation (which is shown in FIG. 19 and the following figures). However, one of skill can easily amend these for bidirectional operation.

FIG. 19 shows the memory array input/output unit MAIO. As is shown in FIG. 13, this memory array input/output unit MAIO is connected to the U input/output databuses IODB with the above-mentioned data lines, that are indicated as IODB$_{1...U}$ on the extreme left in FIG. 19. However, for the explanation which follows, these U buses will be "reorganized" as described above into P memory array databuses MADB with the following indexing of the associated pairs of write and read data lines: MADBWRP WR$_{p,r}$, $\overline{\text{MADB-WR}}_{p,r}$; MADB-RD$_{p,r}$, $\overline{\text{MADB-RD}}_{p,r}$. This, too, is indicated in FIG. 19.

In the text which follows, FIG. 19 will be explained in greater detail: at the extreme left on the outside, the organizational structure according to the division into U input/output databuses IODBU is shown. Adjacent and to the right, the organizational structure according to the division into P memory array databuses MADB is shown.

The memory array input/output unit MAIO contains P memory array read units MARD in each case having R read units (RDUL; RDU2 shown in FIG. 21), P memory array write units MAWR which are in each case allocated to one of the P memory array read units MARD and which in each case contain R write units (WRUL; WRU2 shown in FIG. 23), and a memory array control circuit MACTRL.

Each memory array read unit MARD has the R pairs of data input lines MADB-RD$_{p,r}$, $\overline{\text{MADB-RD}}_{p,r}$ of one of the P memory array databuses MADB. Each memory array write unit MAWR has the R pairs of data output lines MADB-WR$_{p,r}$, $\overline{\text{MADB-WR}}_{p,r}$ of the memory array databus MADB. Each memory array read unit MARD is connected at one output to one of the I/O data lines I01 of the first type and to one data input of its associated memory array write unit MAWR. Each memory array read unit MARD also has outputs for (R−1) I/O data lines I02 of the second type. All of the memory array read units MARD jointly receive the read control signal RD. All of the memory array write units MAWR jointly receive the write control signal WR. All of the memory array read units MARD, all of the memory array write units MAWR and the memory array control circuit MACTRL jointly receive the test signal Test. All of the memory array read units MARD and all of the memory array write units MAWR are jointly connected to a memory array address bus MAAD. Thus, all of the memory array read units MARD and all of the memory array write units MAWR in each case can be operated jointly.

The memory array control circuit MACTRL is a circuit for generating the memory array address bus MAAD from the I/O address bus IOAD under control of the test signal Test, with the memory array address bus MAAD including R address lines MAAD$_{1...R}$.

Figure 20:
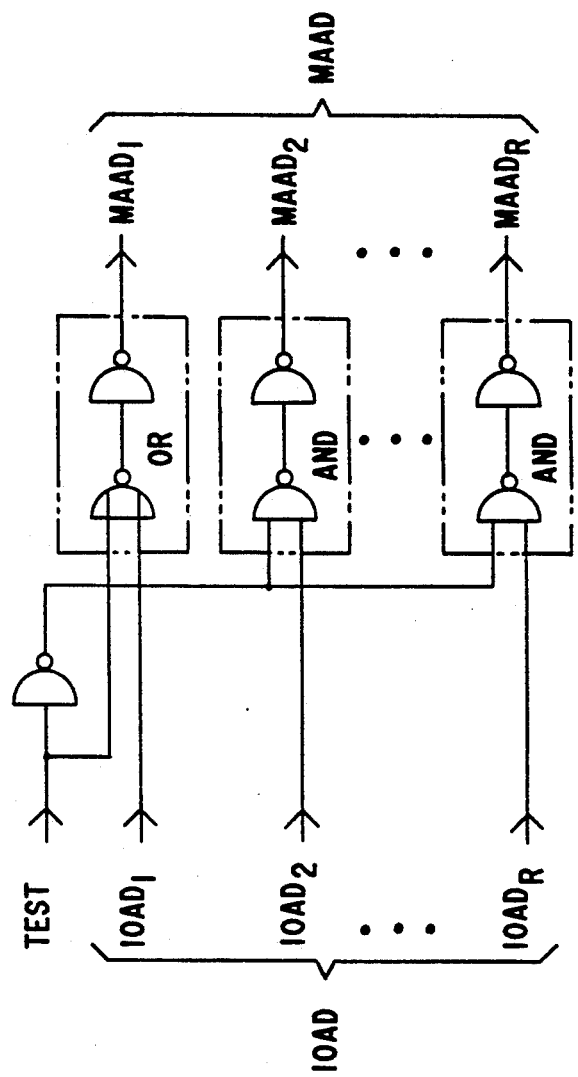

FIG. 20 shows the memory array control circuit MACTRL, which is a decoder that switches through the I/O address bus IOAD to the memory array address bus MAAD in the normal operating mode. In the test mode, a first line MAAD$_1$ of the memory array address bus MAAD is at a constant logic level due to the test signal Test. In contrast, the remaining (R−1) lines of the memory array address bus MAAD are at a logic level which is complementary to the logic level of the first line MAAD$_1$ and which is also constant.

The memory array control circuit MACTRL has an OR gate OR having two inputs and one output, with one input receiving the test signal Test, the other input being connected to a first line IOAD$_1$ of the I/O address bus IOAD and the output being connected to the first line MAAD$_1$ of the memory array address bus MAAD. It also has (R−1) AND gates AND in each case having two inputs and one output. In each case one input receives a signal which is complementary to the test signal Test. Each of the other inputs is connected to one of the remaining (R−1) lines of the I/O address bus IOAD. Each of the outputs is connected to one of the remaining (R−1) lines MAAD2 ... R of the memory array address bus MAAD.

In the embodiment according to FIG. 20, the OR gate OR contains a NOR gate followed by an inverter. The AND gates AND each contain a NAND gate followed by an inverter.

Figure 21:
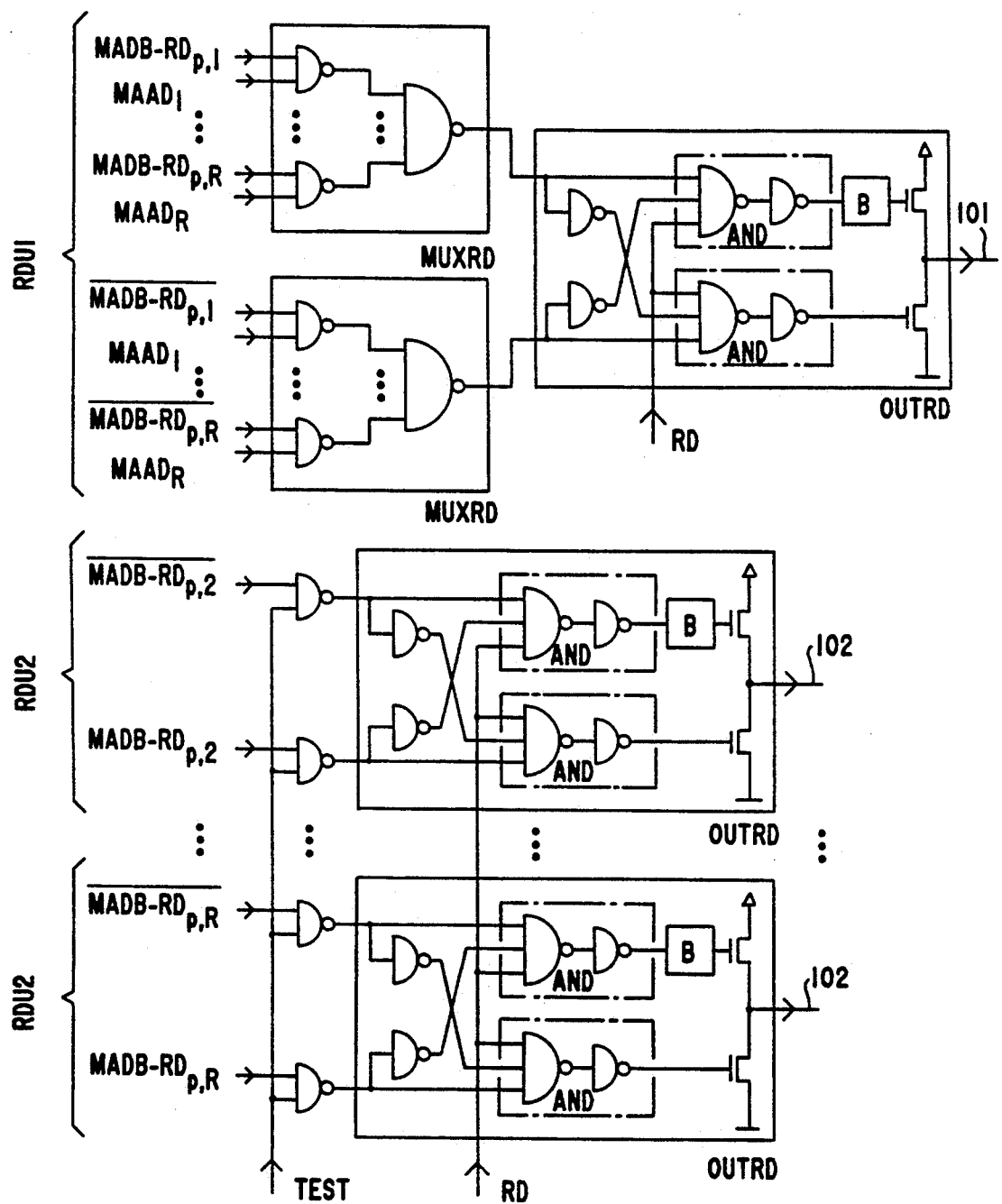

FIG. 21 shows a memory array read unit MARD having a first read unit RDUL and (R−1) second read units RDU2, two of which are shown while the remaining (R−3) read units RDU2 are indicated by dots. The first read unit RDUL contains two multiplexers MUXRD and an output stage OUTRD. Each multiplexer MUXRD has R first inputs in each case for one respective data input line MADB-RD$_{p,r}$ and $\overline{\text{MADB-RD}}_{p,r}$ of the R pairs of data input lines MADB-RD$_{p,r}$, $\overline{\text{MADB-RD}}_{p,r}$, and R second inputs for the memory array address bus MAAD. The lines of the latter are assigned to the data input lines MADB-RD$_{p,r}$ and $\overline{\text{MADB-RD}}_{p,r}$. It also has an output.

Of the data input lines MADB-RD$_{p,r}$ or $\overline{\text{MADB-RD}}_{p,r}$, the one having an associated line of the memory array address bus MAAD that has an activated electrical state, is switched through to the respective output in both multiplexers MUXRD in the normal operating mode.

Of the data input lines MADB-RD$_{p,r}$ or $\overline{\text{MADB-RD}}_{p,r}$, the one which is associated with the first line MAAD$_1$ of the memory array address bus MAAD, with its constant logic level, is switched through to the output in both multiplexers MUXRD in the test mode.

The output stage OUTRD is a driver circuit, having an output which is the output of the total memory array read unit MARD connected to one of the I/O data lines Io1 of the first type, which has the signal present at the output of one multiplexer MUXRD in amplified form.

In FIG. 21, each multiplexer MUXRD of the first read unit RDUL has R NAND gates in each case having two inputs. One input thereof in each case is one of the R first inputs of the multiplexer MUXRD and the other input thereof in each case is one of the R second inputs of the multiplexer MUXRD. Each multiplexer MUXRD of the first read unit RDUL has an additional NAND gate having R inputs which in each case are connected to an output of the R NAND gates. The output of the additional NAND gate is the output of the respective multiplexer MUXRD of the first read unit RDUL.

The output stage OUTRD has two AND gates AND in each case having first, second and third inputs and one output. The respective first input of each AND gate AND is connected to the output of one multiplexer MUXRD in each case. The respective second input of each AND gate AND is connected to the output of the other multiplexer MUXRD through an inverter in each case. The third inputs of the AND gates AND receive the read control signal RD. The output stage OUTRD has a final stage, the input of which is connected to the outputs of the AND gates AND and the output of which is the output of the output stage OUTRD and of the first read unit RDUL. The AND gates AND are constructed as NAND gates followed by an inverter. The final stage can also contain a boost configuration B, as was already described with respect to FIG. 18.

Each of the remaining (R−1) read units RDU2 contains an output stage OUTRD having two inputs and an output. The output is one of the outputs for the (R−1) I/O data lines I02 of the second type. Each input of an output stage OUTRD is preceded by a NAND gate having two inputs. In each case the first input thereof is connected to one of the two respective data input lines $MADB\text{-}RD_{p,2\ldots R}$ or $\overline{MADB\text{-}RD}_{p,2\ldots R}$ of one of the R pairs of data input lines $MADB\text{-}RD_{p,r}$, $\overline{MADB\text{-}RD}_{p,r}$ with the exception of the first pair $MADB\text{-}RD_{p,1}$, $\overline{MADB\text{-}RD}_{p,1}$ of these R pairs. Their second inputs receive the test signal Test.

In the normal operating mode, the outputs of the remaining (R−1) read units (RDU2) are connected to provide a high impedance.

In the test mode, the signal present on one data input line $MADB\text{-}RD_{p,2\ldots R}$ of the respective pair of data input lines $MADB\text{-}RD_{p,2\ldots R}$, $\overline{MADB\text{-}RD}_{p,2\ldots R}$ is present in amplified form at the output of each of the remaining (R−1) read units (RDU2).

The output stages OUTRD of the remaining (R−1) read units RDU2 are identical to the output stage OUTRD of the first read unit RDUL of the respective memory array read unit MARD.

Figure 22:
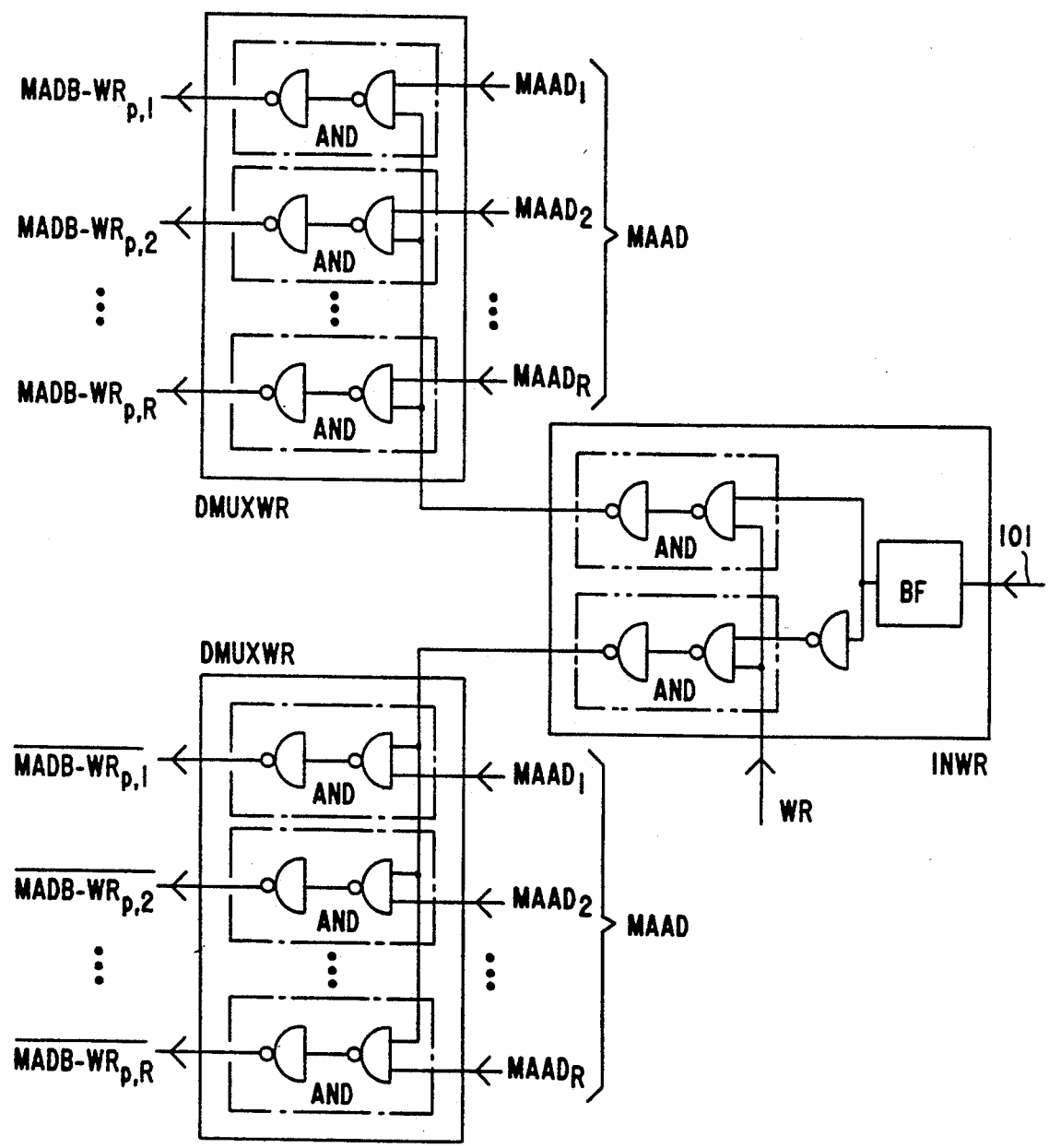

FIG. 22 shows a first embodiment of a memory array write unit MAWR for the second embodiment of the semiconductor memory according to the invention. It is identical to the memory array write unit MAWR shown in FIG. 12 with respect to the first embodiment of the semiconductor memory according to the invention. A more detailed description of FIG. 22 is therefore omitted and reference is made to the description of FIG. 12. only the following is still pointed out: since a single memory array address bus MAAD is used for writing and for reading in the second embodiment of the semiconductor memory according to the invention (in contrast to the first embodiment of the semiconductor memory according to the invention), this was correspondingly taken into consideration in FIG. 22 in the reference symbol MAAD. Similarly, the nomenclature of the data output lines $MADB\text{-}WR_{p,r}$, $\overline{MADB\text{-}WR}_{p,r}$ of the memory array databuses MADB was matched to the nomenclature used in the second embodiment of the semiconductor memory according to the invention.

In this embodiment of a memory array write unit MAWR, a data item present on the I/O data line I01 of the first type is present on all respective one R data output lines $MADB\text{-}WR_{p,1\ldots R}$ during writing in the test mode, and is present in inverted form on all respective other R data output lines $\overline{MADB\text{-}WR}_{p,1\ldots R}$, so that this data item is written simultaneously into R of the total number of U.N. memory cells MC.

Figure 23:
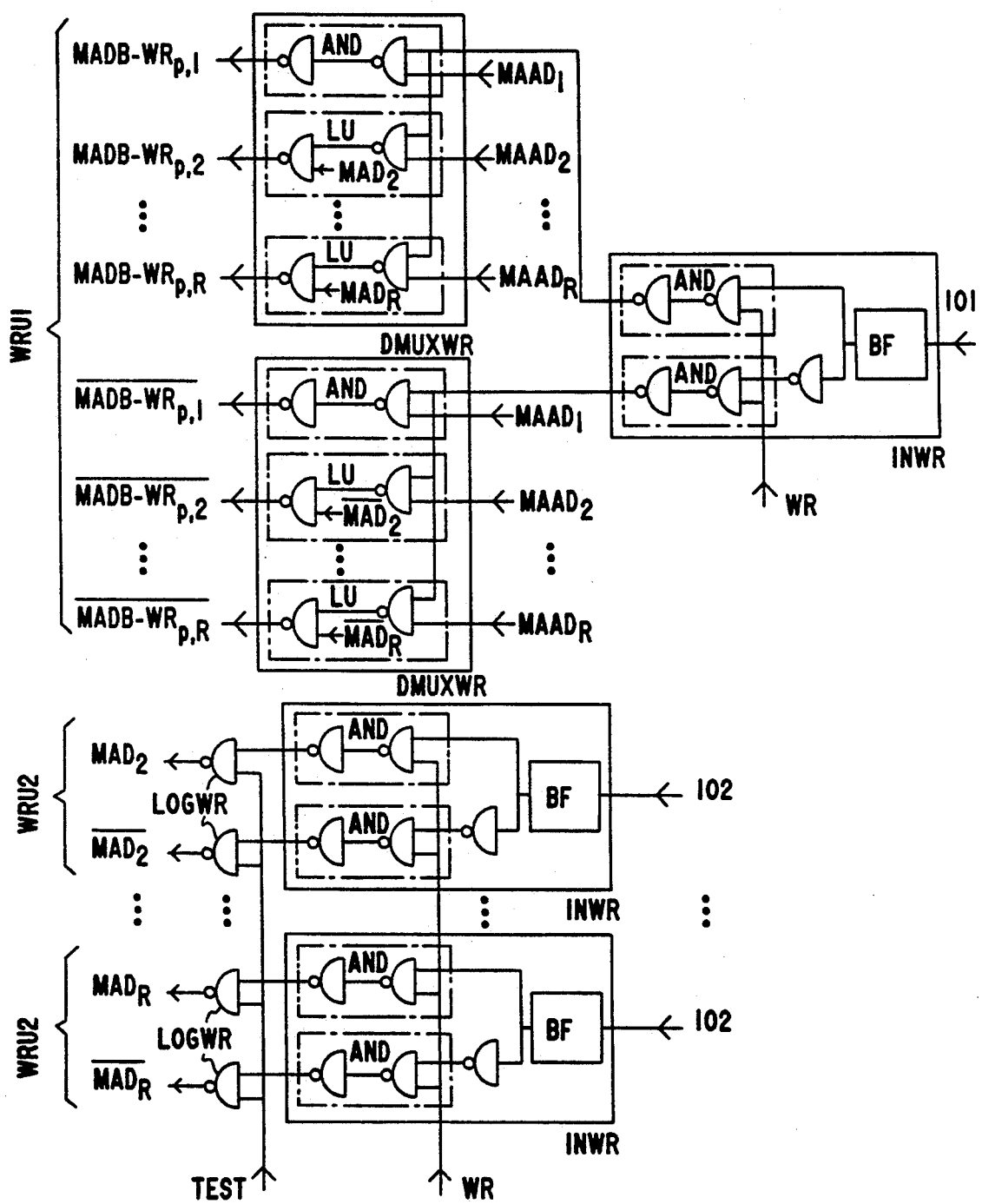

FIG. 23 shows a second embodiment of a memory array write unit MAWR having circuitry which is largely of the same structure as the group write unit GPWR that was already described (see the description of FIG. 17). Nevertheless, FIG. 23 is described in detail below because of the different nomenclature in the data lines and because of the existence of an input stage INWR which is added as compared with the group write unit GPWR: Each of the P memory array write units MAWR is connected at a first input to one of the P I/O data lines I01 of the first type. In each case it is connected to one of the I/O data lines I02 of the second type at further (R−1) first inputs. A second input receives the write control signal WR. Each memory array write unit MAWR also contains third inputs for the memory array address bus MAAD and outputs for the R pairs of data output lines $MADB\text{-}WR_{p,r}$, $\overline{MADB\text{-}WR}_{p,r}$ of one of the memory array databuses MADB.

In the normal operating mode, each memory array write unit MAWR forwards a data item to be written into the memory that is present on the respective I/O data line I01 of the first type, and its complementary data item, as a function of the write control signal WR and of the memory array address bus MAAD, to the pair of data output lines $MADB\text{-}WR_{p,r}$, $\overline{MADB\text{-}WR}_{p,r}$ with respect to which one line of the I/O address bus IOAD, and thus one line of the memory array address bus MAAD, is activated.

In the test mode, on one hand, it forwards the data item on the I/O data line I01 of the first type and its complementary data item to the first pair $MADB\text{-}WR_{p,1}$, $\overline{MADB\text{-}WR}_{p,1}$ of the R pairs of data output lines $MADB\text{-}WR_{p,r}$, $\overline{MADB\text{-}WR}_{p,r}$. On the other hand, it forwards data present on the further (R−1) first inputs and its complementary data item in each case to a respective pair $MADB\text{-}WR_{p,2,\ldots,R}$, $\overline{MADB\text{-}WR}_{p,2,\ldots,R}$ of the remaining (R−1) pairs of data output lines $MADB\text{-}WR_{p,2\ldots R}$, $\overline{MADB\text{-}WR}_{p,2\ldots R}$ of the R pairs of data output lines $MADB\text{-}WR_{p,r}$, $\overline{MADB\text{-}WR}_{p,r}$.

In order to implement this function, the memory array write unit MAWR according to FIG. 23 contains two demultiplexers DMUXWR and R input stages INWR. The first one of the input stages (INWR) is connected at a first input to the I/O data lines I01 of the first type, which receives a data item to be written in during writing-in. The remaining (R−1) input stages INWR are connected at a respective first input to a respective I/O data line I02 of the second type, which receives a respective data item to be written in during writing-in. Each input stage INWR receives the write control signal WR at a second input. Each input stage INWR has two outputs. At one output, the data item present at its first input is present when the write control signal WR is activated. At the other output, the data item complementary to this data item is present when the write control signal WR is activated. In each of the (R−1) remaining input stages INWR, the two outputs in each case are followed by a logic circuit LOGWR having two inputs and one respective output $MAD_{2,...,R}$ and $\overline{MAD_{2,...,R}}$, wherein one input thereof is connected to the respective one of the two outputs of the input stage INWR and the other input thereof receives the test signal Test.

In the normal operating mode, a signal at a mutually identical logic level is present at the respective outputs $MAD_{2,...,R}$ and $\overline{MAD_{2,...,R}}$ of all of the logic circuits LOGWR following the (R−1) remaining input stages INWR whereas, in the test mode, the respective complementary data item is present at the output $MAD_{2,...,R}$ of the one logic circuit LOGWR with respect to each of the (R−1) remaining input stages INWR, and the respective data item to be written in is present at the output $\overline{MAD_{2,...,R}}$ of the other logic circuit LOGWR.

Each demultiplexer DMUXWR contains an AND gate AND having first and second inputs, and (R−1) logic units Lu having first, second and third inputs and R outputs. In the one demultiplexer DMUXWR, the first input of the AND gate AND and the first inputs of the logic units LU are connected to the one output of the first input stage INWR. In the other demultiplexer DMUXWR, the first input of the AND gate AND and the first inputs of the logic units LU are connected to the other output of the first input stage INWR. In the two demultiplexers DMUXWR, the second inputs of the AND gates AND and the second inputs of the logic units LU are connected to a respective line MAADR of the memory array address bus MAAD. In the one demultiplexer DMUXWR, the third inputs of the logic units LU are connected to the output $MAD_{2,...,R}$ of the one logic circuits LOGWR following a respective one of the remaining (R−1) input stages INWR. In the other demultiplexer DMUXWR, the third inputs of the logic units LU are connected to the output $\overline{MAD_{2,...,R}}$ of the other logic circuit LOGWR following a respective one of the remaining (R−1) input stages INWR. Each demultiplexer DMUXWR has R outputs which, overall, are the outputs of the memory array write unit MAWR.

In FIG. 23, each input stage INWR contains a buffer BF for the data item present on a respective I/O data line I01 or I02 of the respective type. It contains two AND gates AND in each case having two inputs and one output, which follow the buffer BF. The first input of one AND gate is connected to an output of the buffer BF and the first input of the other AND gate AND is connected through an inverter to the output of the buffer BF. The second inputs of the AND gates AND receive the write control signal WR.

The AND gates AND in each case contain a NAND gate having two inputs and being followed by an inverter.

Figure 24:
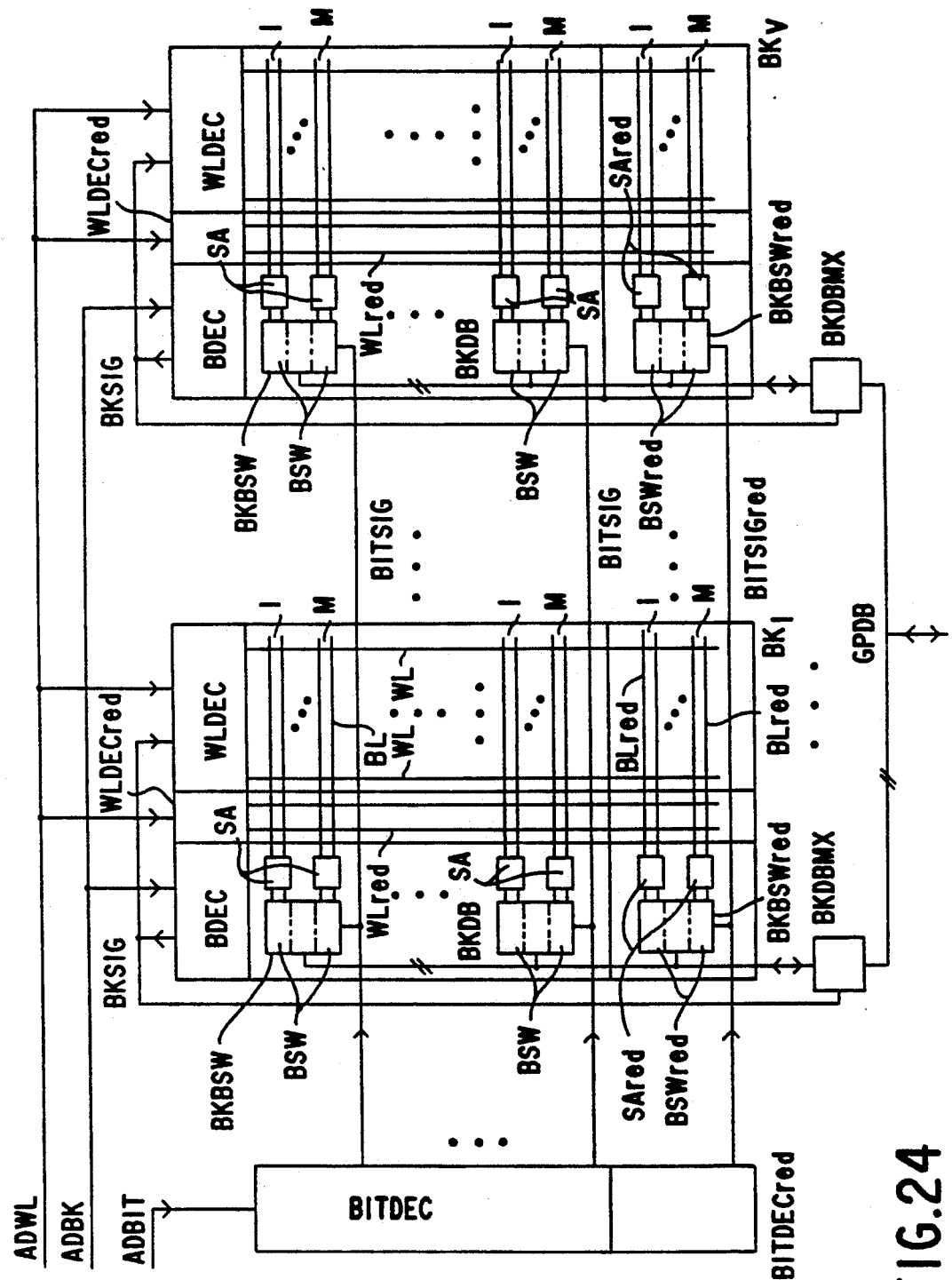
FIG. 24 is a block circuit diagram showing a combination of further advantageous embodiments.

FIG. 24 shows a combination of two further embodiments of the semiconductor memory with a parallel test device, but only partially and as far as is necessary for representing the embodiments.

In one further embodiment, each of the memory blocks $BK_1 ... V$ of a block group $GP_u$ of conventional semiconductor memories contains previously known further word lines with memory cells, namely so-called redundant word lines WLred with redundant memory cells MCred. The redundant word lines WLred are associated with redundant word line decoders WLDECred which are also supplied with the word line addresses ADWL. They are used in a known manner to replace defective (but all still operative) memory cells MC along a normal word line WL with the redundant memory cells MCred along one of the redundant word lines WLred (redundancy case), so that, in the redundancy case, instead of a word line WL with the defective memory cells MC being selected, a corresponding redundant word line WLred and the associated redundant memory cells Mcred are selected. In this configuration, the redundant memory cells MCred can be connected through the pairs of bit lines BL associated with the replaced memory cells MC, the read amplifiers SE and the bit switch blocks BKBSW to the corresponding lines of the respective block databus BKDB.

The other further embodiment, which is also shown in FIG. 24, contains for each memory block $BK_y$ (at least) one group of M pairs of redundant bit lines BLred with redundant memory cells MCred, M redundant read amplifiers SAred and a redundant bit switch block BKBSWred and a redundancy bit group decoder BITDECred. In the redundancy case, defective memory cells MC along a group of M pairs of bit lines BL (and the operative memory cells MC along the same pairs of bit lines BL) can thus be replaced with the memory cells MCred along the group of M pairs of redundant bit lines BLred. In this configuration, the group of M pairs of redundant bit lines BLred is selected through the redundancy read amplifiers SAred, through the redundant bit switch block BKBSWred, through the block selection signal BKSIG of the block decoder BDEC of the memory block $BK_y$ to be selected and through a redundant bit group selection signal BITSIGred, associated with the redundant bit switch block BKBSWred, of the redundancy bit group decoder BITDECred. The M pairs of redundant bit lines BLred in this configuration can be connected through the redundancy read amplifiers SAred and the redundancy bit switch block BKBSWred to the lines of the group databus GPDB.

As was already explained initially, a manufacturer of known semiconductor memories heretofore could not use known parallel test methods for permanently replacing defective memory cells MC with redundant memory cells MCred, since the known parallel test methods are not capable of conveying to the manufacturer any information on the position of the defective memory cells or at least of a group of defective memory cells. The manufacturer must therefore always carry out normal individual tests, determine the positions of all of the defective memory cells during these tests (through their addresses) and supply this information to an automatic repair device which then carries out the redundancy process through further means and known algorithms. In other words, it replaces memory cells MC that are detected as defective with redundant memory cells MCred.

However, in this first embodiment the present invention makes it possible to find the position of a complete group of M memory cells MC, of which at least one memory cell MC is defective. This is done through the data values of the addresses ADR applied from the outside, the identification (through an automatic testing device) of the I/O data input/output lines I01, I02 on which the fault is found, and through a correlation plan, that is known to the memory manufacturer, between the externally applicable addresses ADR, the I/O data input/output lines I01, I02 and the individual groups of memory cells MC. In addition, in the second embodiment the additional use of the I/O data input/output lines I03 of the third type also makes it possible to identify each individual defective memory cell MC, since even more I/O data input/output lines are available for fault detection (the total number of I/O data input/output lines IO1, IO2, IO3=M.U).

If the further embodiments shown in FIG. 24 now have parallel test devices PT in accordance with one of the first two embodiments of the semiconductor memory, these make it possible for the first time to test a semiconductor memory automatically, using the parallel test method, by means of a computer-controlled automatic testing and repair device (with correspondingly large savings in time) and subsequently to replace the defective memory cells MC or the memory cell groups, which contain at least one defective memory cell MC, with redundant memory cells MCred or memory cell groups along redundant word lines WLred or bit lines BLred.

This method according to the invention is now carried out as follows: firstly, all of the memory cells MC of the semiconductor memory that are present in chip form (in most cases still on the wafer) are tested in the test mode (described above), i.e. in each case several groups of M memory cells MC are tested in parallel with one another. In each memory cycle in which at least one fault is detected by the automatic testing device on any one of the I/O data input/output lines IO1, IO2 and possibly IO3, or on the (auxiliary) pads PD, PDx and possibly PDy connected thereto, this device "notes" the currently applied address signals ADR and the I/O data input/output line(s) on which the fault occurred or on which the faults occurred, and uses this information to identify the defective memory cell group(s) or memory cell(s) through the above-mentioned correlation plan which is stored, for example, in the automatic testing device. The data thus obtained are stored in the automatic testing device and/or the associated computer.

Once the entire semiconductor memory has been tested, the identification data and the correlation plan are supplied to the automatic repair device which, while using the identification data of the correlation plan, known algorithms and further means that are known per se, replaces the word lines WL and/or groups of pairs of bit lines BL, along which defective memory cell groups (or memory cells) have been detected, with redundant word lines WLred and/or groups of pairs of redundant bit lines BLred and their redundant memory cells MCred. The replacement itself is known, for example, by the term "laser fusing".

We claim:

1. An integrated semiconductor memory, comprising:
   U block groups ($GP_{u=1...U}$) each having groups of M memory cells (MC) and word lines (WL), and means for simultaneously testing several of said groups of M memory cells (MC) for operation in a test mode, each of said groups of memory cells being disposed along a respective word line (WL) within a respective one of said U block groups ($GP_u$);
   said testing means being in the form of a parallel test device (PT) associated with said U block groups ($GP_{u=1...U}$) for writing in and evaluating data to be written into and read out of the semiconductor memory; said parallel test device including means for evaluating data read out in the test mode separately for each of said block groups; and
   I/O data lines (IO1, IO2, IO3) of the semiconductor memory separately carrying a result of the evaluation for each of said groups of M memory cells (MC).

2. The integrated semiconductor memory according to claim 1, wherein:
   each of said block groups ($GP_u$) includes V memory blocks ($BK_{v=1...V}$) with memory cells (MC) disposed in matrix form along said word lines (WL) and bit lines (BL),
   a maximum of one memory block ($BK_v$) per block group ($GP_u$) is selected during operation,
   each of said memory blocks (BKV) includes:
      a block decoder (BDEC) for selecting a respective memory block from a set of memory blocks ($BK_{1...V}$) of a block group ($GP_u$) as a function of block addresses (ADBK) supplied to it, the selection being effected by means of a block selection signal (BKSIG),
      word line decoders (WLDEC) for selecting said word lines (WL) as a function of word line addresses (ADWL) and of the block selection signal (BKSIG),
      read amplifiers (SA) each being connected to a pair of said bit lines (BL) and a pair of connecting lines,
      bit switches (BSW) for an optional connection of said pair of connecting lines to one of M pairs of data lines for reading (BKDB-RD) and for writing (BKDB-WR) of a block databus (BKDB), each M bit switches (BSW) being jointly activated as a bit switch block (BKBSW) by a bit group selection signal (BITSIG),
      a bit group decoder (BITDEC) supplying the bit group selection signals (BITSIG) as output signals and being activated by bit group addresses (ADBIT), at least one bit group decoder (BITDEC) being provided for all of said memory blocks ($BK_{1...V}$),
   a block databus multiplexer (BKDBMX) with which each of said memory blocks ($BK_v$) of a block group ($GP_u$) is associated, said block databus multiplexer (BKDBMX) being supplied with write data lines (BKDB-WR) and read data lines (BKDB-RD) of a respective block databus (BKDB) and being connected to M pairs of data lines for writing (GPDB-WR) and for reading (GPDB-RD) of a group databus (GPDB) connecting all of said block databus multiplexers (BKDBMX) of a block group ($GP_u$) with one another,
   each block databus multiplexer (BKDBMX) being controlled by the block selection signal (BKSIG) of said memory block ($BK_v$) associated with said block databus multiplexer (BKDBMX),
   said parallel test device (PT) includes:
      a group input/output unit (GPIO) for each block group ($GP_u$) being connected to said respective group databus (GPDB) and being connected to an input/output databus (IODB),
      all of said group input/output units (GPIO) of said U block groups ($GP_{1...U}$) being jointly activated by at least one test signal (Test), by at least one control signal (WR, RD) for writing and reading and by a group address bus (GPAD),
      a memory array input/output unit (MAIO) associated with all of said U block groups ($GP_{1...U}$) having an input being connected to said input/output databuses (IODB) of all of said group data input/output units (GPIO) and having an output with P I/O data lines of a first type (IO1)

and (K-P) I/O data lines of a second type (IO2) and being activated by the at least one control signal (RD, WR) for reading and writing, by the test signal (Test) and by an I/O address bus (IOAD), connecting devices of the semiconductor memory to be encapsulated in a case, pads (PD) of the semiconductor memory being electrically accessible to a user of the semiconductor memory through said connecting devices, said I/O data lines of the first type (IO1) being at least indirectly connected to said pads (PD), said I/O data lines of the second type (IO2) being accessible only on a semiconductor chip itself and being electrically inaccessible to the user of the semiconductor memory to be encapsulated in the case, said parallel test device (PT) also includes at least one control unit (CONTROL) having inputs for address signals (ADR) and control signals ($\overline{RAS}$, $\overline{CAS}$, R/$\overline{W}$) to be supplied to the semiconductor memory from outside and having outputs for the block addresses (ADBK), the word line addresses (ADWL), the bit group addresses (ADBIT), the at least one control signal for writing and reading (WR, RD), for the test signal (Test), for the group address bus (GPAD) and for the I/O address bus (IOAD), said control unit (CONTROL) generating the block addresses (ADBK), the word line addresses (ADWL), the bit group addresses (ADBIT), the group address bus (GPAD) and the I/O address bus (IOAD), from the externally supplied address signals (ADR), said control unit (CONTROL) generating the at least one control signal for reading and writing (RD, WR), from the externally supplied control signals ($\overline{RAS}$, $\overline{CAS}$, R/$\overline{W}$), and said control unit (CONTROL) generating the test signal (Test) from the externally supplied address signals (ADR) and the control signals ($\overline{RAS}$, $\overline{CAS}$, R/$\overline{W}$), and the semiconductor memory being operable in the test mode when the test signal (Test) is activated and otherwise in a normal operating mode.

3. The integrated semiconductor memory according to claim 2, wherein the block databuses (BKDB) include one pair of data lines for reading (BKDB-RD) each being constructed as a separate pair of read data lines and one pair of data lines for writing (BKDB-WR) each being constructed as a separate pair of write data lines.

4. The integrated semiconductor memory according to claim 2, wherein the block databuses (BKDB) include one pair of data lines for writing (BKDB-WR) and one pair of data lines for reading (BKDB-RD) each being constructed as a single bidirectional pair of data lines.

5. The integrated semiconductor memory according to claim 2, wherein the group databuses (GPDB) include one pair of data lines for writing (GPDB-WR) and one pair of data lines for reading (GPDB-RD) each being constructed as a single bidirectional pair of data lines.

6. The integrated semiconductor memory according to claim 2, wherein the group databuses (GPDB) include one pair of data lines for writing (GPDB-WR) each being constructed as a separate pair of write data lines and one pair of data lines for reading (GPDB-RD) each being constructed as a separate pair of read data lines.

7. The integrated semiconductor memory according to claim 2, wherein the block addresses (ADBK) are derived from the address signals (ADR) to be supplied externally, in a quantity permitting their use for addressing said V block decoders (BDEC) of one of said block groups ($GP_u$).

8. The integrated semiconductor memory according to claim 2, wherein the word line addresses (ADWL) are derived from the address signals (ADR) to be supplied externally, in a quantity permitting their use for addressing all of said word lines (WL) of one of said memory blocks ($BK_v$).

9. The integrated semiconductor memory according to claim 2, wherein the bit group addresses (ADBIT) are derived from the address signals (ADR) to be supplied externally, in a quantity A:M permitting the bit group selection signals (BITSIG) to be decoded from them, wherein A is equal to a total number of pairs of said bit lines (BL) of one of said memory blocks ($BK_v$).

10. The integrated semiconductor memory according to claim 2, wherein one of the input/output databuses (IODB) has precisely one data line pair for writing and reading.

11. The integrated semiconductor memory according to claim 2, wherein one of the input/output databuses (IODB) has one data line pair for writing (IODB-WR, $\overline{\text{IODB-WR}}$) and one data line pair for reading (IODB-RD, $\overline{\text{IODB-RD}}$).

12. The integrated semiconductor memory according to claim 2, wherein the group address bus (GPAD) includes M group address signals ($GPAD_{m=1...M}$), one of the group address signals ($GPAD_{m=1...M}$) being in a first logic state and remaining group address signals ($GPAD_{m=1...M}$) being in a second logic state complementary to the first logic state.

13. The integrated semiconductor memory according to claim 12, wherein said group input/output unit (GPIO) includes a group control circuit (GPCTRL), a group write unit (GPWR), a group read unit (GPRD) and a group test unit (GPTest), said group control circuit (GPCTRL) having an input receiving the M group address signals ($GPAD_m$) and the test signal (Test) and outputs for M group address output signals ($GPAD_{m=1...M}$), all being jointly in one logic level in the test mode and being in the logic states of the respective group address signals ($GPAP_m$) in the normal operating mode.

14. The integrated semiconductor memory according to claim 13, wherein said group control circuit (GPCTRL) includes M mutually independent OR gates (OR) each having two inputs and an output, one of the inputs of said OR gates jointly receiving the test signal (Test), the other of the inputs of said OR gates receiving the respective group address signal ($GPAD_m$), and the outputs of said OR gates being the outputs of said group control circuit (GPCTRL).

15. The integrated semiconductor memory according to claim 14, wherein each of said OR gates (OR) includes a NOR gate having two inputs and being followed by an inverter.

16. The integrated semiconductor memory according to claim 14, wherein said group write unit (GPWR) includes two demultiplexers (DMUXWR) each having inputs for the group address output signals ($GPAD'_m$) of said group control circuit (GPCTRL) and each having a further input for one of the two lines (IODB-WR, IODB-WR) of the data line pair of the input/output databus (IODB) being used for writing, and each of said demultiplexers (DMUXWR) having M outputs for lines of the M pairs of lines of the group databus (GPDB) associated with said group input/output unit (GPIO) being used for writing (GPDB-WR$_1$...$_M$; $\overline{\text{GPDB-WR}_1}$...$_M$), each of the M outputs being associated with exactly one of the inputs for the group address output signals (GPAD'$_1$...$_M$) of said group control circuit (GPCTRL) in each of said demultiplexers (DNUXWR), in the normal operating mode, each of said demultiplexers (DMUXWR) switching through a data item present at the further input to the output having an associated group address output signal (GPAD'$_m$) at the first logic level of the corresponding group address signal (GPAD$_m$), and in the test mode, each of said demultiplexers (DMUXWR) switching through a data item present at the respective further input to all of said M outputs.

17. The integrated semiconductor memory according to claim 16, wherein each of said demultiplexers (DMUXWR) includes M mutually independent AND gates (AND) each having two inputs, one of the inputs of each of said AND gates (AND) being jointly connected to the respective one line of the input/output databus (IODB) used for writing, and each of the other of the inputs of each of said AND gates (AND) in each of said demultiplexers (DMUXWR) receiving one of the group address output signals (GPAD'$_1$...$_M$) of said group control circuit (GPCTRL).

18. The integrated semiconductor memory according to claim 17, wherein at least one of said AND gates (AND) includes a NAND gate having two inputs which are the inputs of the at least one AND gate (AND), and an inverter connected downstream of said NAND gate.

19. The integrated semiconductor memory according to claim 13, wherein said group read unit (GPRD) includes two multiplexers (NUXRD) each having M inputs for lines of the M pairs of lines of the group databus (GPDB) associated with said group input/output unit (GPIO) being used for reading (GPDB-RD$_1$...$_M$; $\overline{\text{GPDB-RD}_1}$...$_M$) and each having further inputs for the M group address output signals (GPAD'$_1$...$_M$) of said group control circuit (GPCTRL), each of said multiplexers (MUXRD) having one output (GPout1, GPout2), each of the group address output signals (GPAD'$_1$...$_M$) being associated with exactly one pair of the lines (GPDB-RD$_1$...$_M$, $\overline{\text{GPDB-RD}_1}$...$_M$) of the group databus (GPDB), in each of said multiplexers (MUXRD), in the normal operating mode, said two multiplexers (MUXRD) switching through to the outputs (GPout1, GPout2) the pair of data lines (GPDB-RD$_1$, $\overline{\text{GPDB-RD}_1}$; ... ; GPDB-RD$_M$, $\overline{\text{GPDB-RD}_M}$) for reading the group databus (GPDB), having a group address output signal (GPAD'$_m$) associated with this bus at the first logic level of the corresponding group address signal (GPAD$_m$), and in the test mode, when all of the lines (GPDB-RD$_1$...$_M$; $\overline{\text{GPDB-RD}_1}$...$_M$) for reading being present on a respective one of said multiplexers (MUXRD) exhibit the same data item, the data item being switched to the output (GPout1, GPout2) of said respective multiplexer (MUXRD) for placing the outputs (GPout1, GPout2) of said two multiplexers (MUXRD) at mutually complementary logic levels, and otherwise the outputs (GPout1, GPout2) of said multiplexers (MUXRD) being at a mutually identical logic level.

20. The integrated semiconductor memory according to claim 19, wherein each of said multiplexers (NUXRD) includes M NAND gates each having two inputs and an output, and a further NAND gate having M inputs and an output, each of the M inputs of said further NAND gate being connected to the output of a respective one of said M NAND gates, the output of said further NAND gate being the output (GPout1, GPout2) of said respective multiplexer (MUXRD), one input of each of said M NAND gates being connected to one of the read data lines (GPDB-RD$_1$...$_M$; $\overline{\text{GPDB-RD}_1}$...$_M$) of the group databus (GPDB) and the other input of each of said M NAND gates receiving the group address output signal (GPAD'$_m$) associated with the respective read data line (GPDB-RD$_1$...$_M$; $\overline{\text{GPDB-RD}_1}$...$_M$).

21. The integrated semiconductor memory according to claim 19, wherein:

said group test unit (GPTest) has a first (GPin1) and a second input (GPin2) each being connected to a respective one of the two outputs (GPout1, GPout2) of said group read unit (GPRD), said group test unit (GPTest) has a third input for receiving the test signal (Test) and a fourth input for receiving a comparison data item (DCOMP) at one logic level, said group test unit (GPTest) has two outputs connected to the read lines (IODB-RD, $\overline{\text{IODB-RD}}$) of the input/output databus (IODB), and said group test unit (GPTest) functions to provide:

in the normal operating mode, the signal present at the respective input (GPin1, GPin2) of the first two inputs (GPin1, GPin2) being present at the outputs, in the test mode, in one case when the outputs (GPout1, GPout2) of said group read unit (GPRD) connected to the first two inputs (GPin1, GPin2) are at mutually complementary logic levels, these complementary levels being present at the outputs of said group test unit (GPTest), and in another case when the outputs (GPout1, GPout2) of said group read unit (GPRD) connected to the first two inputs (GPin1, GPin2) are both at the mutually identical logic level, one of the two outputs of said group test unit (GPTest) being at a logic level complementary to the logic level of the comparison data item (DCOMP) whereas the other of the two outputs being at the logic level of the comparison data item (DCOMP).

22. The integrated semiconductor memory according to claim 21, wherein said group test unit (GPTest) includes first, second, third, fourth, fifth and sixth NAND gates (N$_1$...N$^6$) each having two inputs and one output, and a NOR gate (NOR) having first, second and third inputs and one output, one of the inputs of said first NAND gate (N1) is the first input (GPin1) of said group test unit (GPTest), one of the inputs of said fourth NAND gate (N4) being the second input (GPin2) of said group test unit (GPTest), a first inverter (I1) connected from the first input (GPin1) of said group test unit (GPTest) to both the other of the inputs of said fourth NAND gate (N4) and the first input of said NOR gate (NOR), a second inverter (I2) connected from the second input (GPin2) of said group test unit (GPTest) to both the other of the inputs of said first NAND gate (N1) and the second input of said NOR gate (NOR), a third inverter (I3) through which the test signal (Test) is supplied to the third input of said NOR gate (NOR), one of the inputs of said third NAND gate (N3) receiving the comparison data item (DCOMP), a fourth inverter (I4) through which the comparison data item (DCOMP) is supplied to one of the inputs of said second NAND gate (N2), the output of said NOR gate (NOR) being connected to the other of the inputs of said second and third NAND gates (N2, N3), the outputs of said first and of said second NAND gates (N1, N2) being connected to the inputs of said fifth NAND gate (N5), the outputs of said third and of said fourth NAND gates (N3, N4) being connected to the inputs of said sixth NAND gate (N6), and the outputs of said fifth and of said sixth NAND gates (N5, N6) being the two outputs of said group test unit (GPTest).

23. The integrated semiconductor memory according to claim 2, (or 21) wherein:

said memory array input/output unit (MAIO) includes P memory array read units (MARD) each having R read units (RDUI; RDU2); P memory array write units (MAWR) each being assigned to a respective one of said memory array read units (MARD) and each including R write units (WRUL; WRU2); and a memory array control circuit (MACTRL), each of said memory array read units (MARD) has R pairs of data input lines ($MARD_{p,r}$, $\overline{MARD_{p,r}}$), each of said memory array write units (MAWR) has a data input and R pairs of data output lines ($MAWRP_{p,r}$, $\overline{MAWR_{p,r}}$), wherein p is constant for each R pairs and p=1 ... P, r=1 ... R, the following correlation applies to the numbers P, R, U: P.R U, the data input lines ($MARD_{p,r}$, $\overline{MARD_{p,r}}$) of said memory array read units (MARD) are connected to the read lines (IODB-RD, $\overline{IODB-RD}$) of the U input/output databuses (IODB), the data output lines ($MAWR_{p,r}$, $\overline{MAWR_{p,r}}$) of said memory array write units (MAWR) are connected to the write lines (IODB-WR, $\overline{IODB-WR}$) of the U input/output databuses (IODB), each of said memory array read units (MARD) has an output connected to one of the I/O data lines of the first type (IO1) and to the data input of said memory array write unit (MAWR) associated therewith, each of said memory array read units (MARD) also has outputs for (R−1) I/O data lines of the second type (IO2), all of said memory array read units (MARD) jointly receive the read control signal (RD), all of said memory array write units (MAWR) jointly receive the write control signal (WR), all of said memory array read units (MARD), all of said memory array write units (MAWR) and said memory array control circuit (MACTRL) jointly receive the test signal (Test), all of said memory array read units (MARD) are jointly connected to a memory array read address bus (MAADRD), all of said memory array write units (MAWR) are jointly connected to a memory array write address bus (MAADWR), said memory array control circuit (MACTRL) is a circuit for generating the memory array read address bus (MAADRD) and the memory array write address bus (MAADWR) from the I/O address bus (IOAD) under the control of the test signal (Test), and the memory array read address bus (MAADRD) and the memory array write address bus (MAADWR) each include R address lines ($MAADRD_1 \ldots R$; $\overline{MAADWR_1 \ldots R}$).

24. The integrated semiconductor memory according to claim 23, wherein each one pair of data input lines ($MARD_{p,r}$, $\overline{MARD_{p,r}}$) and one pair of data output lines ($MAWR_{p,r}$, $\overline{MAWR_{p,r}}$) are in the form of a single data line pair to be operated bidirectionally.

25. The integrated semiconductor memory according to claim 23, wherein said memory array control circuit (MACTRL) includes a read decoder (DECRD) and a write decoder (DECWR), respectively switching through the I/O address bus (IOAD) to the memory array read address bus (MAADRD) and to the memory array write address bus (MAADWR) in the normal operating mode, the memory array write address bus (MAADWR) having lines, and the memory array read address bus (MAADRD) having a first and remaining lines, in the test mode, said read decoder (DECRD) and the test signal (Test) placing the first line of the memory array read address bus (MAADRD) at a constant logic level while the remaining lines of the memory array read address bus (MAADRD) are at a logic level being complementary to the logic level of the first line and being constant, and in the test mode, said write decoder (DECWR) and the test signal (Test) placing all of the lines of the memory array write address bus (MAADWR) at a constant logic level.

26. The integrated semiconductor memory according to claim 25, wherein the I/O address bus (IOAD) has first and remaining lines, said read decoder (DECRD) has an OR circuit (OR) with two inputs and one output, one of the inputs of said OR circuit (OR) receiving the test signal (Test), the other of the inputs of said OR circuit (OR) being connected to the first line of the I/O address bus (IOAD) and the output of said OR circuit (OR) being connected to the first line of the memory array read address bus (MAADRD), and said read decoder (DECRD) has (R−1) AND gates (AND) each having two inputs and one output, one of the inputs of each of said AND gates (AND) receiving a signal being complementary to the test signal (Test), each of the other inputs of said AND gates (AND) being connected to one of the remaining lines of the I/O address bus (IOAD), and each of the outputs of said AND gates (AND) being connected to one of the remaining lines of the memory array read address bus (MAADRD).

27. The integrated semiconductor memory according to claim 26, wherein said write decoder (DECWR) includes R OR circuits (OR) each having two inputs and one output, one of the inputs of each of the OR circuits (OR) jointly receiving the test signal (Test), the other of the inputs of each of the OR circuits (OR) being connected to the I/O address bus (IOAD), and the outputs of the OR circuits (OR) being connected to the memory array write address bus (MAADWR).

28. The integrated semiconductor memory according to claim 27, wherein each of said OR gates (OR) includes a NOR gate followed by an inverter.

29. The integrated semiconductor memory according to claim 26, wherein each of said AND gates (AND) includes a NAND gate followed by an inverter.

30. The integrated semiconductor memory according to claim 23, wherein said read units (RDUL; RDU2) of each of said memory array read units (MARD) include a first read unit (RDUL) and remaining read units (RDU2), said first read unit (RDUL) having two multiplexers (NUXRD) and one output stage (OUTRD), each of said multiplexers (MUXRD) has R first inputs each being assigned to one data input line ($MARD_{p,r}$; $\overline{MARD_{p,r}}$) of the R pairs of data input lines ($MARD_{p,r}$, $\overline{MARD_{p,r}}$), R second inputs for the memory array read address bus (MAADRD) having lines being associated with the data input lines ($MARD_{p,r}$; $\overline{MARD_{p,r}}$), and one output,
- in the normal operating mode, each of said two multiplexers (MUXRD) switching through to the respective output one of the data input lines ($MARD_{p,r}$; $\overline{MARD_{p,r}}$) having an associated line of the memory array read address bus (MAADRD) being in the activated state,
- in the test mode, each of said two multiplexers (MUXRD) switching through to the output one of the data input lines ($MARD_{p,r}$, $\overline{MARD_{p,r}}$) to which the first line ($NAADRD_1$) of the memory array read address bus (MAADRD) with its constant logic level is assigned, and
- said output stage (OUTRD) is a driver circuit having an output being the output of said memory array read unit (MARD) connected to one of the I/O data lines of the first type (IO1) and exhibiting a signal present at the output of one of said multiplexers (MUXRD) in amplified form.

31. The integrated semiconductor memory according to claim 30, wherein each of said multiplexers (MUXRD) of said first read unit (RDUL) includes R NAND gates each having two inputs and an output, one of the inputs of each of said NAND gates being one of the R first inputs of said multiplexer (NUXRD) and the other of the inputs of each of said NAND gates being one of the R second inputs of said multiplexer (NUXRD), and each of said multiplexers (MUXRD) of said first read unit (RDUL) has an additional NAND gate, said additional NAND gate having R inputs each being connected to the output of one of said R NAND gates, and said additional NAND gate having an output being the output of said respective multiplexer (MUXRD) of said first read unit (RDU1).

32. The integrated semiconductor memory according to claim 30, wherein said output stage (OUTRD) has two AND gates (AND) each having first, second and third inputs and one output,
- the first input of each of said AND gates (AND) is connected to the output of a respective one of said multiplexers (NUXRD),
- an inverter is connected between the second input of each of said AND gates (AND) and the output of the other of said multiplexers (MUXRD),
- the third input of each of said AND gates (AND) receives the read control signal (RD), and
- said output stage (OUTRD) has a final stage with an input being connected to the outputs of said AND gates (AND) and an output being the output of said output stage (OUTRD) and being an output of said first read unit (RDU1).

33. The integrated semiconductor memory according to claim 32, wherein at least one of said AND gates (AND) includes a NAND gate followed by an inverter.

34. The integrated semiconductor memory according to claim 30, wherein each of said remaining (R−1) read units (RDU2) includes one output stage (OUTRD) having two inputs and one output each being an output for the (R 1) I/O data lines of the second type (IO2),
- NAND gates each having first and second inputs and each having an output connected upstream of a respective one of the inputs of said output stage (OUTRD), each of the first inputs of said NAND gates being connected to a respective one of the two data input lines ($MARD_{p,2...R}$; $\overline{MARD_{p,2...R}}$) of the R pairs of data input lines ($MARD_{p,r}$, $\overline{MARD_{p,r}}$) with the exception of the first pair ($MARD_{p,1}$, $\overline{MARD_{p,1}}$) of the R pairs, and the second inputs of said NAND gates receiving the test signal (Test),
- in the normal operating mode, the outputs of said remaining (R−1) read units (RDU2) are switched to a high impedance, and
- in the test mode, a signal present on one data input line ($MARD_{p,2...R}$) of the respective pair of data input lines ($MARD_{p,2...R}$, $\overline{MARD_{p,2...R}}$) is present in amplified form at the output of each of said remaining (R−1) read units (RDU2).

35. The integrated semiconductor memory according to claim 34, wherein said output stages (OUTRD) of said remaining (R−1) read units (RDU2) are identical to said output stage (OUTRD) of said first read unit (RDUL) of a respective one of said memory array read units (MARD).

36. The integrated semiconductor memory according to claim 23, wherein:
- each of said P memory array write units (MAWR) has a first input connected to one of the P I/O data lines of the first type (IO1) and a second input receiving the write control signal (WR),
- each of said P memory array write units (MAWR) has inputs for the memory array write address bus (MAADWR) and outputs for the R pairs of data output lines ($MAWR_{p,r}$, $\overline{MAWR_{p,r}}$),
- in the normal operating mode, each of said P memory array write units (MAWR) forwards a data item to be written into the memory and being present on the respective I/O data line of the first type (IO1) as well as its complementary data item, as a function of the write control signal (WR) and of the memory array write address bus (MAADWR), to the pair of data output lines ($MAWR_{p,r}$, $\overline{MAWR_{p,r}}$) for activating one line of the memory array write address bus (MAADWR), and
- in the test mode, each of said P memory array write units (MAWR) forwards the data item present on the I/O data line of the first type (IO1) and its complementary data item to all R pairs of the data output lines ($MAWR_{p,r}$, $\overline{MAWR_{p,r}}$).

37. The integrated semiconductor memory according to claim 36, wherein:
- each of said memory array write units (MAWR) includes two demultiplexers (DMUXWR) and an input stage (INWR),
- said input stage (INWR) has two outputs, a first input connected to a respective I/O data line of the first type (IO1) and a second input receiving the write control signal (WR), during writing in, said input stage (INWR) derives from the data item to be written being present on the I/O data line of the first type (IO1), the same data item and its complementary data item and applies the derived data items to the two outputs of said input stage (INWR), each of said demultiplexers (DMUXWR) includes R AND gates (AND) each having first and second inputs and one output, all of the first inputs of said AND gates (AND) of one of said demultiplexers (DNUXWR) are connected to one of the outputs of said input stage (INWR), and all of the first inputs of said AND gates (AND) of the other of said demultiplexers (DMUXWR) are connected to the other of the outputs of said input stage (INWR), the second inputs of said AND gates (AND) of both of said demultiplexers (DMUXWR) are connected to the memory array write address bus (MAADWR), and said demultiplexers (DMUXWR) have outputs connected to the R pairs of data output lines ($MAWR_{p,r}$, $\overline{MAWR_{p,r}}$).

38. The integrated semiconductor memory according to claim 37, wherein said input stage (INWR) includes a buffer (BF) having an input for the data item present on the I/O data line of the first type (IO1) and having an output, and two AND gates (AND) each having first and second inputs and one output, the first input of one of said AND gates (AND) being connected to the output of said buffer (BF), an inverter is connected between the first input of the other of said AND gates (AND) and the output of said buffer (BF), and the second inputs of said AND gates (AND) receive the write control signal (WR).

39. The integrated semiconductor memory according to claim 38, wherein at least one of said AND gates (AND) includes a NAND gate having two inputs and an inverter following said NAND gate.

40. The integrated semiconductor memory according to claim 2, wherein the input/output databus (IODB) has N bidirectional data line pairs for writing and reading, wherein N is an integral fraction of M.

41. The integrated semiconductor memory according to claim 2, wherein the input/output databus (IODB) has N data line pairs for reading ($IODB\text{-}RD_1 \ldots N$, $\overline{IODB\text{-}RD_1 \ldots N}$) and N data line pairs for writing ($IODB\text{-}WR_1 \ldots N$, $\overline{IODB\text{-}WR_1 \ldots N}$), wherein N is an integral fraction of M.

42. The integrated semiconductor memory according to claim 2, wherein the group address bus (GPAD) includes Q group address signals ($GPADq=1 \ldots Q$), one of the group address signals ($GPADq=1 \ldots Q$) being at a first logic state and the remaining ones of the group address signals ($GPADq=1 \ldots Q$) being at a second logic state complementary to the first logic state, wherein $Q.N=M$.

43. The integrated semiconductor memory according to claim 42, wherein said group input/output unit (GPIO) includes a group control circuit (GPCTRL), N group write units (GPWR), and N group read units (GPRD), said group control circuit (GPCTRL) has inputs receiving the Q group address signals ($GPAD_1 \ldots Q$) and the test signal (Test), and said group control circuit (GPCTRL) has outputs for Q group address output signals ($GPAD'_{q=1 \ldots Q}$), the first group address output signal ($GPAD'_1$) being at a first logic level and the remaining group address output signals ($GPAD'_{2 \ldots Q}$) being at a second logic level complementary to the first logic level in the test mode, and the group address output signals ($GPAD'_{1 \ldots Q}$) being at the logic states of the respective group address signals ($GPAD_{1 \ldots Q}$) in the normal operating mode.

44. The integrated semiconductor memory according to claim 43, wherein said group control circuit (GPCTRL) includes an OR gate (OR) and (Q−1) AND gates (AND) each having two inputs and an output, a first (GPAD one of the group address signals ($GPAD_{1 \ldots Q}$) is present at one of the inputs of said OR gate (OR), a remaining ($GPAD_{2 \ldots Q}$) one of the group address signals ($GPAD_{1 \ldots Q}$) is present at one of the inputs of said AND gates (AND), the test signal (Test) is present at the other of the inputs of said OR gate (OR)

a signal complementary to the test signal (Test) is present at the other inputs of said AND gates (AND), and the outputs of said OR gate (OR) and of said AND gates (AND) are the outputs of said group control circuit (GPCTRL).

45. The integrated semiconductor memory according to claim 44, wherein said OR gate (OR) includes a NOR gate having two inputs and an inverter following said NOR gate.

46. The integrated semiconductor memory according to claim 44, wherein at least one of said AND gates (AND) includes a NAND gate having two inputs and an inverter following said NAND gate.

47. The integrated semiconductor memory according to claim 43, wherein:

said group write unit (GPWR) has a pair of inputs for a data line pair ($IODB\text{-}WR_n$, $\overline{IODB\text{-}WR_n}$) of the input/output databus (IODB), being used for writing, said group write unit (GPWR) has an input receiving the group address output signals ($GPAD'_{1 \ldots Q}$) of said group control circuit (GPCTRL), said group write unit (GPWR) has (Q−1) group input stages (GPINWR) each having one input connected to one of (Q−1) I/O data lines of a third type (IO3), a further input for the write control signal (WR), and two outputs, during writing in, each of said group input stages (GPINWR) derives from a data item to be written into the memory and applied to it through a respective I/O dataline of the third type (IO3), the same data item and its complementary data item, and applies the derived data items to the two outputs, logic circuits (LOGWR) each having two inputs and an output, one of the inputs of each of said logic circuits (LOGWR) is connected to a respective one of the outputs of said group input stages (GPINWR) and the other of the inputs of each of said logic circuits (LOGWR) receives the test signal (Test), in the normal operating mode, a signal at the same logic level is present at the outputs ($GPD_2$, $\overline{GPD_2}$; ...; $GPD_Q$, $\overline{GPD_Q}$) of two of said logic circuits (LOGWR) connected to a respective one of said group input stages (GPINWR), in the test mode, the derived complementary data item is present at the output ($\overline{GPD_{2, \ldots, Q}}$) of one of said two logic circuits (LOGWR) and the derived data item is present at the output (GPD$_{2,...,Q}$) of the other of said two logic circuits (LOGWR), each of said group write units (GPWR) also includes two demultiplexers (GPDMUXWR) each having Q inputs for the group address output signals (GPAD'$_1$ ... Q) and a further input being one of the two inputs of the pair of inputs for the respective data line pair (IODB-WR$_n$, $\overline{\text{IODB-WR}_n}$) of the input/output databus (IODB), for writing, each of said demultiplexers (GPDMUXWR) has (Q−1) additional inputs each being connected in one demultiplexer (GPDMUXWR) to the output (GPD$_{2,...,Q}$) of a respective one of said two logic circuits (LOGWR), and each being connected in the other of said demultiplexers (GPDMUXWR) to the output (GPD$_{2,...,Q}$) of the respective other of said two logic circuits (LOGWR), each of said demultiplexers (GPDMUXWR) has Q outputs, the outputs of said demultiplexers (GPDMUXWR) are connected to Q pairs of data lines of the M pairs of data lines of the group databus (GPDB), for writing, during writing in the normal operating mode, each of said group write units (GPWR) forwards data items present on the data line pair (IODB-WR$_n$, $\overline{\text{IODB-WR}_n}$) of the input/output databus (IODB) connected to the input of said group write units (GPWR) to the two outputs, for activating one of the group address signals (GPAD$_q$) and its associated group address output signal (GPAD'$_q$) of said group control circuit (GPCTRL), during writing in the test mode, each of said group write units (GPWR) forwards both data items present on the data line pair (IODB-WR$_n$, $\overline{\text{IODB-WR}_n}$) of the input/output databus (IODB) connected to the input of said group write units (GPWR), and the data items derived from the data items of the I/O data lines of the third type (IO3) being present at said group input stages (GPINWR), to a respective output and to a part (N) of the group databus (GPDB).

48. The integrated semiconductor memory according to claim 47, wherein:

each of said demultiplexers (GPDNUXWR) includes an AND gate (AND) and (Q−1) logic units (LU) each having an output being one of the Q outputs of said respective demultiplexer (GPDMUXWR), each of said AND gates (AND) has first and second inputs and each of said logic units (LU) has first, second and third inputs, the first inputs of said AND gates (AND) and of said logic units (LU) of each of said demultiplexers (GPDNUXWR) are connected to the one further input of said respective demultiplexer (GPDMUXWR), the second inputs of said AND gate (AND) and of said logic units (LU) of said demultiplexers (GPDMUXWR) are each connected to one of the Q inputs of said respective demultiplexer (GPDMUXWR), the third inputs of said logic units (LU) of said demultiplexers (GPDMUXWR) are the additional (Q−1) inputs of said respective demultiplexer (GPDNUXWR).

49. The integrated semiconductor memory according to claim 48, wherein each of said AND gates (AND) includes a NAND gate having the first and second inputs of the AND gate (AND) and an inverter following said NAND gate.

50. The integrated semiconductor memory according to claim 48, wherein each of said logic units (LU) includes a first NAND gate having two inputs being the first and second inputs of said logic unit (LU) and having an output, and a second NAND gate having one input connected to the output of said first NAND gate and another input being the third input of said logic unit (LU).

51. The integrated semiconductor memory according to claim 47, wherein each of said group input stages (GPINWR) includes a buffer (BF) for temporary storage of a data item being provided by the respective I/O data line of the third type (IO3).

52. The integrated semiconductor memory according to claim 47, wherein each of said group input stages (GPINWR) includes two AND gates (AND) each having two inputs, one of the inputs of one of said AND gates (AND) being supplied with a data item present on the respective I/O data line of the third type (IO3), one of the inputs of the other of said AND gates (AND) being supplied with a data item present on the respective I/O data line of the third type (IO3) in inverted form, and the other of the inputs of said AND gates (AND) receiving the write control signal (WR).

53. The integrated semiconductor memory according to claim 43, wherein:

each of said group read units (GPRD) has Q pairs of data inputs being connected to a corresponding number of data line pairs (GPDB-RD$_{n,1}$ ... $_Q$, $\overline{\text{GPDB-RD}_{n,1}...Q}$) of the respective group databus (GPDB), provided for reading, each of said group read units (GPRD) has address inputs for the group address output signals (GPAD'$_1$ ... $_Q$) of said group control circuit (GPCTRL), each of the group address output signals (GPAD'$_1,...,Q$) being associated with a respective one of the Q pairs of data inputs, and each of said group read units (GPRD) has inputs for the read control signal (RD) and for the test signal (Test), each of said group read units (GPRD) has a pair of outputs for a data line pair (IODB-RD$_n$, $\overline{\text{IODB-RD}_n}$) of the input/output databus (IODB), being used for reading, each of said group read units (GPRD) has (Q−1) outputs being connected to the I/O data lines of the third type (IO3), in the normal operating mode, data from the pair of Q pairs of data inputs having an associated address input being at the first logic level, being exhibited by one of the Q group address signals (GPAD$_{1...Q}$), and being exhibited by one of the Q group address output signals (GPAD'$_{1...Q}$) of said group control circuit (GPCTRL), are switched through to the pair of outputs connected to the one data line pair (IODB-RD$_n$, $\overline{\text{IODB-RD}_n}$) of the input/output databus (IODB), in the test mode, data present at a first pair of data inputs are switched through to the pair of outputs connected to the one data line pair (IODB$_n$, $\overline{\text{IODB-RD}_n}$) of the input/output databus (IODB), and in the test mode, data items present at remaining (Q−1) data inputs are also switched through to the (Q−1) outputs connected to the I/O data lines of the third type (IO3).

54. The integrated semiconductor memory according to claim 53, wherein:

each of said group read units (GPRD) includes two multiplexers (GPMUXRD), $2 \cdot (Q-1)$ logic units (LOGRD), and $(Q-1)$ group output stages (GPOUTRD), each of said multiplexers (GPMUXRD) has an input connected to Q respective data lines (GPDB-$RD_{n,1...Q}$; $\overline{GPDB-RD_{n,1...Q}}$) of all of the Q data line pairs (GPDB-$RD_{n,1...Q}$, $\overline{GPDB-RD_{n,1...Q}}$) of a part (N) of the group databus (GPDB), provided for reading, each of said multiplexers (GPMUXRD) has an input connected to the address inputs of said group read unit (GPRD) for the group address output signals (GPAD'$_{1...Q}$) of said group control circuit (GPCTRL), each of said multiplexers (GPMUXRD) has an output being the output of said group read unit (GPRD) and being connected to one (IODB-$RD_n$; $\overline{IODB-RD_n}$) of the lines of the data line pair (IODB-$RD_n$, $\overline{IODB-RD_n}$) of the input/output databus (IODB), in the normal operating mode, a data item present on the respective data line of the pair of the Q data line pairs having an associated group address output signal (GPAD'$_{1,...,Q}$) being at the first logic level, is switched through to the output connected to the input/output databus (IODB), and in the test mode, a data item present on the respective data line (GPDB-$RD_{n,1}$, $\overline{GPDB-RD_{n,1}}$) of the first pair (GPDB/$RD_{n,1}$, $\overline{GPDB/RD_{n,1}}$) of data lines of the part (N) of the group databus (GPDB), is switched through to the respective output.

55. The integrated semiconductor memory according to claim 54, wherein each of said logic units (LOGRD) is a NAND gate having first and second inputs and an output, each two of said logic units (LOGRD) are functionally combined and said first inputs of said logic units (LOGRD) are connected to a respective data line (GPDB-$RD_{n,2,...,Q}$; $\overline{GPDB-RD_{n,2,...,Q}}$) of one of the $(Q-1)$ data line pairs (GPDB-$RD_{n,2...Q}$, $\overline{GPDB-RD_{n,2...Q}}$) of the part (N) of the group databus (GPDB), provided for reading, the second inputs of said logic units (LOGRD) receive the test signal (Test), and the outputs of said logic units (LOGRD) are inputs of said group output stage (GPOUTRD) following said logic units (LOGRD).

56. The integrated semiconductor memory according to claim 55, wherein:

each of said group output stages (GPOUTRD) includes two AND gates (AND) each having first, second and third inputs, and a final stage following said two AND gates (AND), inverters each being connected between the first input of one of said AND gates (AND) and the output of a respective one of said logic units (LOGRD), the second inputs of said AND gates (AND) each being connected to the output of the other respective one of said logic units (LOGRD), the third inputs of said AND gates (AND) receive the read control signal (RD), and the final stage has an output being the output of said group output stage (GPOUTRD) and being one of the $(Q-1)$ outputs of said group read unit (GPRD).

57. The integrated semiconductor memory according to claim 2, wherein:

each of the U input/output databuses (IODB) has N data line pairs for writing and reading being divided into P memory array databuses (MADB) each having R pairs of data output lines for writing (MADB-$WR_{1...P,1...R}$, $\overline{MADB-WR_{1...P,1...R}}$) and R pairs of data input lines for reading (MADB-$RD_{1...P,1...R}$, $\overline{MADB-RD_{1...P,1...R}}$), wherein: $U.N = P.R$, where $N = M/Q$, said memory array input/output unit (MAIO) includes P memory array read units (MARD) each having R read units (RDUL; RDU2);

P memory array write units (MAWR) each being associated with a respective one of said P memory array read units (MARD) and each including R write units (WRUL; WRU2); and a memory array control circuit (MACTRL), each of said memory array read units (MARD) has the R pairs of data input lines (MADB-$RD_{p,r}$; $\overline{MADB-RD_{p,r}}$) of one of the P memory array databuses (MADB), each of said memory array write unit (MAWR) has a data input and has the R pairs of data output lines (MADB-$WR_{p,r}$, $\overline{MADB-WR_{p,r}}$) of the memory array databus (MADB), where $p = 1 ... P$ and $r = 1 ... R$, each of said memory array read units (MARD) has an output connected to one of the I/O data lines of the first type (IO1) and to the data input of said memory array write unit (MAWR) associated therewith, each of said memory array read units (MARD) also has outputs for $(R-1)$ I/O data lines of the second type (IO2), all of said memory array read units (MARD) jointly receive the read control signal (RD), all of said memory array write units (MAWR) jointly receive the write control signal (WR), all of said memory array read units (MARD), all of said memory array write units (MAWR) and said memory array control circuit (MACTRL) jointly receive the test signal (Test), all of said memory array read units (MARD) and all of said memory array write units (MAWR) are jointly connected to a memory array address bus (MAAD) for jointly operating all of said memory array read units (MARD) and all of said memory array write units (MAWR), said memory array control circuit (MACTRL) is a circuit for generating the memory array address bus (MAAD) from the I/O address bus (IOAD) under control of the test signal (Test), and the memory array address bus (MAAD) includes R address lines (MAAD1 ... R).

58. The integrated semiconductor memory according to claim 57, wherein one pair of the data input lines (MADB-$RD_{p,r}$, $\overline{MADB-RD_{p,r}}$) and one pair of the data output lines (MADB-$WR_{p,r}$, $\overline{MADB-WR_{p,r}}$) are in the form of a single data line pair to be operated bidirectionally.

59. The integrated semiconductor memory according to claim 57, wherein the memory array address bus (MAAD) has a first (MAADL) and remaining lines, said memory array control circuit (MACTRL) is a decoder switching through the I/O address bus (IOAD) to the memory array address bus (MAAD) in the normal operating mode, and the first line (MAADL) of the memory array address bus (MAAD) is placed at a constant logic level by the test signal (Test) and the remaining lines of the memory address bus (MAAD) are placed at a logic level being complementary to the logic level of the first line (MAADL) and being constant, in the test mode.

60. The integrated semiconductor memory according to claim 59, wherein the I/O address bus (IOAD) has first and remaining lines, the memory array control circuit (MACTRL) has an OR gate (OR) having two inputs and one output, one of the inputs of said OR gate (OR) receives the test signal (Test), the other of the inputs of said OR gate (OR) is connected to the first line of the I/O address bus (IOAD), and the output of said OR gate (OR) is connected to the first line of the memory array address bus (MAAD), and said memory array control circuit (MACTRL) has (R−1) AND gates (AND) each having two inputs and one output, one of the inputs of each of said AND gates (AND) receiving a signal complementary to the test signal (Test), the other of the inputs of each of said AND gates (AND) being connected one of the remaining (R−1) lines of the I/O address bus (IOAD), and the output of each of said AND gates (AND) being connected to one of the remaining (R−1) lines of the memory array address bus (MAAD).

61. The integrated semiconductor memory according to claim 60, wherein said OR gate (OR) includes a NOR gate and an inverter following said NOR gate.

62. The integrated semiconductor memory according to claim 60, wherein each of said AND gates (AND) includes a NAND gate and an inverter following said NAND gate.

63. The integrated semiconductor memory according to claim 57, wherein said read units (RDUL; RDU2) of each of said memory array read units (MARD) include a first read unit (RDUL) having two multiplexers (NUXRD) and an output stage (OUTRD),
- each of said multiplexers (MUXRD) has an output, R first inputs each being connected to a respective one of the data input lines (MADB-RD$_{p,r}$; $\overline{MADB\text{-}RD}_{p,r}$) of the R pairs of data input lines (MADB-RD$_{p,r}$, $\overline{MADB\text{-}RD}_{p,r}$), and R second inputs for the memory array address bus (MAAD) with lines being assigned to the data input lines (MADB-RD$_{p,r}$, $\overline{MADB\text{-}RD}_{p,r}$),
- in the normal operating mode, both of said multiplexers (MUXRD) switching through one of the data input lines (MADB-RD$_{p,r}$, $\overline{MADB\text{-}RD}_{p,r}$) having an associated line of the memory array address bus (MAAD) being in an activated electrical state, to the respective output,
- in the test mode, both of said multiplexers (NUXRD) switching through one of the data input lines (MADB-RD$_{p,r}$, $\overline{MADB\text{-}RD}_{p,r}$) being associated with the first line (NAADL) of the memory array address bus (MAAD) with its constant logic level, to the output, and
- said output stage (OUTRD) is a driver circuit having an output being the output of said memory array read unit (MARD), being connected to one of the I/O data lines of the first type (IO1), and exhibiting a signal present at the output of one of said multiplexers (MUXRD) in amplified form.

64. The integrated semiconductor memory according to claim 63, wherein each of said multiplexers (NUXRD) of said first read unit (RDUI) has R NAND gates each having two inputs and an output, one of the inputs of each of said NAND gates being one of the R first inputs of one of said multiplexers (NUXRD) and the other of the inputs of each of said NAND gates being one of the R second inputs of one of said multiplexers (NUXRD),
- each of said multiplexers (MUXRD) of said first read unit (RDUl) has an additional NAND gate having R inputs each being connected to the output of one of said R NAND gates, and
- each of said additional NAND gates has an output being the output of a respective one of said multiplexers (MUXRD) of said first read unit (RDUl).

65. The integrated semiconductor memory according to claim 63, wherein said output stage (OUTRD) has two AND gates (AND) each having first, second and third inputs and one output,
- the first input of each of said AND gates (AND) of said output stage (OUTRD) is connected to the output of one of said multiplexers (MUXRD),
- an inverter is connected between the second input of each of said AND gates (AND) and the output of the other of said multiplexers (MUXRD),
- the third input of each of said AND gates (AND) receives the read control signal (RD), and
- said output stage (OUTRD) has a final stage with an input connected to the outputs of said AND gates (AND) and an output being the output of said output stage (OUTRD) and being an output of said first read unit (RDUI).

66. The integrated semiconductor memory according to claim 65, wherein at least one of said AND gates (AND) includes a NAND gate and an inverter following said NAND gate.

67. The integrated semiconductor memory according to claim 63, wherein said read units (RDUL; RDU2) include remaining (R−1) read units (RDU2) each having an output stage (OUTRD) with two inputs and one output, each of the outputs of said remaining (R−1) read units (RDU2) being one of the outputs for the (R−1) I/O data lines of the second type (IO2),
- NAND gates each having first and second inputs and each having an output connected to one of the inputs of one of said output stages (OUTRD), the first input of each of said NAND gates is connected to one of two data input lines (MADB-RD$_{p,2...R}$, $\overline{MADB\text{-}RD}_{p,2...R}$) of one of the R pairs of data input lines (MADB-RD$_{p,r}$, $\overline{MADB\text{-}RD}_{p,r}$) with the exception of a first pair (MADB-RD$_{p,l}$, $\overline{MADB\text{-}RD}_{p,l}$) of the R pairs, and the second input of each of said NAND gates receives the test signal (Test),
- in the normal operating mode, the outputs of the remaining (R−1) read units (RDU2) are switched to high impedance, and
- in the test mode, a signal present on one data input line (MADB-RD$_{p,2...R}$) of a respective pair of data input lines (MADB-RD$_{p,2...R}$, $\overline{MADB\text{-}RD}_{p,2...R}$) is present at the output of each of said remaining (R−1) read units (RDU2) in amplified form.

68. The integrated semiconductor memory according to claim 67, wherein said output stages (OUTRD) of said remaining (R−1) read units (RDU2) are identical to said output stage (OUTRD) of said first read unit (RDUL) of a respective one of said memory array read units (MARD).

69. The integrated semiconductor memory according to claim 57, wherein:
- each of said P memory array write units (MAWR) has a first input being connected to one of the P I/O data lines of the first type (IO1) and a second input receiving the write control signal (WR), each of said P memory array write units (MAWR) has third inputs for the memory array address bus (MAAD) and outputs for the R pairs of data output lines (MADB-WR$_{p,r}$, $\overline{\text{MADB-WR}_{p,r}}$), in the normal operating mode, each of said P memory array write units (MAWR) forwards a data item to be written into the memory and being present on the respective I/O data line of the first type (IO1) and its complementary data item, as a function of the write control signal (WR) and of the memory array address bus (MAAD), to the pair of data output lines (MADB-WR$_{p,r}$, $\overline{\text{MADB-WR}_{p,r}}$) for activating a line of the memory array address bus (MAAD) and a line of the I/O address bus (IOAD), and in the test mode, each of said P memory array write units (MAWR) forwards the data item present on the I/O data line of the first type (IO1) and its complementary data item, to all of the R pairs of data output lines (MADB-WRP$_{p,r}$, $\overline{\text{MADB-WR}_{p,r}}$).

70. The integrated semiconductor memory according to claim 69, wherein:

each of said memory array write units (MAWR) includes two demultiplexers (DMUXWR) and one input stage (INWR), said input stage (INWR) has a first input being connected to the respective I/O data line of the first type (IO1), a second input receiving the write control signal (WR), and two outputs, said input stage (INWR) derives from the data item to be written in and being present on the I/O data line of the first type (IO1), the same data item and its complementary data item and applies the derived data items to the two outputs, each of said demultiplexers (DMUXWR) includes R AND gates (AND) each having first and second inputs and one output, all of the first inputs of said AND gates (AND) of one of said demultiplexers (DMUXWR) are connected to one of the outputs of said input stage (INWR), and all of the first inputs of said AND gates (AND) of the other of said demultiplexers (DMUXWR) are connected to the other of the outputs of said input stage (INWR), the second inputs of said AND gates (AND) of both of said demultiplexers (DMUXWR) are connected to the memory array address bus (MAAD), and said demultiplexers (DMUXWR) have outputs connected to the R pairs of data output lines (MADB-WR$_{p,r}$, $\overline{\text{MADB-WR}_{p,r}}$).

71. The integrated semiconductor memory according to claim 70, wherein said input stage (INWR) includes a buffer (BF) for a data item present on the I/O data line of the first type (IO1), and two AND gates (AND) each having first and second inputs and one output, said buffer (BF) having an output being connected to the first input of one of said AND gates (AND), an inverter being connected between the first input of the other of said AND gates (AND) and the output of said buffer (BF), and the second inputs of said AND gates (AND) receiving the write control signal (WR).

72. The integrated semiconductor memory according to claim 71, wherein at least one of said AND gates (AND) includes a NAND gate having two inputs and an inverter following said NAND gate.

73. The integrated semiconductor memory according to claim 57, wherein:

each of said P memory array write units (MAWR) has a first input connected to one of the P I/O data lines of the first type (IO1)

each of said P memory array write units (MAWR) has further (R−1) first inputs each being connected to one of the I/O data lines of the second type (IO2), each of said P memory array write units (MAWR) has a second input receiving the write control signal (WR), each of said P memory array write units (MAWR) has third inputs for the memory array address bus (MAAD) and outputs for the R pairs of data output lines (MADB-WR$_{p,r}$, $\overline{\text{MADB-WR}_{p,r}}$) of one of the memory array databuses (MADB), in the normal operating mode, each of said P memory array write units (MAWR) forwards a data item to be written into the memory and being present on a respective I/O data line of the first type (IO1) and its complementary data item, as a function of the write control signal (WR) and of the memory array address bus (MAAD), to the pair of data output lines (MADB-WR$_{p,r}$, $\overline{\text{MADB-WR}_{p,r}}$) for activating one line of the I/O address bus (IOAD) and one line of the memory array address bus (MAAD), in the test mode, each of said P memory array write units (MAWR) forwards the data item on the I/O data line of the first type (IO1) and its complementary data item to the first pair (MADB-WR$_{p,1}$, $\overline{\text{MADB-WR}_{p,1}}$) of the R pairs of data output lines (MADB-WR$_{p,r}$, $\overline{\text{MADB-WR}_{p,r}}$), and in the test mode, each of said P memory array write units (MAWR) forwards data items present at the further (R−1) first inputs and their respective complementary data items to a respective pair (MADB-WR$_{p,2,\ldots,R}$, $\overline{\text{MAWR}_{p,2,\ldots,R}}$, of remaining (R−1) pairs of data output lines (MADB-WR$_{p,2\ldots R}$, $\overline{\text{MADB-WR}_{p,2\ldots R}}$) of the R pairs of data output lines (MADB-WR$_{p,r}$, $\overline{\text{MADB-WR}_{p,r}}$).

74. The integrated semiconductor memory according to claim 73, wherein:

each of said memory array write units (MAWR) includes two demultiplexers (DMUXWR) and R input stages (INWR) including a first input stage (INWR) and remaining (R−1) input stages (INWR), said first input stage (INWR) has a first input being connected to the I/O data line of the first type (IO1) for receiving a data item to be written in during the writing-in, said remaining (R−1) input stages (INWR) each have a first input being connected to a respective I/O data line of the second type (IO2) f or receiving a respective data item to be written in during the writing-in, each of said input stages (INWR) has a second input for receiving the write control signal (WR), each of said input stages (INWR) has two outputs, a data item present at the first input is present at one of the outputs when the write control signal (WR) is activated, and a data item complementary to this data item is present at the other of the outputs when the write control signal (WR) is activated, logic circuits (LOGWR) each having two inputs and one output (MAD$_{2,\ldots,R}$; $\overline{\text{MAD}_{2,\ldots,R}}$), one of the inputs of each of said logic circuits (LOGWR) being connected to a respective one of the outputs of a respective one of said (R−1) remaining input stages (INWR), and the other of the inputs of said logic circuits (LOGWR) receiving the test signal (Test), in the normal operating mode, a signal at a mutually identical logic level is present at the outputs (MAD$_2, \ldots, _R$, $\overline{\text{MAD}_2, \ldots, _R}$) of all of said logic circuits (LOGWR) following said (R−1) remaining input stages (INWR), in the test mode, each of the complementary data items is present at the output (MAD$_2, \ldots, _R$; $\overline{\text{MAD}_2, \ldots, _R}$) of one of said logic circuits (LOGWR) connected to a respective one of said (R−1) remaining input stages (INWR), and the respective data item to be written in is present at the output (MAD$_2, \ldots, _R$; $\overline{\text{MAD}_2, \ldots, _R}$) of the other of said logic circuits (LOGWR) connected to said respective one of said (R−1) remaining input stages (INWR), each of said demultiplexers (DMUXWR) includes an AND gate (AND) having first and second inputs, and (R−1) logic units (LU) having first, second and third inputs and R outputs, in one of said demultiplexers (DMUXWR), the first input of said AND gate (AND) and the first inputs of said logic units (LU) are connected to the one output of said first input stage (INWR), in the other of said demultiplexers (DMUXWR), the first input of said AND gate (AND) and the first inputs of said logic units (LU) are connected to the other output of said first input stage (INWR), in both of said demultiplexers (DMUXWR), the second inputs of said AND gates (AND) and the second inputs of said logic units (LU) are each connected to a respective line (MAAD$_1, \ldots, _R$) of the memory array address bus (MAAD), in one of said demultiplexers (DMUXWR), the third inputs of said logic units (LU) are each connected to the output (MAD$_2, \ldots, _R$) of one of said logic circuits (LOGWR) following a respective one of said remaining (R−1) input stages (INWR), in the other of said demultiplexers (DMUXWR), the third inputs of said logic units (LU) are each connected to the output (MAD$_2, \ldots, _R$) of the other of said logic circuits (LOGWR) following a respective one of said remaining (R−1) input stages (INWR), and each of said demultiplexers (DMUXWR) has R outputs being outputs of said memory array write unit (MAWR).

75. The integrated semiconductor memory according to claim 74, wherein each of said input stages (INWR) includes a buffer (BF) for a data item being present on the I/O data line of a respective one of the first and second types (IO1; IO2), and two AND gates (AND) each having first and second inputs and one output, said buffer (BF) having an output connected to the first input of one of said AND gates (AND), an inverter connected between the first input of the other of said AND gates (AND) and the output of said buffer (BF), and the second inputs of said AND gates (AND) receiving the write control signal (WR).

76. The integrated semiconductor memory according to claim 75, wherein at least one of said AND gates (AND) includes a NAND gate having two inputs, and an inverter following said NAND gate.

77. The integrated semiconductor memory according to claim 2, wherein said control unit (CONTROL) generates the test signal (Test) from the externally supplied address signals (ADR) and the control signals ($\overline{\text{RAS}}$, $\overline{\text{CAS}}$, R/$\overline{\text{W}}$), in accordance with JEDEC Standard 21-B of the JEDEC Committee.

78. The integrated semiconductor memory according to claim 2, including at least one redundant word line (WLred) having redundant memory cells (MCred), a redundant word line decoder (WLDECred) for selecting the at least one redundant word line (WLred) in the case of redundancy, and read amplifiers (SA) and bit switches (BSW) of replaced memory cells (MC) for connecting said redundant memory cells (MCred) to corresponding lines of the block databus (BKDB) in the case of redundancy.

79. The integrated semiconductor memory according to claim 2, including at least one group of M pairs of redundant bit lines (BLred) with redundant memory cells (MCred), M redundant read amplifiers (SAred), a redundant bit switch block (BKBSWred), a redundancy bit group decoder (BITDECred) with an associated redundant bit group selection signal (BITSIGred) for selecting the at least one group in the case of redundancy, and the at least one group being connectible to corresponding lines of the block databus (BKDB).

80. A method for replacing memory cells (MC) with redundant memory cells (MCred) in a semiconductor memory including U block groups (GP$_{u=1\ldots U}$) each having groups of M memory cells (MC) and word lines (WL), means for simultaneously testing several of the groups of M memory cells (MC) for operation in a test mode, each of the groups of memory cells being disposed along a respective word line (WL) within a respective one of the U block groups (GP$_u$); the testing means being in the form of a parallel test device (PT) associated with the U block groups (GP$_{u=1\ldots U}$) for writing in and evaluating data to be written into and read out of the semiconductor memory; the parallel test device including means for evaluating data read out in the test mode separately for each of the block groups; and I/O data lines (IO1, IO2, IO3) of the semiconductor memory separately carrying a result of the evaluation for each of the groups of M memory cells (MC), the semiconductor memory further including at least one redundant word line (WLred) having redundant memory cells (MCred), a redundant word line decoder (WLDECred) for selecting the at least one redundant word line (WLred) in the case of redundancy, and read amplifiers (SA) and bit switches (BSW) of replaced memory cells (MC) for connecting the redundant memory cells (MCred) to corresponding lines of the block databus (BKDB) in the case of redundancy, and a computer-controlled automatic testing and repair device having algorithms and means for replacing the memory cells (MC), which comprises testing all of the memory cells (MC) of the semiconductor memory in a test mode, identifying each defective memory cell group (MC) with each detected fault within the semiconductor memory through its address (ADR) applied from the outside and a respective I/O data line (IO1, IO2, IO3) on which the fault is detected, by means of the parallel test device (PT) and the automatic testing device, and supplying identification data being obtained for all defective memory cell groups to the automatic repair device which thereupon replaces the memory cell groups having defective memory cells (MC) by using the identification data.

81. A method for replacing memory cells (MC) with redundant memory cells (MCred) in a semiconductor memory including U block groups ($GP_{u=1} \ldots v$) each having groups of M memory cells (MC) and word lines (WL), means for simultaneously testing several of the groups of M memory cells (MC) for operation in a test mode, each of the groups of memory cells being disposed along a respective word line (WL) within a respective one of the U block groups ($GP_u$); the testing means being in the form of a parallel test device (PT) associated with the U block groups ($GP_{u=1} \ldots v$) for writing in and evaluating data to be written into and read out of the semiconductor memory; the parallel test device including means for evaluating data read out in the test mode separately for each of the block groups; and I/O data lines (IO1, IO2, IO3) of the semiconductor memory separately carrying a result of the evaluation for each of the groups of M memory cells (MC), the semiconductor memory further including at least one group of M pairs of redundant bit lines (BLred) with redundant memory cells (MCred), M redundant read amplifiers (SAred), a redundant bit switch block (BKBSWred), a redundancy bit group decider (BITDECred) with an associated redundant bit group selection signal (BITSIGred) for selecting the at least one group in the case of redundancy, and the at least one group being connectible to corresponding lines of the block databus (BKDB), and a computer-controlled automatic testing and repair device having algorithms and means for replacing the memory cells (MC), which comprises testing all of the memory cells (MC) of the semiconductor memory in a test mode, identifying each defective memory cell group (MC) with each detected fault within the semiconductor memory through its address (ADR) applied from the outside and a respective I/O data line (IO1, IO2, IO3) on which the fault is detected, by means of a parallel test device (PT) and the automatic testing device, and supplying identification data being obtained for all defective memory cell groups to the automatic repair device which thereupon replaces the memory cell groups having defective memory cells (MC) by using the identification data.

82. A method for replacing memory cells (MC) with redundant memory cells (MCred) in a semiconductor memory including U block groups ($GP_{u=1} \ldots v$) each having groups of M memory cells (MC) and word lines (WL), means for simultaneously testing several of the groups of M memory cells (MC) for operation in a test mode, each of the groups of memory cells being disposed along a respective word line (WL) within a respective one of the U block groups ($GP_u$); the testing means being in the form of a parallel test device (PT) associated with the U block groups ($GP_{u=1} \ldots v$) for writing in and evaluating data to be written into and read out of the semiconductor memory; the parallel test device including means for evaluating data read out in the test mode separately for each of the block groups; and I/O data lines (IO1, IO2, IO3) of the semiconductor memory separately carrying a result of the evaluation for each of the groups of M memory cells (MC), the semiconductor memory further including at least one redundant word line (WLred) having redundant memory cells (MCred), a redundant word line decoder (WLDECred) for selecting the at least one redundant word line (WLred) in the case of redundancy, and read amplifiers (SA) and bit switches (BSW) of replaced memory cells (MC) for connecting the redundant memory cells (MCred) to corresponding lines of the block databus (BKDB) in the case of redundancy, and a computer-controlled automatic testing and repair device having algorithms and means for replacing the memory cells (MC), which comprises testing all of the memory cells (MC) of the semiconductor memory in a test mode, identifying each defective memory cell (MC) with each detected fault within the semiconductor memory through its address (ADR) applied from the outside and a respective I/O data line (IO1, IO2, IO3) on which the fault is detected, by means of a parallel testing device (PT) and the automatic testing device, and supplying identification data being obtained for all defective memory cells (MC) to the automatic repair device which thereupon replaces the defective memory cells (MC) by using the identification data.

83. A method for replacing memory cells (MC) with redundant memory cells (MCred) in a semiconductor memory including U block groups ($GP_{u=1} \ldots v$) each having groups of M memory cells (MC) and word lines (WL), means for simultaneously testing several of the groups of M memory cells (MC) for operation in a test mode, each of the groups of memory cells having disposed along a respective word line (WL) within a respective one of the U block groups ($GP_u$); the testing means being in the form of a parallel test device (PT) associated with the U block groups ($GP_{u=1} \ldots v$) for writing in and evaluating data to be written into and read out of the semiconductor memory; the parallel test device including means for evaluating data read out in the test mode separately for each of the block groups; and I/O data lines (IO1, IO2, IO3) of the semiconductor memory separately carrying a result of the evaluation for each of the groups of M memory cells (MC), the semiconductor memory further including at least one group of M pairs of redundant bit lines (BLred) with redundant memory cells (MCred), M redundant read amplifiers (SAred), a redundant bit switch block (BKBSWred), a redundancy bit group decoder (BITDECred) with an associated redundant bit group selection signal (BITSIGred) for selecting the at least one group in the case of redundancy, and the at least one group being connectible to corresponding lines of the block databus (BKDB), and a computer-controlled automatic testing and repair device having algorithms and means for replacing the memory cells (MC), which comprises testing all of the memory cells (MC) of the semiconductor memory in a test mode, identifying each defective memory cell (MC) with each detected fault within the semiconductor memory through its address (ADR) applied from the outside and a respective I/O data line (IO1, IO2, IO3) on which the fault is detected, by means of a parallel testing device (PT) and the automatic testing device, and supplying identification data being obtained for all defective memory cells (MC) to the automatic repair device which thereupon replaces the defective memory cells (MC) by using the identification data.

* * * * *